(12) United States Patent
Yamazaki et al.

(10) Patent No.: US 9,825,057 B2
(45) Date of Patent: Nov. 21, 2017

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Kenichi Okazaki, Tochigi (JP); Masahiro Katayama, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/553,269

(22) Filed: Nov. 25, 2014

(65) Prior Publication Data
US 2015/0153599 A1    Jun. 4, 2015

(30) Foreign Application Priority Data

Dec. 2, 2013 (JP) .................................. 2013-249692
Dec. 3, 2013 (JP) .................................. 2013-249693
Dec. 3, 2013 (JP) .................................. 2013-249694

(51) Int. Cl.
*H01L 29/786* (2006.01)
*H01L 27/12* (2006.01)
*H01L 27/32* (2006.01)

(52) U.S. Cl.
CPC ...... *H01L 27/1225* (2013.01); *H01L 27/1251* (2013.01); *H01L 27/3262* (2013.01);
(Continued)

(58) Field of Classification Search
None
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

CN    101997005 A    3/2011
CN    102473734 A    5/2012
(Continued)

OTHER PUBLICATIONS

International Search Report (Application No. PCT/IB2014/066282) dated Mar. 10, 2015.
(Continued)

*Primary Examiner* — Victoria K Hall
(74) *Attorney, Agent, or Firm* — Robinson Intellectual Property Law Office; Eric J. Robinson

(57) ABSTRACT

To provide a display device in which plural kinds of circuits are formed over one substrate and plural kinds of transistors corresponding to characteristics of the plural kinds of circuits are provided. The display device includes a pixel portion and a driver circuit that drives the pixel portion over one substrate. The pixel portion includes a first transistor including a first oxide semiconductor film. The driver circuit includes a second transistor including a second oxide semiconductor film. The first oxide semiconductor film and the second oxide semiconductor film are formed over one insulating surface. A channel length of the first transistor is longer than a channel length of the second transistor. The channel length of the first transistor is greater than or equal to 2.5 micrometer.

30 Claims, 47 Drawing Sheets

(52) U.S. Cl.
CPC .... *H01L 29/7869* (2013.01); *H01L 29/78696* (2013.01); *H01L 29/78648* (2013.01); *H01L 2227/323* (2013.01)

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,851,279 B2 | 12/2010 | Takano et al. | |
| 8,067,775 B2 | 11/2011 | Miyairi et al. | |
| 8,222,092 B2 | 7/2012 | Yamazaki et al. | |
| 8,421,068 B2 * | 4/2013 | Yamazaki | H01L 27/1225 257/43 |
| 8,421,069 B2 * | 4/2013 | Yamazaki | H01L 21/84 257/43 |
| 8,421,083 B2 | 4/2013 | Yamazaki et al. | |
| 8,442,183 B2 | 5/2013 | Amano et al. | |
| 8,890,152 B2 * | 11/2014 | Yamazaki | H01L 29/7782 257/59 |
| 8,937,306 B2 | 1/2015 | Yamazaki et al. | |
| 8,941,114 B2 * | 1/2015 | Yamazaki | G02F 1/1368 257/347 |
| 8,952,377 B2 * | 2/2015 | Yamazaki | H01L 29/7869 257/43 |
| 8,952,381 B2 * | 2/2015 | Yamazaki | H01L 29/66969 257/43 |
| 9,076,874 B2 * | 7/2015 | Yamazaki | H01L 29/7869 |
| 9,153,699 B2 * | 10/2015 | Yamazaki | H01L 29/7869 |
| 9,184,245 B2 * | 11/2015 | Yamazaki | H01L 29/267 |
| 9,190,525 B2 * | 11/2015 | Yamazaki | H01L 29/7869 |
| 9,196,745 B2 * | 11/2015 | Yamazaki | H01L 29/7869 |
| 9,209,256 B2 * | 12/2015 | Tokunaga | H01L 29/24 257/59 |
| 9,214,474 B2 * | 12/2015 | Yamazaki | H01L 27/1225 |
| 9,240,492 B2 * | 1/2016 | Yamazaki | H01L 29/7869 |
| 9,281,408 B2 * | 3/2016 | Yamazaki | H01L 29/7869 |
| 9,293,602 B2 * | 3/2016 | Yamazaki | H01L 29/7869 |
| 9,349,751 B2 * | 5/2016 | Yamazaki | H01L 27/1225 |
| 9,368,607 B2 * | 6/2016 | Yamazaki | H01L 29/78696 |
| 9,373,711 B2 * | 6/2016 | Yamazaki | H01L 29/7869 257/43 |
| 9,385,238 B2 * | 7/2016 | Yamazaki | H01L 29/78606 |
| 9,412,876 B2 * | 8/2016 | Koezuka | H01L 29/7869 |
| 9,437,747 B2 * | 9/2016 | Yamazaki | H01L 29/7869 |
| 9,437,749 B2 * | 9/2016 | Yamazaki | H01L 29/7869 |
| 9,437,831 B2 * | 9/2016 | Yamazaki | H01L 27/1225 |
| 9,496,408 B2 * | 11/2016 | Yamazaki | H01L 29/7869 |
| 9,553,201 B2 * | 1/2017 | Ahn | H01L 29/78696 |
| 9,627,418 B2 * | 4/2017 | Yamazaki | H01L 27/1251 |
| 9,673,234 B2 * | 6/2017 | Yamazaki | H01L 27/1225 |
| 9,698,275 B2 * | 7/2017 | Yamazaki | H01L 27/1225 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0255995 A1 | 10/2009 | Shionoiri et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0219410 A1 * | 9/2010 | Godo | H01L 29/78693 257/43 |
| 2011/0024751 A1 * | 2/2011 | Yamazaki | H01L 27/1225 257/57 |
| 2011/0031497 A1 | 2/2011 | Yamazaki et al. | |
| 2011/0037068 A1 | 2/2011 | Yamazaki et al. | |
| 2011/0109351 A1 | 5/2011 | Yamazaki et al. | |
| 2011/0127523 A1 * | 6/2011 | Yamazaki | H01L 21/02554 257/43 |

(56) References Cited

U.S. PATENT DOCUMENTS

| | | | |
|---|---|---|---|
| 2011/0140100 A1* | 6/2011 | Takata | H01L 29/7869 257/43 |
| 2012/0058598 A1 | 3/2012 | Yamazaki | |
| 2013/0009209 A1 | 1/2013 | Yamazaki | |
| 2013/0009219 A1 | 1/2013 | Yamazaki et al. | |
| 2013/0009220 A1 | 1/2013 | Yamazaki et al. | |
| 2013/0193432 A1 | 8/2013 | Yamazaki | |
| 2013/0228777 A1 | 9/2013 | Yamazaki et al. | |
| 2013/0334523 A1 | 12/2013 | Yamazaki | |
| 2013/0334533 A1 | 12/2013 | Yamazaki | |
| 2014/0001465 A1 | 1/2014 | Yamazaki | |
| 2014/0042433 A1 | 2/2014 | Yamazaki | |
| 2014/0110708 A1* | 4/2014 | Koezuka | H01L 29/78696 257/43 |
| 2014/0239293 A1* | 8/2014 | Yamazaki | H01L 29/78 257/43 |
| 2015/0107988 A1 | 4/2015 | Yamazaki | |
| 2015/0108472 A1* | 4/2015 | Suzawa | H01L 29/78648 257/43 |
| 2015/0171115 A1* | 6/2015 | Yamazaki | H01L 27/1251 257/43 |
| 2015/0187824 A1* | 7/2015 | Yamazaki | H01L 27/1251 257/43 |
| 2015/0187878 A1* | 7/2015 | Yamazaki | H01L 27/1225 257/43 |
| 2015/0228799 A1* | 8/2015 | Koezuka | H01L 27/124 257/43 |
| 2015/0228803 A1* | 8/2015 | Koezuka | H01L 29/78693 257/43 |
| 2015/0287835 A1* | 10/2015 | Yamazaki | H01L 29/78693 257/43 |
| 2015/0287837 A1* | 10/2015 | Yamazaki | H01L 29/7869 257/43 |
| 2015/0349133 A1* | 12/2015 | Yamazaki | H01L 29/247 257/43 |
| 2016/0027923 A1* | 1/2016 | Yamazaki | H01L 29/7869 257/43 |
| 2016/0190333 A1* | 6/2016 | Yamazaki | H01L 29/7782 257/43 |
| 2016/0233340 A1* | 8/2016 | Shimomura | H01L 29/7869 |
| 2016/0254291 A1* | 9/2016 | Yamazaki | H01L 27/1225 257/43 |
| 2017/0025548 A1* | 1/2017 | Yamazaki | H01L 29/78696 |
| 2017/0033238 A1* | 2/2017 | Koezuka | H01L 29/78693 |
| 2017/0110590 A1* | 4/2017 | Yamazaki | H01L 29/78609 |

FOREIGN PATENT DOCUMENTS

| | | |
|---|---|---|
| CN | 102598282 A | 7/2012 |
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123681 A | 5/2007 |
| JP | 2007-123861 A | 5/2007 |
| JP | 2011-049539 A | 3/2011 |
| JP | 2011-054946 A | 3/2011 |
| JP | 2011-119714 A | 6/2011 |
| JP | 2013-008990 A | 1/2013 |
| JP | 2013-175715 A | 9/2013 |
| JP | 2013-239521 A | 11/2013 |
| KR | 2011-0015374 A | 2/2011 |
| KR | 2012-0051720 A | 5/2012 |
| KR | 2012-0091293 A | 8/2012 |
| KR | 2013-0086979 A | 8/2013 |
| TW | 201117356 | 5/2011 |
| TW | 201133858 | 10/2011 |
| TW | 201140844 | 11/2011 |
| TW | 201338169 | 9/2013 |
| TW | 201401516 | 1/2014 |
| WO | WO-2004/114391 | 12/2004 |
| WO | WO-2011/013596 | 2/2011 |
| WO | WO-2011/055631 | 5/2011 |
| WO | WO-2013/172236 | 11/2013 |

OTHER PUBLICATIONS

Written Opinion (Application No. PCT/IB2014/066282) dated Mar. 10, 2015.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transacations on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A) May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

(56) References Cited

OTHER PUBLICATIONS

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68,3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW'06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

(56) References Cited

OTHER PUBLICATIONS

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor Bottom Emission AM-OLED Display", SID Digest '08 : SID International Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

CAAC-OS nc-OS

□ proportion of non-CAAC   ☰ proportion of CAAC as-sputtered after heat treatment at 450 °C FIG. 30A
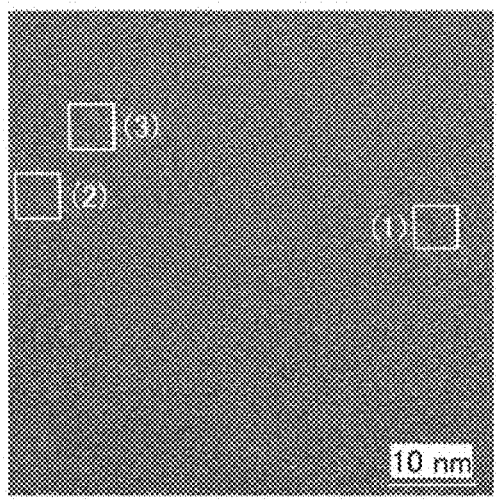
FIG. 30B          FIG. 30C          FIG. 30D
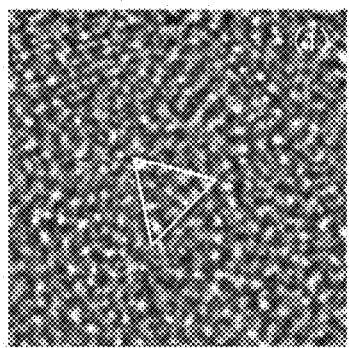   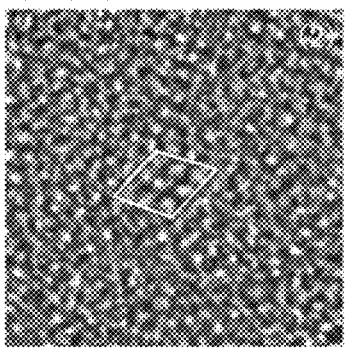   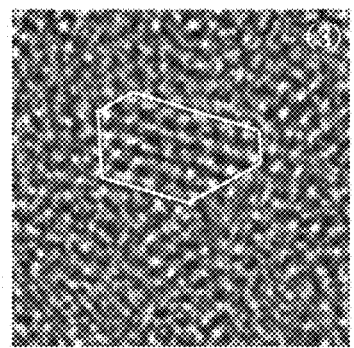

FIG. 32A
FIG. 32B
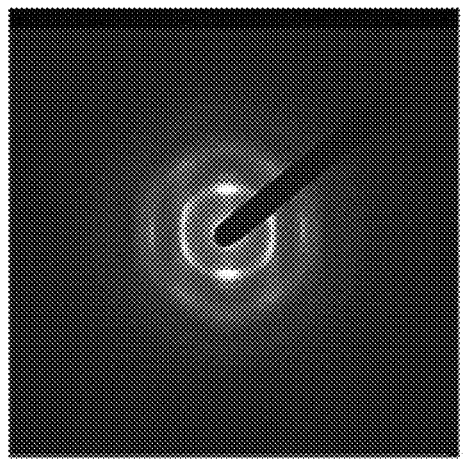
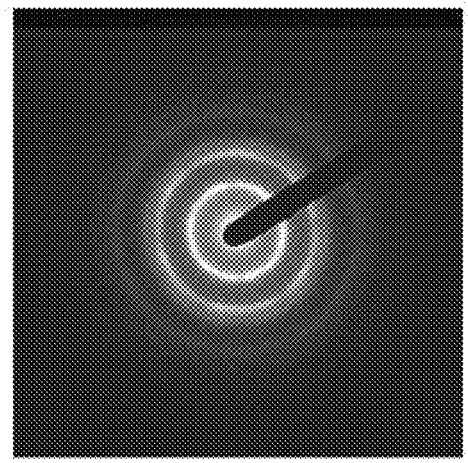

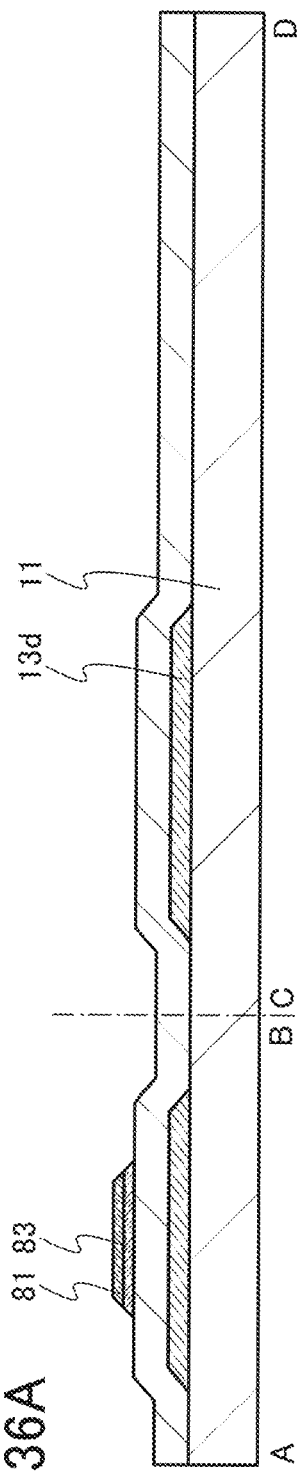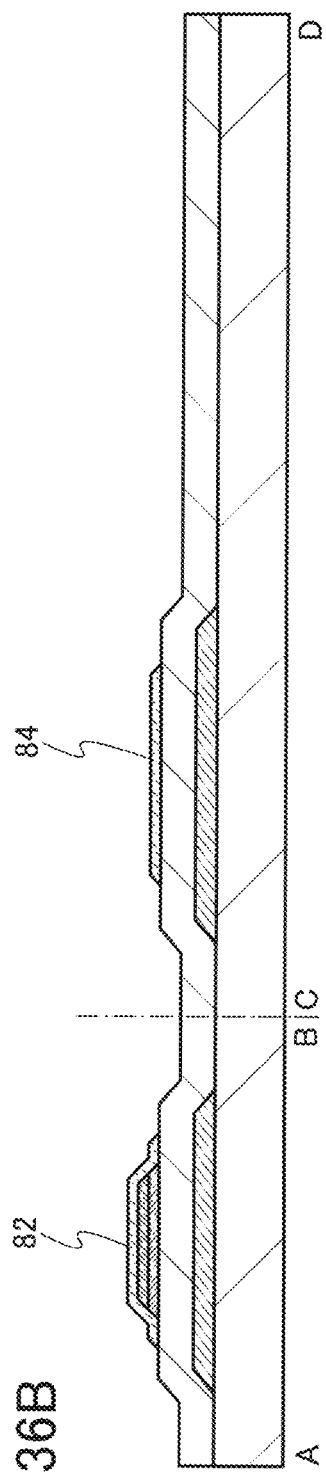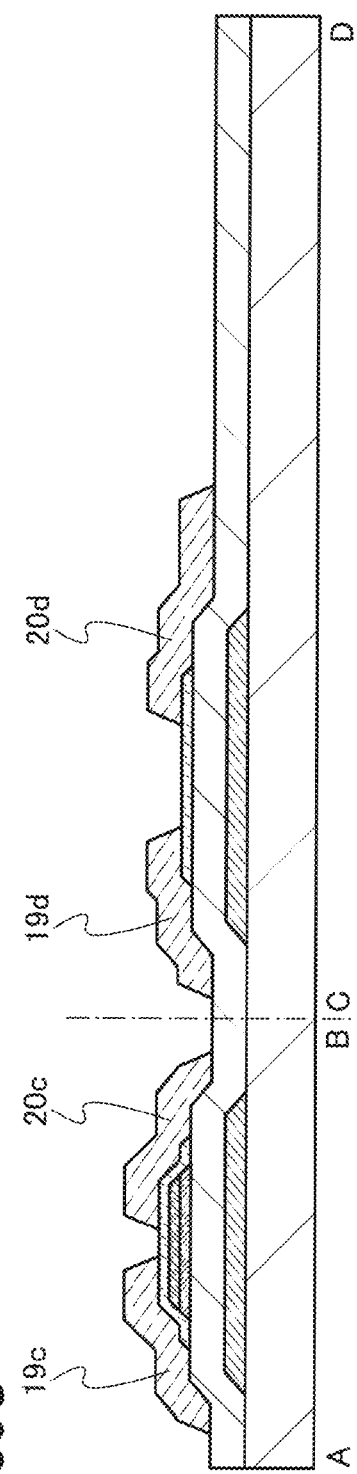
FIG. 36A
FIG. 36B
FIG. 36C

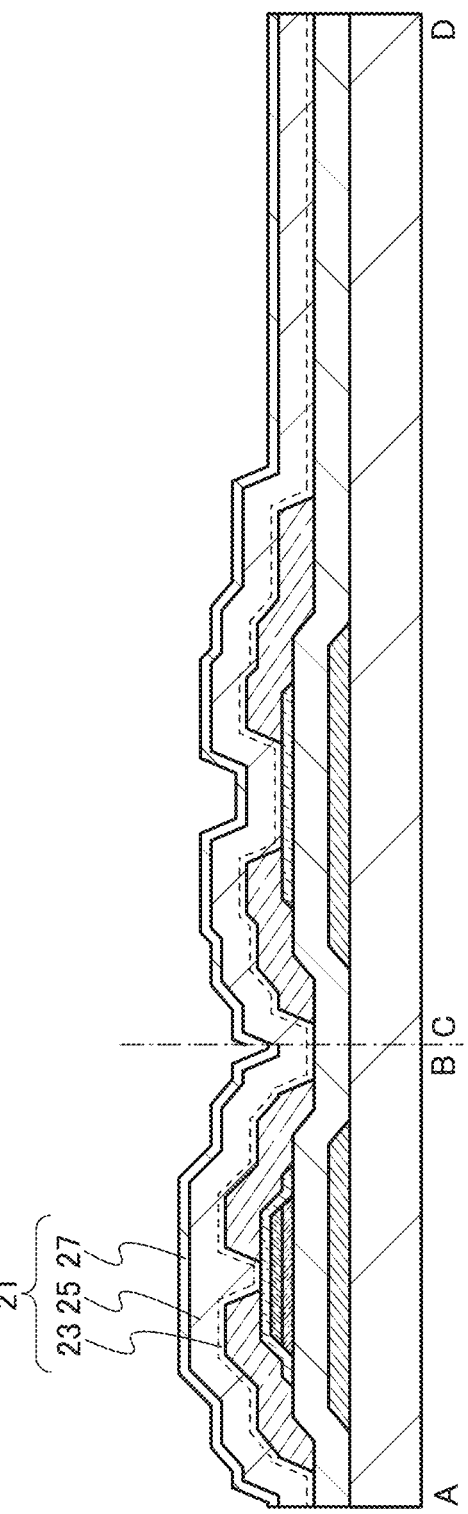
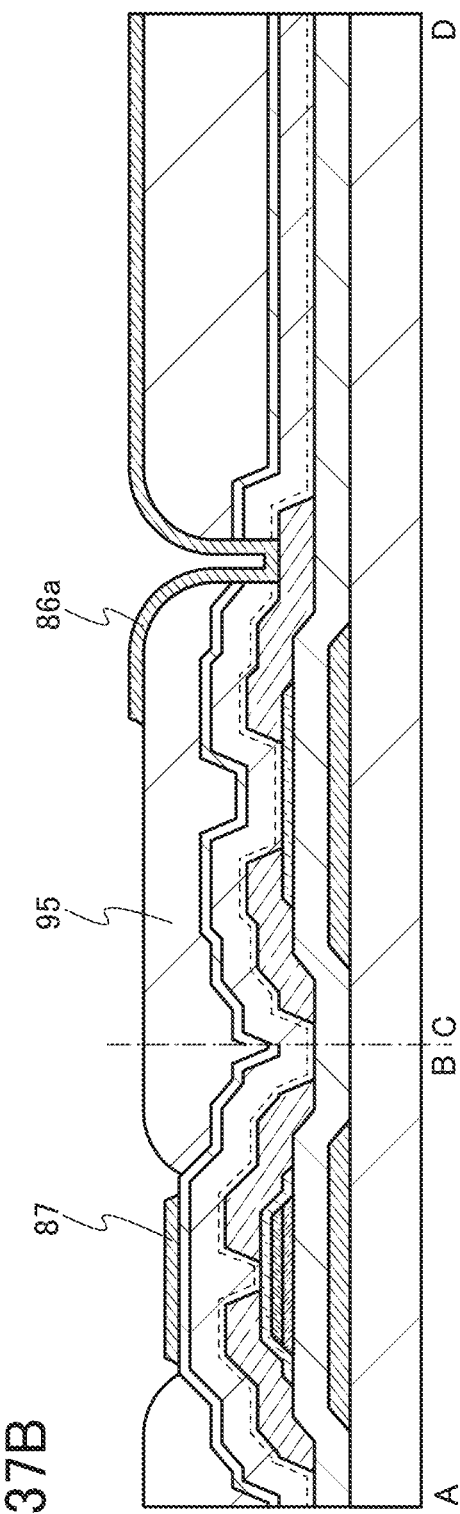

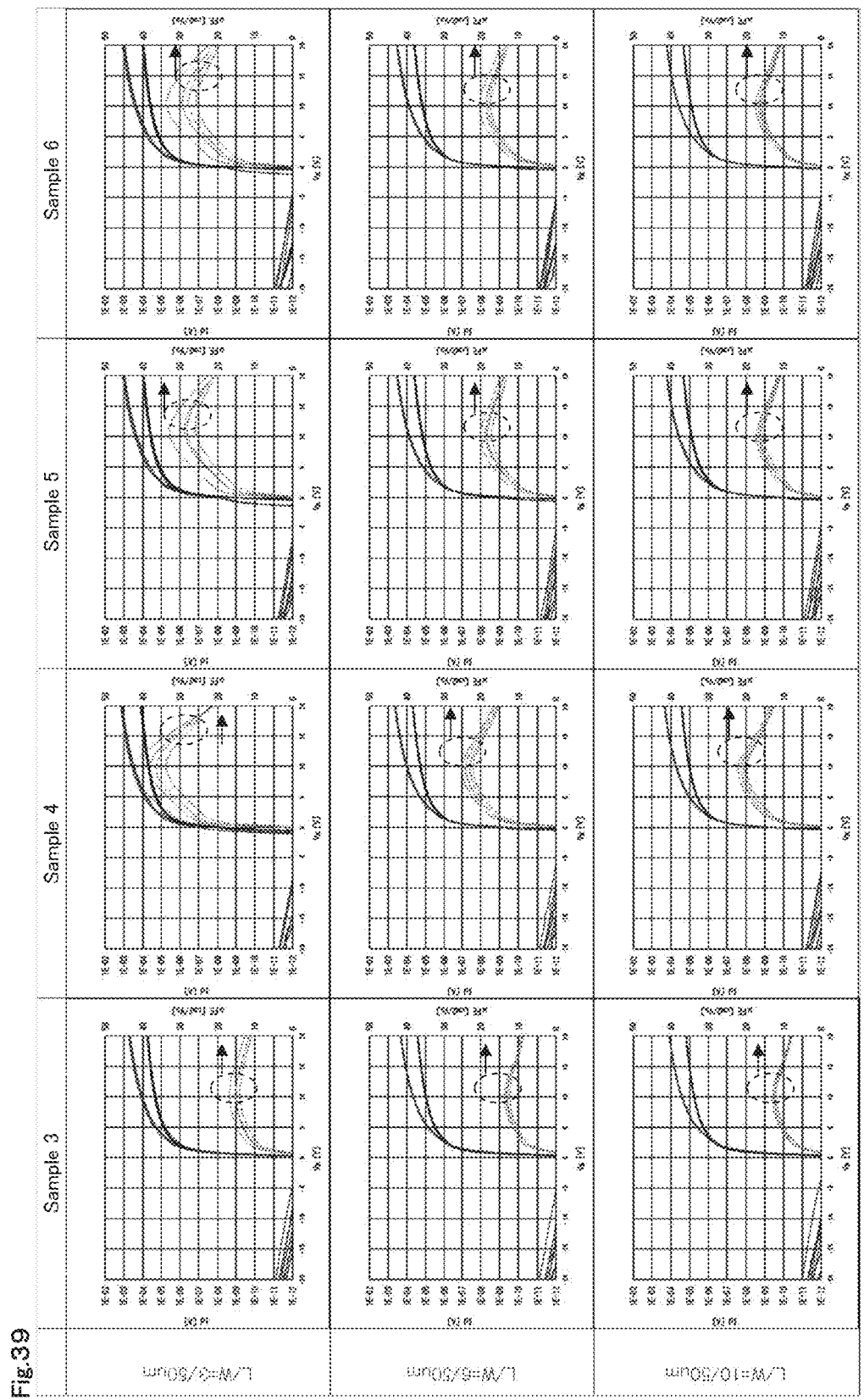

DISPLAY DEVICE

TECHNICAL FIELD

The present invention relates to an object, a method, or a manufacturing method. In addition, the present invention relates to a process, a machine, manufacture, or a composition of matter. In particular, the present invention relates to a semiconductor device, a display device, a light-emitting device, a power storage device, a memory device, a driving method thereof, or a manufacturing method thereof. Furthermore, in particular, the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

Various metal oxides are used for a variety of applications. Indium oxide is a well-known material and is used as a transparent electrode material needed for liquid crystal displays and the like.

Some metal oxides have semiconductor characteristics. Metal oxides having semiconductor characteristics are a kind of compound semiconductor. The compound semiconductor is a semiconductor formed by two or more kinds of atoms bonded together. In general, metal oxides serve as insulators; however, it is known that metal oxides serve as semiconductors depending on the combination of elements included in the metal oxides.

For example, it is known that some metal oxides such as tungsten oxide, tin oxide, indium oxide, and zinc oxide have semiconductor properties.

A technique is disclosed in which a transistor is manufactured using zinc oxide or an In—Ga—Zn-based oxide and the transistor is used as a switching element or the like of a pixel of a display device (see Patent Documents 1 and 2).

Transistors including oxide semiconductors have higher field-effect mobility than transistors including amorphous silicon. Therefore, driver circuits of display devices and the like can be formed using the transistors including oxide semiconductors.

Display devices include EL display devices, electronic paper, and liquid crystal display devices. Among these, active matrix EL display devices capable of displaying high-resolution images are particularly attracting attention. In an active matrix EL display device, where a plurality of switching elements (also referred to as pixel transistors) are arranged in pixels, voltage is applied to a light-emitting element electrically connected to at least one of the switching elements, whereby electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The range of uses of such an active matrix display device is expanding, and demands for larger screen size, higher definition, and higher aperture ratio are increasing. In addition, it is demanded that a production method of the active matrix display device offer high productivity and reduced production cost.

It is important for a pixel transistor, which is a switching element, to have a sufficiently low off-state current (drain current which flows when the transistor is off). Furthermore, a sufficiently low off-state current contributes to lower power consumption.

As a material for a semiconductor layer of a pixel transistor, a silicon material such as polysilicon or amorphous silicon, an oxide semiconductor, or the like is used.

To reduce manufacturing cost of display modules, it is preferable to manufacture the display modules using a large-sized substrate with an insulating surface (e.g., glass substrate or plastic substrate).

A laser irradiation apparatus, which is used for a crystallization process or the like of polysilicon, has limitations on irradiation area per laser light source and irradiation area per unit time. Such limitations make it difficult to process a large-sized substrate with an insulating surface in a short time.

A manufacturing process of a transistor including an oxide semiconductor does not use a laser irradiation apparatus. Furthermore, a transistor including an oxide semiconductor has higher field-effect mobility than a transistor including amorphous silicon, whose manufacturing process also does not use a laser irradiation apparatus. Therefore, driver circuits of display devices and the like can be formed using a transistor including an oxide semiconductor.

REFERENCE

Patent Document

[Patent Document 1] Japanese Published Patent Application No. 2007-123861
[Patent Document 2] Japanese Published Patent Application No. 2007-096055

DISCLOSURE OF INVENTION

In the manufacture of a display device, in the case where a plurality of different circuits are formed over an insulating surface, for example, where a pixel portion and a driver circuit are formed over one substrate, excellent switching characteristics such as a high on-off ratio are needed for a transistor used for the pixel portion, and high operation speed is needed for a transistor used for the driver circuit. In particular, as the definition of the display device is increased, writing time of a display image is reduced; therefore, it is preferable that the transistor used for the driver circuit operate at high speed.

An object of one embodiment of the present invention is to provide a display device in which plural kinds of circuits are formed over one substrate and plural kinds of transistors corresponding to characteristics of the plural kinds of circuits are provided.

Another object is to provide a semiconductor device in which plural kinds of circuits are formed over one substrate and plural kinds of transistors corresponding to characteristics of the plural kinds of circuits are provided while complication of a process and an increase in manufacturing costs are prevented.

Another object is to manufacture a highly reliable display device in which a highly reliable transistor with favorable electrical characteristics is used as a switching element.

In order to display an image on a display device, a large number of image signals need to be supplied to the display device. Further, a large number of wirings are needed to connect a device for supplying image signals (e.g., a main body of an electronic device) to the display device. For example, about 640 wirings are needed for VGA. Accordingly, the wirings occupy volume in part of the display device, which might limit the flexibility in design such as the size of the electronic device and the position of the display device.

In view of such a background, it is preferable that the number of external connection terminals in a display device be reduced.

It is preferable to reduce the number of external connection terminals also in the case of pursuing a reduction in the power consumption of the display device.

In addition, as the definition of a display module is increased, the number of external connection terminals (also referred to as the number of pins) and the number of signal wirings are increased. A display module in which a pixel portion and a driver circuit are formed over one substrate can have fewer external connection terminals and fewer signal wirings than a display module not having a structure in which a pixel portion and a driver circuit are formed over one substrate.

One embodiment of the present invention is a display device including a pixel portion and a driver circuit that drives the pixel portion over one substrate. The pixel portion includes a first transistor including a first oxide semiconductor film. The driver circuit includes a second transistor including a second oxide semiconductor film. The first oxide semiconductor film and the second oxide semiconductor film are formed over one insulating surface. A channel length of the first transistor is longer than a channel length of the second transistor. The channel length of the first transistor is greater than or equal to 2.5 µm.

Another embodiment of the present invention is a display device including a pixel portion and a driver circuit that drives the pixel portion over one substrate. The pixel portion includes a first transistor including a first oxide semiconductor film. The driver circuit includes a second transistor including a second oxide semiconductor film and a third oxide semiconductor film. The first oxide semiconductor film and the second oxide semiconductor film having different compositions are formed over one insulating surface. A channel length of the first transistor is longer than a channel length of the second transistor. The third oxide semiconductor film is in contact with a side surface of the second oxide semiconductor film.

In the above structure, the first oxide semiconductor film and the third oxide semiconductor film are formed in the same step. Furthermore, in the above structure, the channel length of the first transistor is greater than or equal to 2.5 µm.

In the above structure, the channel length of the second transistor is less than 2.5 µm. Furthermore, the channel length of the first transistor is greater than or equal to 1 µm and less than or equal to 2.1 µm.

Furthermore, in the above structure, the second transistor includes a gate electrode layer, the second oxide semiconductor film over the gate electrode layer, an insulating layer over the second oxide semiconductor film, and a conductive layer over the insulating layer. The insulating layer covers the second oxide semiconductor film and is in contact with a gate insulating layer. In a channel width direction of the second oxide semiconductor film of the second transistor, the conductive layer overlaps with a channel formation region of the second oxide semiconductor film and is electrically connected to the gate electrode layer.

Note that the second transistor has higher field-effect mobility than the first transistor.

Another embodiment of the present invention is a display device including a pixel portion and a driver circuit that drives the pixel portion over one substrate. The pixel portion includes a first transistor including a first oxide semiconductor film. The driver circuit includes a second transistor including a second oxide semiconductor film, a third oxide semiconductor film over the second oxide semiconductor film, and a fourth oxide semiconductor film over the third oxide semiconductor film. The first oxide semiconductor film and the second oxide semiconductor film are formed over one insulating surface. A channel length of the first transistor is longer than a channel length of the second transistor. A top surface and a side surface of the third oxide semiconductor film are covered with the fourth oxide semiconductor film. A bottom surface of the third oxide semiconductor film is in contact with a top surface of the second oxide semiconductor film.

In the above structure, the first oxide semiconductor film and the fourth oxide semiconductor film are formed in the same step using the same target.

According to one embodiment of the present invention, a display device with high image quality and fewer external connection terminals can be provided.

An electronic device of one embodiment of the present invention includes a display device with high image quality and fewer external connection terminals. Accordingly, the flexibility in design such as the size of an electronic device and the position of the display device provided in the electronic device can be increased. Thus, an electronic device which is reduced in size and weight and has excellent portability can be provided.

A reduction in the number of external connection terminals contributes to a reduction in cost. A product in which any one of the external connection terminals has contact failure is a defective product. For this reason, reducing the number of external connection terminals can increase manufacturing yield According to one embodiment of the present invention, a semiconductor device with low power consumption can be provided. According to one embodiment of the present invention, a novel semiconductor device can be provided.

BRIEF DESCRIPTION OF DRAWINGS

FIGS. 30A to 30D are Cs-corrected high-resolution TEM images of a plane of a CAAC-OS.

FIGS. 32A and 32B show electron diffraction patterns of a CAAC-OS.

FIGS. 36A to 36C are cross-sectional views illustrating one embodiment of a method for manufacturing a transistor.

FIGS. 37A and 37B are cross-sectional views illustrating one embodiment of a method for manufacturing a transistor.

FIG. 39 shows electrical characteristics of transistors.

BEST MODE FOR CARRYING OUT THE INVENTION

Figure 1:
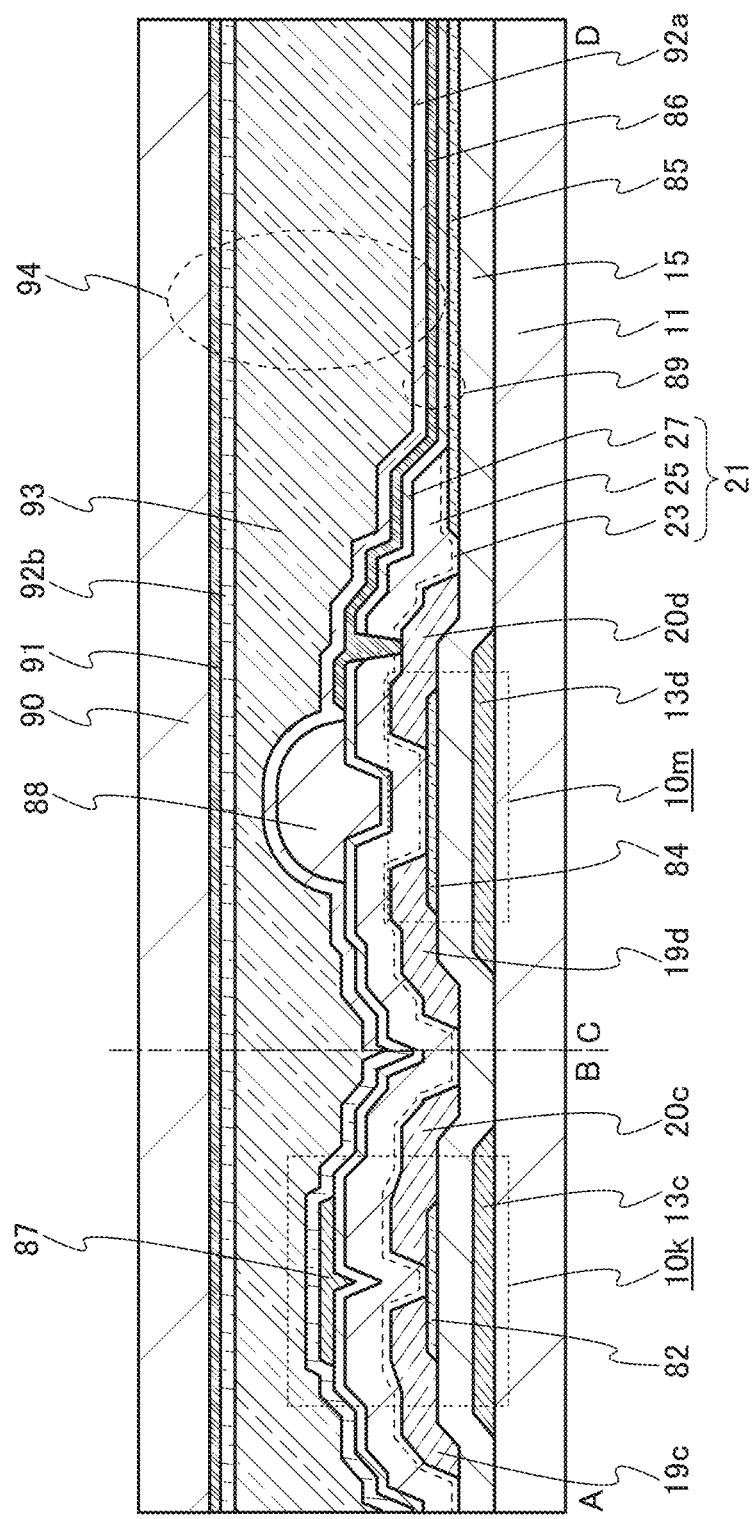
FIG. 1 is a cross-sectional view illustrating one embodiment of a liquid crystal display device.

Embodiments of the present invention are described below in detail with reference to the drawings. Note that the present invention is not limited to the following description, and it is easily understood by those skilled in the art that the mode and details can be variously changed without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such a scale.

In addition, terms such as "first", "second", and "third" in this specification are used in order to avoid confusion among components, and the terms do not limit the components numerically. Therefore, for example, the term "first" can be replaced with the term "second", "third", or the like as appropriate.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

Functions of a "source" and a "drain" are sometimes replaced with each other when the direction of current flow is changed in circuit operation, for example. Therefore, the terms "source" and "drain" can be replaced with each other in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

Note that a transistor including an oxide semiconductor film is an n-channel transistor; therefore, in this specification, a transistor that can be regarded as having no drain current flowing therein when a gate voltage is 0 V is defined as a transistor having normally-off characteristics. In contrast, a transistor that can be regarded as having a drain current flowing therein when the gate voltage is 0 V is defined as a transistor having normally-on characteristics.

Note that the channel length refers to, for example, a distance between a source (source region or source electrode) and a drain (drain region or drain electrode) in a region where an oxide semiconductor film (or a portion where a current flows in an oxide semiconductor film when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where an oxide semiconductor film (or a portion where a current flows in an oxide semiconductor film when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of an oxide semiconductor film is higher than the proportion of a channel region formed in a top surface of the oxide semiconductor film in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of an oxide semiconductor film is known. Therefore, in the case where the shape of an oxide semiconductor film is not known accurately, it is difficult to measure an effective channel width accurately.

Therefore, in this specification, in a top view of a transistor, an apparent channel width that is a length of a portion where a source and a drain face each other in a region where an oxide semiconductor film and a gate electrode overlap with each other is referred to as a surrounded channel width (SCW) in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Embodiment 1

In this embodiment, a semiconductor device of one embodiment of the present invention and a method for manufacturing the semiconductor device are described with reference to drawings. Here, a liquid crystal display device and a light-emitting device are described as examples of the semiconductor device, with reference to FIG. 1, FIG. 2, FIGS. 3A to 3C, FIGS. 4A and 4B, and FIGS. 5A and 5B. In this embodiment, the semiconductor devices each include a first transistor and a second transistor, which include oxide semiconductor films with different structures.

<Structure of Display Device>

First, a liquid crystal display device is described.

FIG. 1 is a cross-sectional view of the liquid crystal display device; a transistor formed in a driver circuit portion is shown in a cross section A-B, and a transistor formed in a pixel portion is shown in a cross section C-D.

A transistor 10k shown in the cross section A-B in FIG. 1 includes a gate electrode 13c over a substrate 11, a gate insulating film 15 over the substrate 11 and the gate electrode 13c, an oxide semiconductor film 82 overlapping with the gate electrode 13c with the gate insulating film 15 therebetween, and a pair of electrodes 19c and 20c in contact with the oxide semiconductor film 82. A protective film 21 is formed over the gate insulating film 15, the oxide semiconductor film 82, and the pair of electrodes 19c and 20c. A conductive film 87 may be provided over the protective film 21. The conductive film 87 also functions as a light-blocking film when formed using a conductive film with a light-blocking property.

The protective film 21 includes an oxide insulating film 23, an oxide insulating film 25 containing oxygen at a higher proportion than oxygen in the stoichiometric composition, and a nitride insulating film 27.

A transistor 10m shown in the cross section C-D in FIG. 1 includes a gate electrode 13d over the substrate 11, the gate insulating film 15 over the substrate 11 and the gate electrode 13d, an oxide semiconductor film 84 overlapping with the gate electrode 13d with the gate insulating film 15 therebetween, and a pair of electrodes 19d and 20d in contact with the oxide semiconductor film 84. The protective film 21 is formed over the gate insulating film 15, the oxide semiconductor film 84, and the pair of electrodes 19d and 20d. An organic insulating film 88 may be provided over the protective film 21.

An oxide semiconductor film 85 having conductivity is formed over the gate insulating film 15. The oxide semiconductor film 85 having conductivity is formed in the following manner: an oxide semiconductor film is formed at the same time as the oxide semiconductor films 82 and 84 and made to be in contact with the nitride insulating film 27, so that the oxide semiconductor film has increased number of oxygen vacancies and increased hydrogen concentration and thus has increased conductivity.

In addition, a pixel electrode 86 is provided over the protective film 21 to be connected to the electrode 20d of the transistor 10m through an opening in the protective film 21. The pixel electrode 86 can be formed using a light-transmitting conductive film.

The oxide semiconductor film 85 having conductivity, the nitride insulating film 27, and the pixel electrode 86 form a capacitor 89. The oxide semiconductor film 85 having conductivity and the pixel electrode 86 transmit light; accordingly, the capacitor 89 transmits light. Therefore, it is possible to increase the area of the capacitor 89 in a pixel. This makes it possible to form a pixel that has high aperture ratio and is provided with the capacitor 89 having high capacitance value.

An alignment film 92a is provided over the protective film 21, the pixel electrode 86, the conductive film 87, and the organic insulating film 88.

In the liquid crystal display device, a counter substrate 90 is provided. In addition, a counter electrode 91 and an alignment film 92b are provided in this order from the counter substrate 90 side between the substrate 11 and the counter substrate 90.

A liquid crystal layer 93 is provided between the alignment film 92a and the alignment film 92b. The pixel electrode 86, the liquid crystal layer 93, and the counter electrode 91 form a liquid crystal element 94.

In the liquid crystal display device shown in this embodiment, the transistor in the driver circuit portion and the transistor in the pixel portion include oxide semiconductor films with different structures.

In the liquid crystal display device shown in this embodiment, the transistor in the driver circuit portion and the transistor in the pixel portion have different channel lengths.

Typically, the channel length of the transistor 10k included in the driver circuit portion is less than 2.5 µm, preferably greater than or equal to 1.45 µm and less than or equal to 2.2 µm. The channel length of the transistor 10m included in the pixel portion is greater than or equal to 2.5 µm, preferably greater than or equal to 2.5 µm and less than or equal to 20 µm.

When the channel length of the transistor 10k included in the driver circuit portion is set to less than 2.5 µm, preferably greater than or equal to 1.45 µm and less than or equal to 2.2 µm, the field-effect mobility can be increased and the on-state current can be increased. Consequently, a driver circuit portion capable of high-speed operation can be formed.

Furthermore, the transistor 10k in the driver circuit portion includes the conductive film 87 covering the oxide semiconductor film 82 with the protective film 21 therebetween. The potential of the conductive film 87 can be set to a ground potential or a given potential. Alternatively, the conductive film 87 can be connected to the gate electrode 13c, in which case the transistor can have high field-effect mobility and high on-state current.

The oxide semiconductor film 82 and the oxide semiconductor film 84 are formed using a metal oxide containing at least In; typically, an In—Ga oxide, an In-M-Zn oxide (M is Al, Ga, Y, Zr, La, Ce, or Nd), or the like can be used.

Typical examples of the atomic ratio of the metal elements in the target used for forming the oxide semiconductor film 82 and the oxide semiconductor film 84 are In:M:Zn=2:1:1.5, In:M:Zn=2:1:2.3, In:M:Zn=2:1:3, In:M:Zn=3:1:2, In:M:Zn=3:1:3, In:M:Zn=3:1:4, In:M:Zn=1:1:1, In:M:Zn=1:1:1.2, In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

The thickness of each of the oxide semiconductor films 82 and 84 is greater than or equal to 3 nm and less than or equal to 200 nm, preferably greater than or equal to 3 nm and less than or equal to 100 nm, further preferably greater than or equal to 30 nm and less than or equal to 50 nm.

Each of the oxide semiconductor films 82 and 84 which partly serve as channel regions of the transistors has an energy gap of 2 eV or more, preferably 2.5 eV or more, further preferably 3 eV or more. With the use of an oxide semiconductor having such a wide energy gap, the off-state current of the transistors 10k and 10m can be reduced.

An oxide semiconductor film with a low carrier density is used for the oxide semiconductor films 82 and 84. For example, an oxide semiconductor film whose carrier density is $1 \times 10^{17}/cm^3$ or lower, preferably $1 \times 10^{15}/cm^3$ or lower, further preferably $1 \times 10^{13}/cm^3$ or lower, still further preferably $1 \times 10^{11}/cm^3$ or lower is used for the oxide semiconductor films 82 and 84.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain the required semiconductor characteristics of the transistor, it is preferable that the carrier density, the impurity concentration, the defect density, the atomic ratio of a metal element to oxygen, the interatomic distance, the density, and the like of each of the oxide semiconductor films 82 and 84 be set to appropriate values.

Note that an oxide semiconductor film with a low impurity concentration and a low density of defect states can be used for the oxide semiconductor films 82 and 84, in which case the transistors can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1 \times 10^6$ µm and a channel length (L) of 10 µm, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor in which a channel region is formed in the oxide semiconductor film has a small variation in electrical characteristics and high reliability. As examples of the impurities, hydrogen, nitrogen, alkali metal, and alkaline earth metal are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that not only oxygen vacancies but also hydrogen be reduced as much as possible in the oxide semiconductor films 82 and 84. Specifically, in each of the oxide semiconductor films 82 and 84, the concentration of hydrogen which is measured by secondary ion mass spectrometry (SIMS) is set to be lower than or equal to $5 \times 10^{19}$ atoms/cm$^3$, preferably lower than or equal to $1 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$, yet still further preferably lower than or equal to $5 \times 10^{17}$ atoms/cm$^3$, yet still furthermore preferably lower than or equal to $1 \times 10^{16}$ atoms/cm$^3$.

When silicon or carbon that is one of elements belonging to Group 14 is contained in the oxide semiconductor films 82 and 84, oxygen vacancies are increased in the oxide semiconductor films 82 and 84, and the oxide semiconductor films 82 and 84 become n-type films. Thus, the concentration of silicon or carbon, which is measured by SIMS, in each of the oxide semiconductor films 82 and 84 is set to be lower than or equal to $2 \times 10^{18}$ atoms/cm$^3$, preferably lower than or equal to $2 \times 10^{17}$ atoms/cm$^3$.

Further, the concentration of alkali metal or alkaline earth metal in each of the oxide semiconductor films 82 and 84, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal in the oxide semiconductor films 82 and 84.

Further, when containing nitrogen, the oxide semiconductor films 82 and 84 easily become n-type by generation of electrons serving as carriers and an increase of carrier density. A transistor including an oxide semiconductor that contains nitrogen is likely to be normally on. For this reason, nitrogen in the oxide semiconductor film is preferably reduced as much as possible; the concentration of nitrogen that is measured by SIMS is preferably set to be, for example, lower than or equal to $5 \times 10^{18}$ atoms/cm$^3$.

Next, other components of the liquid crystal display device are described in detail.

The type of the substrate 11 is not limited to a certain type, and any of a variety of substrates can be used as the substrate 11. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of a flexible substrate, an attachment film, a base material film, or the like are as follows: plastic typified by polyethylene terephthalate (PET), polyethylene naphthalate (PEN), and polyether sulfone (PES); a synthetic resin such as acrylic; polypropylene; polyester; polyvinyl fluoride; polyvinyl chloride; polyamide; polyimide; aramid; epoxy; an inorganic vapor deposition film; and paper. Specifically, when a transistor is formed using a semiconductor substrate, a single crystal substrate, an SOI substrate, or the like, it is possible to form a transistor with few variations in characteristics, size, shape, or the like, with high current supply capability, and with a small size. By forming a circuit with the use of such a transistor, power consumption of the circuit can be reduced or the circuit can be highly integrated.

Alternatively, a flexible substrate may be used as the substrate 11, and the transistors 10k and 10m may be provided directly on the flexible substrate. Further alternatively, a separation layer may be provided between the substrate 11 and the transistors 10k and 10m. The separation layer can be used when part or the whole of a semiconductor device formed over the separation layer is separated from the substrate 11 and transferred onto another substrate. In such a case, the transistors 10k and 10m can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

Examples of a substrate to which a transistor is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. With the use of such a substrate, a transistor with excellent properties or a transistor with low power consumption can be formed, a device with high durability and high heat resistance can be provided, or a reduction in weight or thickness can be achieved.

A base insulating film may be provided between the substrate 11 and the gate electrodes 13c and 13d. Examples of the base insulating film include a silicon oxide film, a silicon oxynitride film, a silicon nitride film, a silicon nitride oxide film, a gallium oxide film, a hafnium oxide film, an yttrium oxide film, an aluminum oxide film, and an aluminum oxynitride film. Note that when silicon nitride, gallium oxide, hafnium oxide, yttrium oxide, aluminum oxide, or the like is used for the base insulating film, it is possible to suppress diffusion of impurities such as alkali metal, water, and hydrogen from the substrate 11 into the oxide semiconductor films 82 and 84.

The gate electrodes 13c and 13d can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese and zirconium may be used. The gate electrodes 13c and 13d may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film that contains aluminum and one or more elements selected from titanium, tantalum, tungsten, molybdenum, chromium, neodymium, and scandium may be used.

The gate electrodes 13c and 13d can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a stacked-layer structure formed using the above light-transmitting conductive material and the above metal element.

The gate insulating film 15 can be formed to have a single-layer structure or a stacked-layer structure using, for example, one or more of silicon oxide, silicon oxynitride, silicon nitride oxide, silicon nitride, aluminum oxide, hafnium oxide, gallium oxide, and a Ga—Zn-based metal oxide. Note that the gate insulating film 15 in at least regions in contact with the oxide semiconductor films 82 and 84 is preferably formed using an oxide insulating film, in order to improve characteristics of the interface with the oxide semiconductor films 82 and 84.

The gate insulating film 15 may be formed using a high-k material such as hafnium silicate (HfSiOx), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 15 is greater than or equal to 5 nm and less than or equal to 400 nm, preferably greater than or equal to 10 nm and less than or equal to 300 nm, further preferably greater than or equal to 50 nm and less than or equal to 250 nm.

Each of the oxide insulating films 23 and 25 can be formed using a material similar to that of the gate insulating film as appropriate.

The oxide insulating film 23 may be an oxide insulating film containing nitrogen and having a small number of defects.

Typical examples of the oxide insulating film containing nitrogen and having a small number of defects include a silicon oxynitride film and an aluminum oxynitride film. Note that a "silicon oxynitride film" or an "aluminum oxynitride film" refers to a film that contains more oxygen than nitrogen, and a "silicon nitride oxide film" or an "aluminum nitride oxide film" refers to a film that contains more nitrogen than oxygen.

In an ESR spectrum at 100 K or lower of the oxide insulating film with a small number of defects, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width between the first and second signals and the split width between the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

When the oxide insulating film 23 contains a small amount of nitrogen oxide as described above, the carrier trap at the interface between the oxide insulating film 23 and each of the oxide semiconductor films 82 and 84 can be inhibited. As a result, a shift in the threshold voltage of each of the transistors can be reduced, which leads to a smaller change in the electrical characteristics of the transistors.

The oxide insulating film 23 preferably has a nitrogen concentration measured by SIMS of lower than or equal to $6 \times 10^{20}$ atoms/cm$^3$. In that case, nitrogen oxide is unlikely to be generated in the oxide insulating film 23, so that the carrier trap at the interface between the oxide insulating film 23 and each of the oxide semiconductor films 82 and 84 can be inhibited. Furthermore, a shift in the threshold voltage of each of the transistors included in the semiconductor device can be reduced, which leads to a smaller change in the electrical characteristics of the transistors.

Note that an oxide insulating film containing nitrogen and having a small number of defects as described above may be used as the gate insulating film 15. In that case, the carrier trap at the interface between the gate insulating film 15 and each of the oxide semiconductor films 82 and 84 can be inhibited. Furthermore, a shift in the threshold voltage of each of the transistors included in the semiconductor device can be reduced, which leads to a smaller change in the electrical characteristics of the transistors.

The oxide insulating film 25 may be formed using an oxide insulating film that contains oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 25. As the nitride insulating film 27, a film having an effect of blocking at least hydrogen and oxygen is used. Preferably, the nitride insulating film 27 has an effect of blocking oxygen, hydrogen, water, an alkali metal, an alkaline earth metal, or the like. It is possible to prevent outward diffusion of oxygen from the oxide semiconductor films 82 and 84 and entry of hydrogen, water, or the like into the oxide semiconductor films 82 and 84 from the outside by providing the nitride insulating film 27.

The nitride insulating film 27 is formed using a silicon nitride film, a silicon nitride oxide film, an aluminum nitride film, an aluminum nitride oxide film, or the like having a thickness greater than or equal to 50 nm and less than or equal to 300 nm, preferably greater than or equal to 100 nm and less than or equal to 200 nm.

Note that instead of the nitride insulating film 27, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

In the transistor 10m in the pixel portion, the organic insulating film 88 isolated from the organic insulating films 88 of other pixels is preferably provided over the protective film 21. For the organic insulating film 88, for example, polyimide, acrylic, polyamide, epoxy, or the like can be used. The thickness of the organic insulating film 88 is preferably greater than or equal to 500 nm and less than or equal to 10 μm.

The organic insulating film 88 is preferably isolated from other organic insulating films 88 so that water from the outside does not spread to the semiconductor device through the organic insulating film 88.

Since the organic insulating film 88 is thick (greater than or equal to 500 nm), an electric field generated by application of negative voltage to the gate electrode 13d does not affect a surface of the organic insulating film 88; as a result, positive charges are less likely to be accumulated on the surface of the organic insulating film 88. In addition, even when positively charged particle in the air is adsorbed on the surface of the organic insulating film 88, the electric field of the positively charged particle adsorbed on the surface of the organic insulating film 88 is less likely to affect the interface between the oxide semiconductor film 84 and the protective film 21, because the organic insulating film 88 is thick (greater than or equal to 500 nm). As a result, practically no positive bias is applied to the interface between the oxide semiconductor film 84 and the protective film 21; thus, a change in the threshold voltage of the transistor is small. Note that the channel length of the transistor 10m may be greater than or equal to 2.5 μm.

Next, a structure of a light-emitting device is described with reference to FIG. 2.

Figure 2:
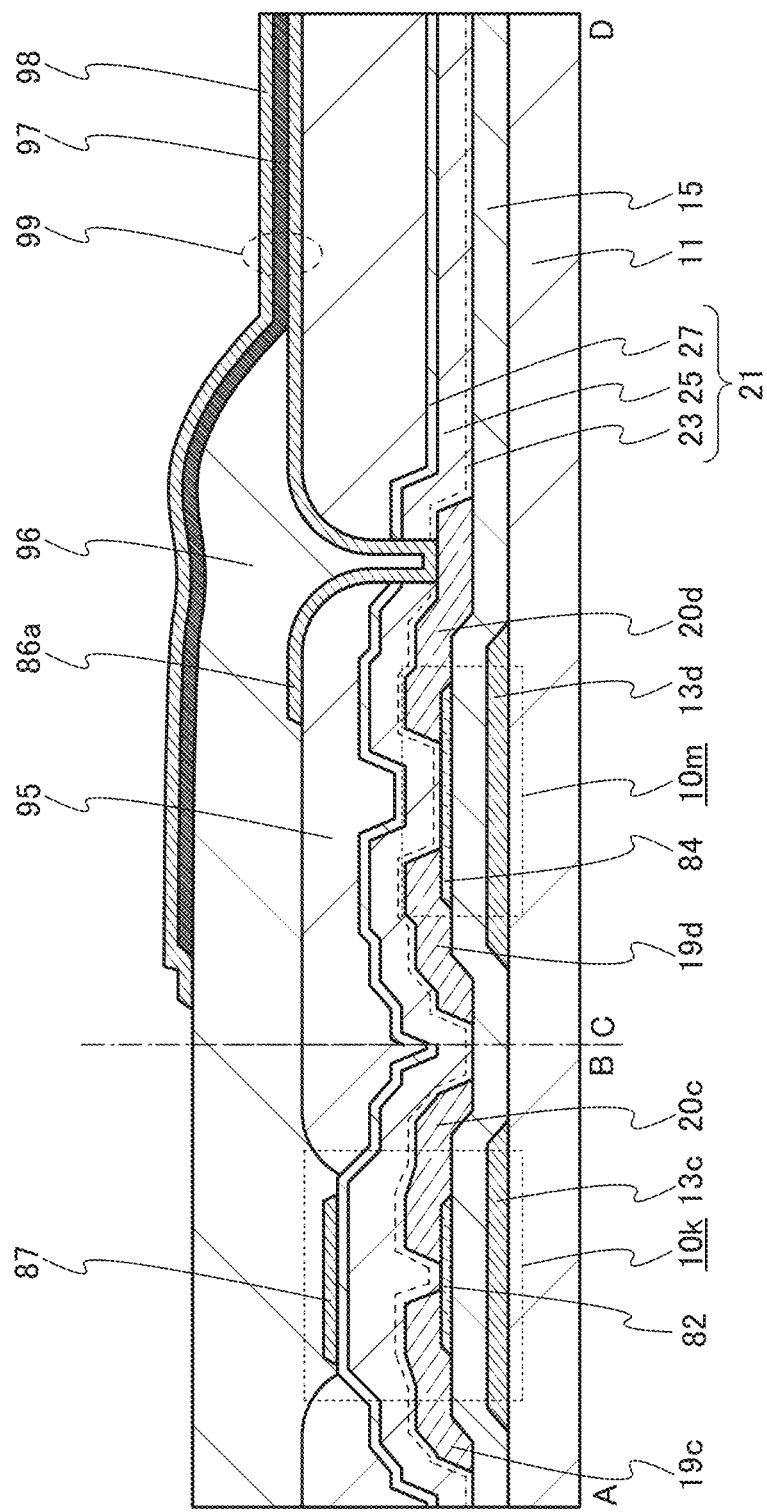
FIG. 2 is a cross-sectional view illustrating one embodiment of a light-emitting device.

FIG. 2 is a cross-sectional view of the light-emitting device; the transistor 10k formed in a driver circuit portion is shown in a cross section A-B, and the transistor 10m formed in a pixel portion is shown in a cross section C-D.

An insulating film 95 is provided over the protective film 21. In addition, a first electrode 86a is provided to be connected to the electrode 20d of the transistor 10m through an opening in the insulating film 95. The first electrode 86a can be formed using a light-transmitting conductive film or a conductive film with a light-reflecting property.

An insulating film 96 is provided over the conductive film 87, the first electrode 86a, and the insulating film 95. The insulating film 96 includes an opening where the first electrode 86a is partly exposed. An EL layer 97 is provided over the insulating film 96 and the first electrode 86a, and a second electrode 98 is provided over the insulating film 96 and the EL layer 97. The first electrode 86a, the EL layer 97, and the second electrode 98 can form an organic EL element 99.

Each of the insulating films 95 and 96 can be formed using, for example, an organic resin or an inorganic insulating material. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. In particular, a photosensitive resin is preferably used for easy formation of the insulating films 95 and 96. There is no particular limitation on the method for forming the insulating films 95 and 96. A photolithography method, a sputtering method, an evaporation method, a droplet discharging method (e.g., an inkjet method), a printing method (e.g., a screen printing method or an offset printing method), or the like can be used.

As the first electrode 86a, for example, a metal film having a high light-reflecting property with respect to visible light is preferably used. As the metal film, for example, aluminum, silver, or an alloy of any of these can be used.

The EL layer 97 can be formed using a light-emitting material in which holes and electrons injected from the first electrode 86a and the second electrode 98 can be recombined to cause light emission. In addition to the EL layer, a functional layer such as a hole-injection layer, a hole-transport layer, an electron-transport layer, or an electron-injection layer may be formed as needed.

As the second electrode 98, for example, a conductive film that transmits visible light is preferably used. For example, a material including one of indium (In), zinc (Zn), and tin (Sn) is preferably used for the conductive film. For the second electrode 98, a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added can be used. It is particularly preferable to use indium tin oxide to which silicon oxide is added for the second electrode 98, in which case a crack or the like is unlikely to be caused in the second electrode 98 when the light-emitting device is bent.

<Method for Manufacturing Display Device>

A method for manufacturing transistors included in the display device is described. Here, using a light-emitting device shown in FIG. 29 as an example of the display device, a method for manufacturing a transistor 10k_4 and a transistor 10m_4 is described with reference to FIGS. 3A to 3C, FIGS. 4A and 4B, and FIGS. 5A and 5B.

The films included in the transistors 10k_4 and 10m_4 (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method is performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method is performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, the ALD method makes it possible to accurately adjust a thickness and thus is suitable for manufacturing a minute FET.

Figure 3A:
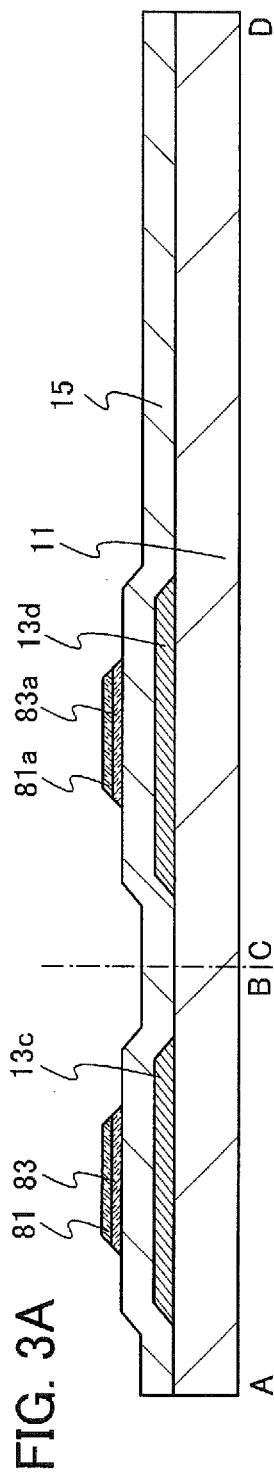
FIGS. 3A to 3C are cross-sectional views illustrating one embodiment of a method for manufacturing a transistor.

As shown in FIG. 3A, the gate electrodes 13c and 13d and the gate insulating film 15 are formed over the substrate 11. Next, a stacked film of an oxide semiconductor film 83 and an oxide semiconductor film 81 and a stacked film of an oxide semiconductor film 83a and an oxide semiconductor film 81a are formed over the gate insulating film 15.

A formation method of the gate electrodes 13c and 13d is described below. First, a conductive film is formed by a sputtering method, a vacuum evaporation method, a pulsed laser deposition (PLD) method, a thermal CVD method, or the like and then a mask is formed over the conductive film by a photolithography process. Next, the conductive film is partly etched using the mask to form the gate electrodes 13c and 13d. After that, the mask is removed.

Note that the gate electrodes 13c and 13d may be formed by an electrolytic plating method, a printing method, an inkjet method, or the like instead of the above formation method.

Alternatively, a tungsten film can be formed as the conductive film with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Here, a 100-nm-thick tungsten film is formed by a sputtering method. Next, a mask is formed by a photolithography process, and the tungsten film is subjected to dry etching with the use of the mask to form the gate electrodes 13c and 13d.

The gate insulating film 15 is formed by a sputtering method, a CVD method, a vacuum evaporation method, a pulsed laser deposition (PLD) method, a thermal CVD method, or the like.

In the case of forming a silicon oxide film or a silicon oxynitride film as the gate insulating film 15, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case where a gallium oxide film is formed as the gate insulating film 15, an MOCVD method can be used.

In the case where a hafnium oxide film is formed as the gate insulating film 15 by a thermal CVD method such as an MOCVD method or an ALD method, two kinds of gases, i.e., ozone ($O_3$) as an oxidizer and a source material gas which is obtained by vaporizing liquid containing a solvent and a hafnium precursor compound (a hafnium alkoxide solution, which is typified by tetrakis(dimethylamide)hafnium (TDMAH)), are used. Note that the chemical formula of tetrakis(dimethylamide)hafnium is $Hf[N(CH_3)_2]_4$. Examples of another material liquid include tetrakis(ethylmethylamide)hafnium.

In the case where an aluminum oxide film is formed as the gate insulating film 15 by a thermal CVD method such as an MOCVD method or an ALD method, two kinds of gases, i.e., $H_2O$ as an oxidizer and a source material gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

Furthermore, in the case where a silicon oxide film is formed as the gate insulating film 15 by a thermal CVD method such as an MOCVD method or an ALD method, hexachlorodisilane is adsorbed on a deposition surface, chlorine contained in the adsorbate is removed, and radicals of an oxidizing gas (e.g., 02 or dinitrogen monoxide) are supplied to react with the adsorbate.

Here, a silicon oxynitride film is formed as the gate insulating film 15 by a plasma CVD method.

Figure 3B:
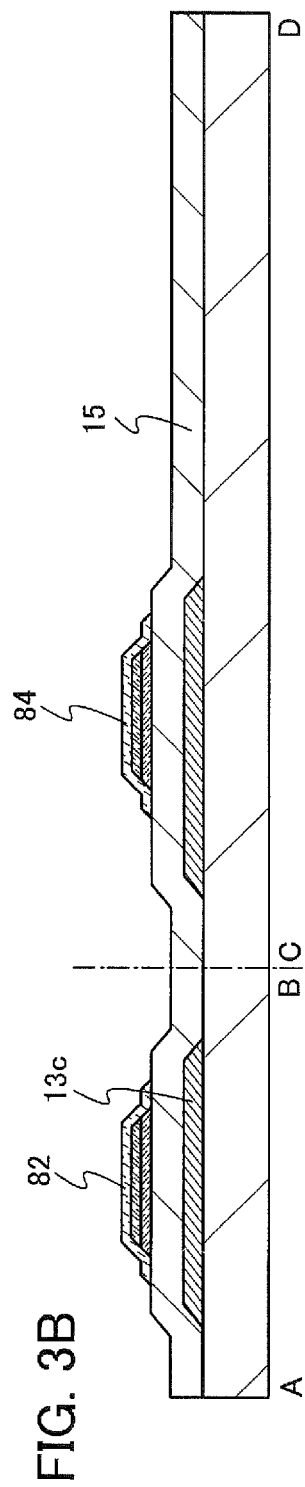

A formation method of the stacked film of the oxide semiconductor film 83 and the oxide semiconductor film 81 and the stacked film of the oxide semiconductor film 83a and the oxide semiconductor film 81a is described below. An oxide semiconductor film to be the oxide semiconductor film 83 and the oxide semiconductor film 83a and an oxide semiconductor film to be the oxide semiconductor film 81 and the oxide semiconductor film 81a are formed over the gate insulating film 15 by a sputtering method, a coating method, a pulsed laser deposition method, a laser ablation method, a thermal CVD method, or the like. Then, after a mask is formed over the stacked oxide semiconductor films by a photolithography process, the stacked oxide semiconductor films are partly etched using the mask. Thus, as illustrated in FIG. 3B, the stacked film of the oxide semiconductor film 83 and the oxide semiconductor film 81, which is over the gate insulating film 15 and subjected to element isolation so as to partly overlap with the gate electrode 13c, and the stacked film of the oxide semiconductor film 83a and the oxide semiconductor film 81a, which is over the gate insulating film 15 and subjected to element isolation so as to partly overlap with the gate electrode 13d, are formed. After that, the mask is removed.

As a power supply device for generating plasma in the case of forming an oxide semiconductor film by a sputtering method, an RF power supply device, an AC power supply device, a DC power supply device, or the like can be used as appropriate.

As a sputtering gas, a rare gas (typically argon) atmosphere, an oxygen atmosphere, or a mixed gas of a rare gas and oxygen is used as appropriate. In the case of the mixed gas of a rare gas and oxygen, the proportion of oxygen to a rare gas is preferably increased.

Further, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film, the following conditions are preferably used.

By suppressing entry of impurities into the film during the deposition, the crystal state can be prevented from being broken by the impurities. For example, the concentration of impurities (e.g., hydrogen, water, carbon dioxide, or nitrogen) that exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

By forming the oxide semiconductor film while it is heated or performing heat treatment after the formation of the oxide semiconductor film, the hydrogen concentration can be lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than or equal to $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, further preferably lower than or equal to $1 \times 10^{16}$ atoms/cm$^3$.

For example, in the case where an oxide semiconductor film, e.g., an InGaZnO$_X$ (X>0) film is formed using a deposition apparatus employing ALD, an In(CH$_3$)$_3$ gas and an O$_3$ gas are sequentially introduced more than once to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

Here, a 10-nm-thick oxide semiconductor film and a 35-nm-thick oxide semiconductor film are formed in this order by a sputtering method using a target having the atomic ratio of the metal elements of In:Ga:Zn=1:3:6 and a target having the atomic ratio of the metal elements of In:Ga:Zn=3:1:2, respectively, a mask is formed over the oxide semiconductor films, and then the oxide semiconductor films are selectively etched.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which is described later, is greater than or equal to 70% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. This means that an oxide semiconductor film with a low impurity concentration and a low density of defect states can be formed.

Then, as shown in FIG. 3B, an oxide semiconductor film is formed over the gate insulating film 15 and the stacked films and etched into a desired shape; thus, the oxide semiconductor film 82 covering the stacked film of the oxide semiconductor film 83 and the oxide semiconductor film 81 and the oxide semiconductor film 84 covering the stacked film of the oxide semiconductor film 83a and the oxide semiconductor film 81a are formed.

In this step, the oxide semiconductor film 82 is formed to cover a side surface of the oxide semiconductor film 83 and a top surface and a side surface of the oxide semiconductor film 81, to prevent the oxide semiconductor film 83 and the oxide semiconductor film 81 from being etched in a later step of forming a pair of electrodes. This is preferable because variations in the lengths of the oxide semiconductor films 83 and 81 in the channel width direction of the transistor can be reduced. Similarly, the oxide semiconductor film 84 is formed to cover a side surface of the oxide semiconductor film 83a and a top surface and a side surface of the oxide semiconductor film 81a, to prevent the oxide semiconductor film 83a and the oxide semiconductor film 81a from being etched in a later step of forming a pair of electrodes. This is preferable because variations in the lengths of the oxide semiconductor films 83a and 81a in the channel width direction of the transistor can be reduced.

Next, heat treatment may be performed to dehydrogenate or dehydrate the oxide semiconductor films. The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed under an inert gas atmosphere containing nitrogen or a rare gas such as helium, neon, argon, xenon, or krypton. Further, the heat treatment may be performed under an inert gas atmosphere first, and then under an oxygen atmosphere. It is preferable that the above inert gas atmosphere and the above oxygen atmosphere do not contain hydrogen, water, and the like. The treatment time is 3 minutes to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

Here, heat treatment is performed at 450° C. in a mixed gas of nitrogen and oxygen, and after that, another heat treatment is performed at 450° C. in an oxygen atmosphere.

Note that instead of this heat treatment, similar heat treatment may be performed after the step shown in FIG. 3A.

Figure 3C:
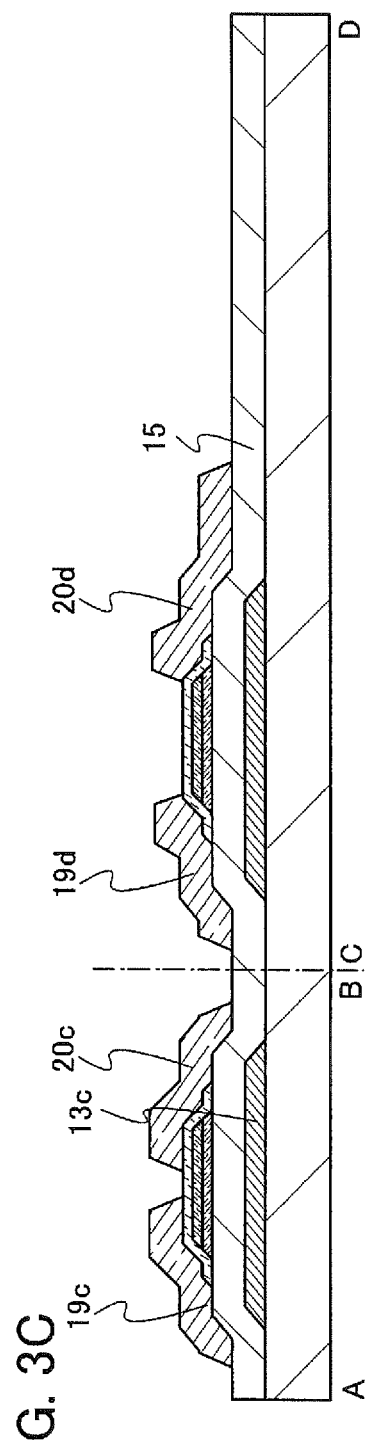

Next, as illustrated in FIG. 3C, the pair of electrodes 19c and 20c and the pair of electrodes 19d and 20d are formed over the oxide semiconductor film 82 and the oxide semiconductor film 84.

A formation method of the pair of electrodes 19c and 20c and the pair of electrodes 19d and 20d is described below. First, a conductive film is formed by a sputtering method, a vacuum evaporation method, a pulsed laser deposition (PLD) method, a thermal CVD method, or the like. Then, a mask is formed over the conductive film by a photolithography process. Then, the conductive film is etched using the mask, so that the pair of electrodes 19c and 20c and the pair of electrodes 19d and 20d are formed. After that, the mask is removed.

Here, a 50-nm-thick copper-manganese alloy film, a 400-nm-thick copper film, and a 100-nm-thick copper-manganese alloy film are stacked in this order by a sputtering method. Next, a mask is formed over the copper-manganese alloy film by a photolithography process and the copper-manganese alloy films and the copper film are dry-etched with the use of the mask, so that the pair of electrodes 19c and 20c and the pair of electrodes 19d and 20d are formed.

Note that heat treatment may be performed after the pair of electrodes 19c and 20c and the pair of electrodes 19d and 20d are formed. For example, this heat treatment can be performed in a manner similar to that of the heat treatment performed after the oxide semiconductor films 82 and 84 are formed.

After the pair of electrodes 19c and 20c and the pair of electrodes 19d and 20d are formed, cleaning treatment is preferably performed to remove an etching residue. A short circuit between the pair of electrodes 19c and 20c and a short circuit between the pair of electrodes 19d and 20d can be suppressed by this cleaning treatment. The cleaning treatment can be performed using an alkaline solution such as a tetramethylammonium hydroxide (TMAH) solution; an acidic solution such as a hydrofluoric acid, an oxalic acid solution, or a phosphoric acid solution; or water.

Figure 4A:
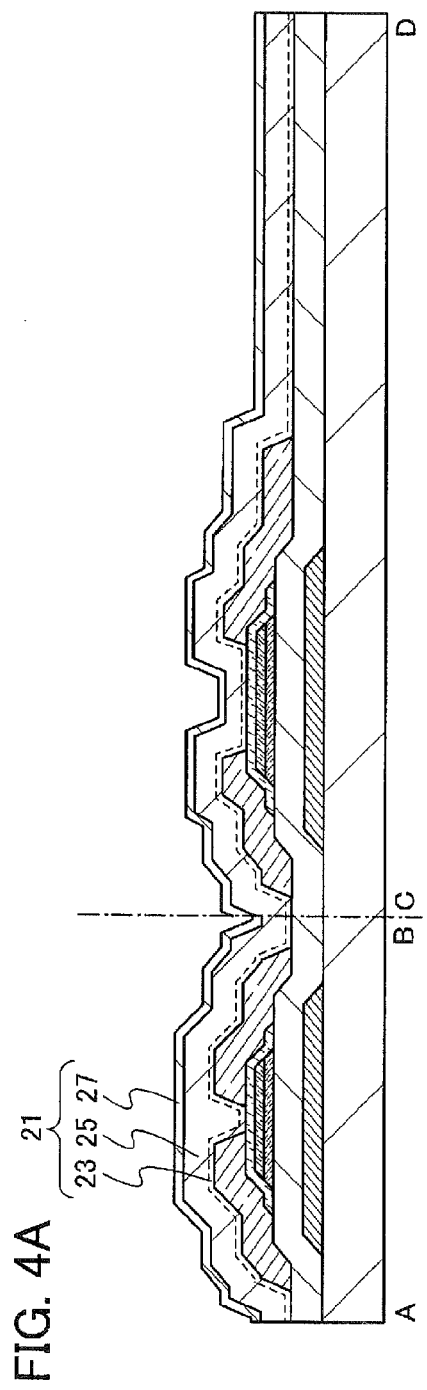
FIGS. 4A and 4B are cross-sectional views illustrating one embodiment of a method for manufacturing a transistor.

Then, as shown in FIG. 4A, the protective film 21 is formed over the gate insulating film 15, the oxide semiconductor film 82, the oxide semiconductor film 84, the pair of electrodes 19c and 20c, and the pair of electrodes 19d and 20d.

The protective film 21 can be formed by a sputtering method, a CVD method, an evaporation method, or the like.

In the case where an oxide insulating film containing nitrogen and having a small number of defects is formed as the oxide insulating film 23 included in the protective film 21, a silicon oxynitride film can be formed by a CVD method as an example of the oxide insulating film. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide.

The oxide insulating film containing nitrogen and having a small number of defects can be formed as the oxide insulating film 23 by a CVD method under the conditions where the ratio of an oxidizing gas to a deposition gas is higher than 20 times and lower than 100 times, preferably higher than or equal to 40 times and lower than or equal to 80 times and the pressure in a treatment chamber is lower than 100 Pa, preferably lower than or equal to 50 Pa.

In the case where an oxide insulating film containing oxygen at a higher proportion than oxygen in the stoichiometric composition is formed as the oxide insulating film 25 included in the protective film 21, a silicon oxynitride film can be formed by a CVD method as an example of the oxide insulating film.

As the oxide insulating film 25, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

The nitride insulating film 27 can be formed by a sputtering method, a CVD method, or the like.

In the case where a silicon nitride film is formed by the plasma CVD method as the nitride insulating film 27, a deposition gas containing silicon, nitrogen, and ammonia is used as the source gas. As the source gas, ammonia whose amount is smaller than the amount of nitrogen is used, whereby ammonia is dissociated in the plasma and activated species are generated. The activated species break a bond between silicon and hydrogen that are contained in a deposition gas containing silicon and a triple bond between nitrogen molecules. As a result, a dense silicon nitride film having a small number of defects, in which bonds between silicon and nitrogen are promoted and bonds between silicon and hydrogen is few, can be formed. In contrast, when the amount of ammonia is larger than the amount of nitrogen in a source gas, decomposition of a deposition gas containing silicon and decomposition of nitrogen are not promoted, so that a sparse silicon nitride film in which bonds between silicon and hydrogen remain and defects are increased is formed. Therefore, in a source gas, the flow ratio of the nitrogen to the ammonia is set to be preferably greater than or equal to 5 and less than or equal to 50, further preferably greater than or equal to 10 and less than or equal to 50.

Heat treatment may be performed after formation of the oxide insulating film 25. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By the heat treatment, part of oxygen contained in the oxide insulating film 25 can be moved to the oxide semiconductor films 83, 81, 82, 83a, 81a, and 84, so that the number of oxygen vacancies contained in these oxide semiconductor films can be reduced.

Here, heat treatment is performed at 350° C. in a mixed atmosphere containing nitrogen and oxygen for one hour.

Furthermore, heat treatment can be performed after formation of the nitride insulating film 27 so that hydrogen or the like is released from the protective film 21.

Here, heat treatment is performed at 350° C. in a mixed atmosphere containing nitrogen and oxygen for one hour.

Through the above steps, transistors in each of which a shift in the threshold voltage is reduced can be manufactured. Further, transistors in each of which a change in electrical characteristics is reduced can be manufactured.

Figure 4B:
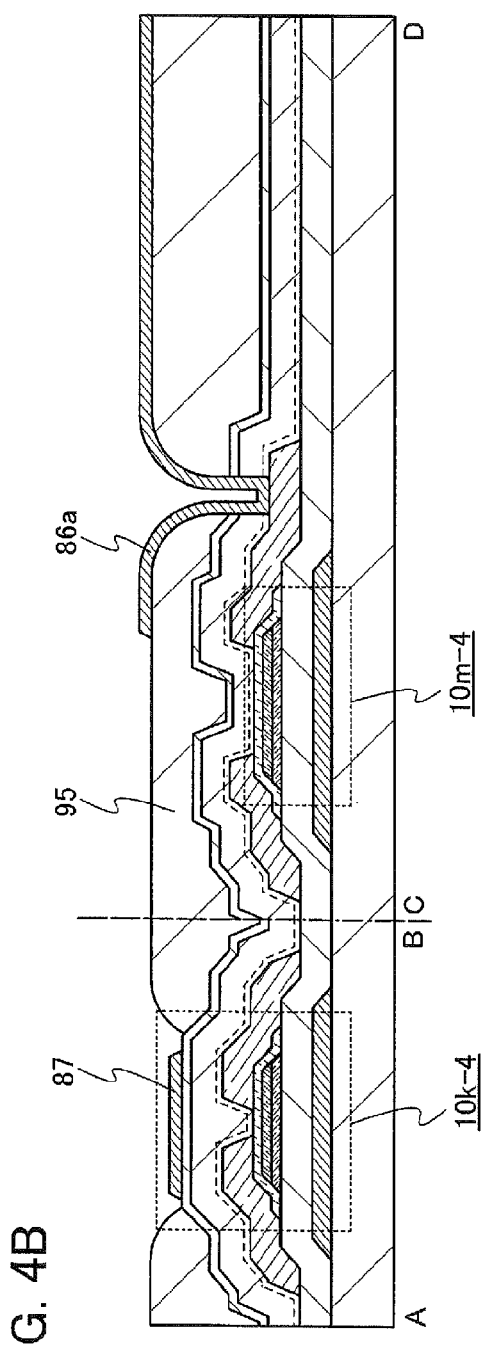

Next, as shown in FIG. 4B, the insulating film 95 including an opening where the protective film 21 over the oxide semiconductor film 82 of the transistor 10k4 is partly exposed and an opening where the electrode 20d of the transistor 10m_4 is partly exposed is formed. Then, the conductive film 87 is formed over the protective film 21 to overlap with the oxide semiconductor film 82 of the transistor 10k 4, and the first electrode 86a connected to the electrode 20d of the transistor 10m_4 is formed over the insulating film 95.

The insulating film 95 can be formed by a photolithography method, a sputtering method, an evaporation method, a droplet discharging method (e.g., an inkjet method), a printing method (e.g., a screen printing method or an offset printing method), or the like.

Here, the insulating film 95 is formed using photosensitive polyimide.

The first electrode 86a can be formed by a sputtering method, an evaporation method, a droplet discharging method (e.g., an inkjet method), a printing method (e.g., a screen printing method or an offset printing method), or the like.

Figure 5A:
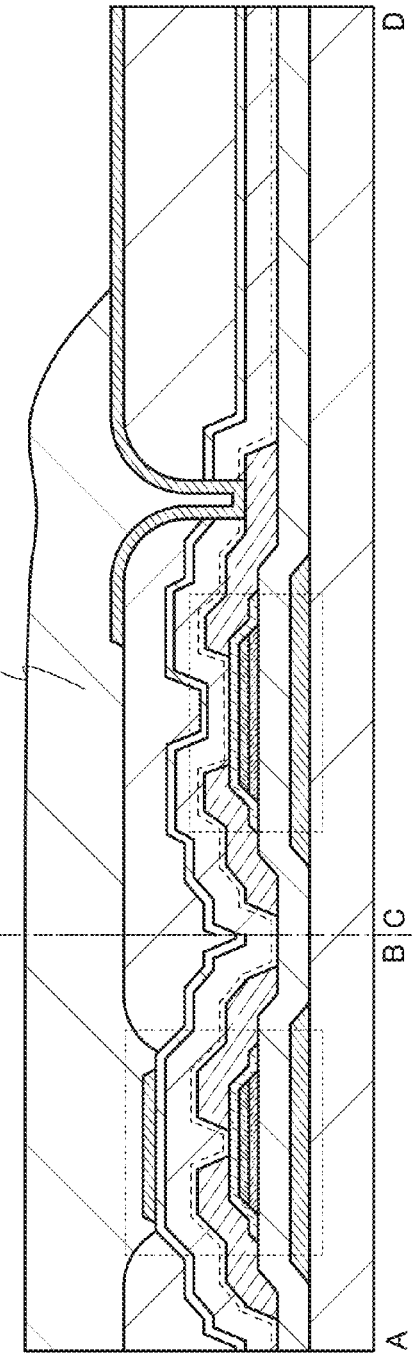
FIGS. 5A and 5B are cross-sectional views illustrating one embodiment of a method for manufacturing a transistor.

Next, as shown in FIG. 5A, the insulating film 96 is formed over the insulating film 95, the conductive film 87, and the first electrode 86a. The insulating film 96 can be formed by a method similar to that of the insulating film 95 as appropriate.

Figure 5B:
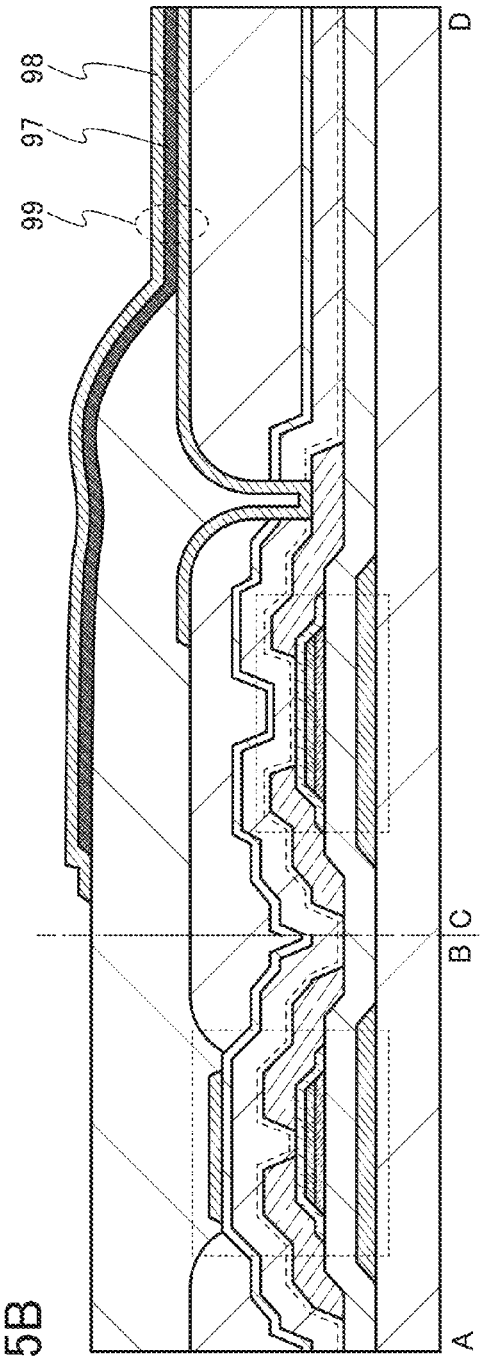

Then, as shown in FIG. 5B, the EL layer 97 is formed over the insulating film 96 and the first electrode 86a. The EL layer 97 can be formed by an evaporation method, a droplet discharging method (e.g., an inkjet method), a coating method, or the like.

Through the above steps, a display device being capable of high-speed operation and having a pixel portion that does not easily deteriorate due to light irradiation and provides high display quality can be manufactured.

Variations of the transistors in the liquid crystal display device shown in FIG. 1 and the light-emitting device shown in FIG. 2 are described below.

<Variation 1>

Figure 26:
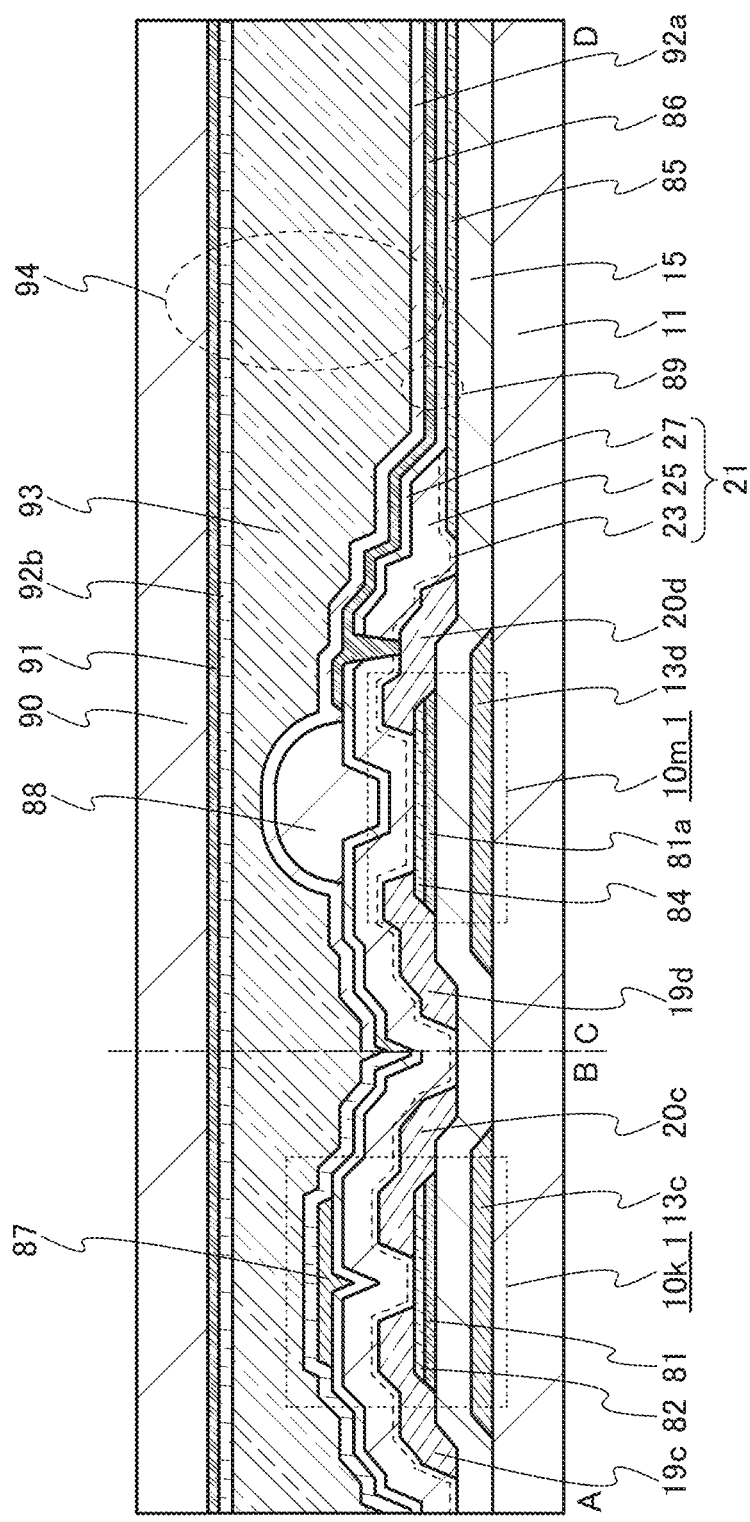
FIG. 26 is a cross-sectional view illustrating one embodiment of a liquid crystal display device.

The liquid crystal display device shown in FIG. 1 and the light-emitting device shown in FIG. 2 may include a transistor in which two oxide semiconductor films are stacked. Here, a variation of the liquid crystal display device shown in FIG. 1 is described. Specifically, as shown in FIG. 26, a transistor 10k_1 in which the oxide semiconductor film 81 and the oxide semiconductor film 82 are stacked over the gate insulating film 15 and a transistor 10m_1 in which the oxide semiconductor film 81a and the oxide semiconductor film 84 are stacked over the gate insulating film 15 are provided.

The proportion of In atoms may be higher than or equal to that of Zn or M (M is Al, Ga, Y, Zr, La, Ce, or Nd) atoms in the oxide semiconductor film 81 and the oxide semiconductor film 81a. In the case where the oxide semiconductor film 81 and the oxide semiconductor film 81a contain an In-M-Zn oxide (M is Al, Ga, Y, Zr, La, Ce, or Nd), and a target having the atomic ratio of the metal elements of In:M:Zn=$x_3$:$y_3$:$z_3$ is used for forming the oxide semiconductor film 81 and the oxide semiconductor film 81a, $x_3/y_3$ is preferably greater than 1 and less than or equal to 6.

Typical examples of the atomic ratio of the metal elements in the target are In:M:Zn=2:1:1.5, In:M:Zn=2:1:2.3, In:M:Zn=2:1:3, In:M:Zn=3:1:2, In:M:Zn=3:1:3, In:M:Zn=3:1:4, In:M:Zn=1:1:1, and In:M:Zn=1:1:1.2.

The proportion of In atoms may be lower than that of Zn or M (M is Al, Ga, Y, Zr, La, Ce, or Nd) atoms in the oxide semiconductor film 82 and the oxide semiconductor film 84. In the case where the oxide semiconductor film 82 and the oxide semiconductor film 84 contain an In-M-Zn oxide (M is Al, Ga, Y, Zr, La, Ce, or Nd), and a target having the atomic ratio of the metal elements of In:M:Zn=$x_4$:$y_4$:$z_4$ is used for forming the oxide semiconductor film 82 and the oxide semiconductor film 84, $x_4/y_4$ is preferably greater than or equal to 1/6 and less than or equal to 1, and $z_4/y_4$ is preferably greater than or equal to 1/3 and less than or equal to 6, further preferably greater than or equal to 1 and less than or equal to 6. Note that when $z_4/y_4$ is greater than or equal to 1 and less than or equal to 6, CAAC-OS films are easily formed as the oxide semiconductor film 82 and the oxide semiconductor film 84. Typical examples of the atomic ratio of the metal elements in the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

<Variation 2>

Figure 27:
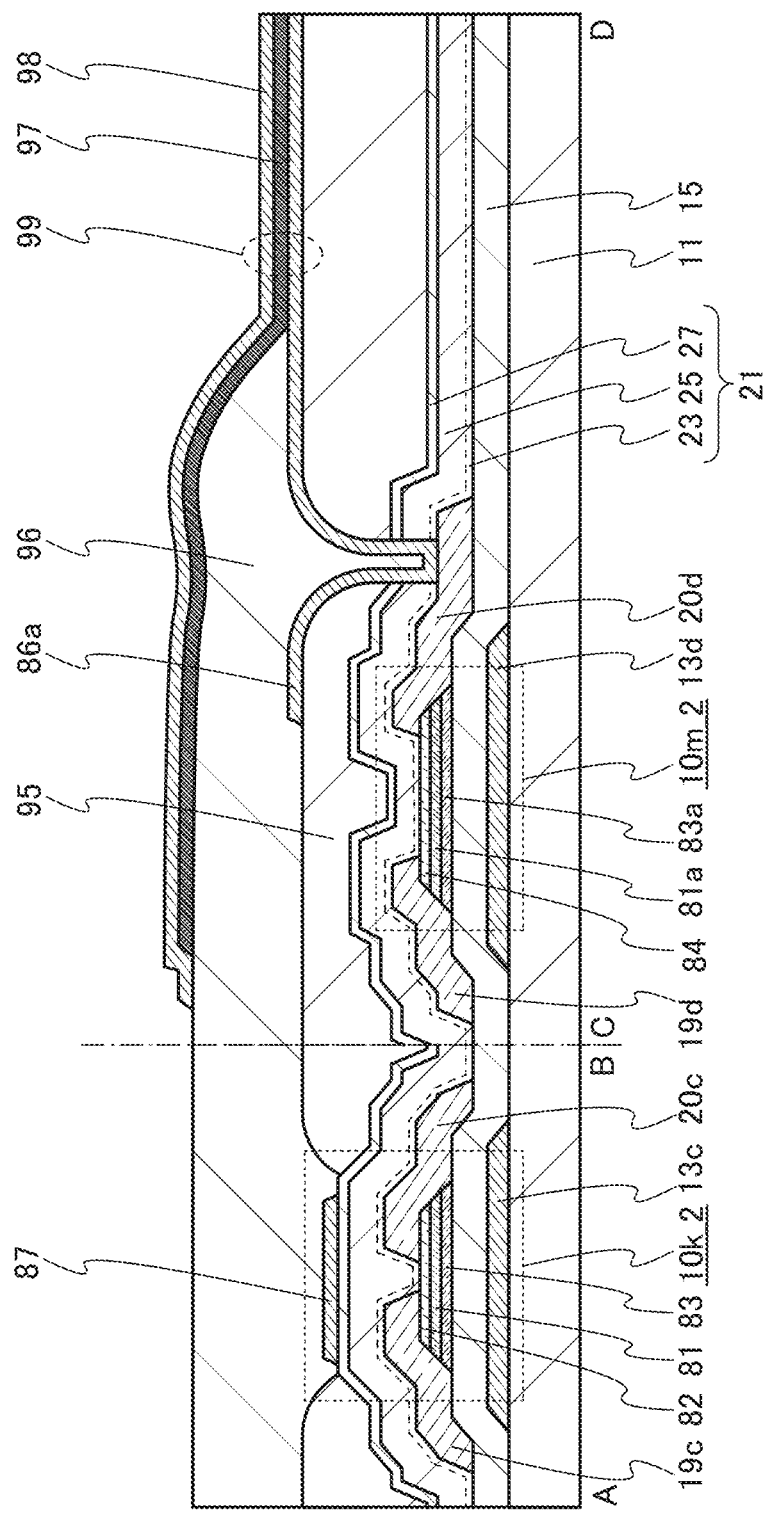
FIG. 27 is a cross-sectional view illustrating one embodiment of a light-emitting device.

The liquid crystal display device shown in FIG. 1 and the light-emitting device shown in FIG. 2 may include a transistor in which three or more oxide semiconductor films are stacked. Here, a variation of the light-emitting device shown in FIG. 2 is described. Specifically, as shown in FIG. 27, a transistor 10k_2 in which the oxide semiconductor film 83, the oxide semiconductor film 81, and the oxide semiconductor film 82 are stacked over the gate insulating film 15 and a transistor 10m_2 in which the oxide semiconductor film 83a, the oxide semiconductor film 81a, and the oxide semiconductor film 84 are stacked over the gate insulating film 15 are provided.

For the oxide semiconductor film 83 and the oxide semiconductor film 83a, an oxide semiconductor film having any of the atomic ratios given as examples of the atomic ratio of the metal elements in the oxide semiconductor film 82 and the oxide semiconductor film 84 can be used as appropriate. Each of the oxide semiconductor films 81 and 81a which serve as channel regions of the transistors is the thickest among the stacked oxide semiconductor films. The thickness of each of the oxide semiconductor films 81 and 81a is greater than or equal to 3 nm and less than or equal to 200 nm, preferably greater than or equal to 3 nm and less than or equal to 100 nm, further preferably greater than or equal to 30 nm and less than or equal to 50 nm. Each of the oxide semiconductor films 83 and 83a is preferably the thinnest among the stacked oxide semiconductor films. The thickness of each of the oxide semiconductor films 83 and 83a is greater than or equal to 2 nm and less than or equal to 100 nm, preferably greater than or equal to 2 nm and less than or equal to 50 nm, further preferably greater than or equal to 3 nm and less than or equal to 15 nm.

<Variation 3>

Figure 28:
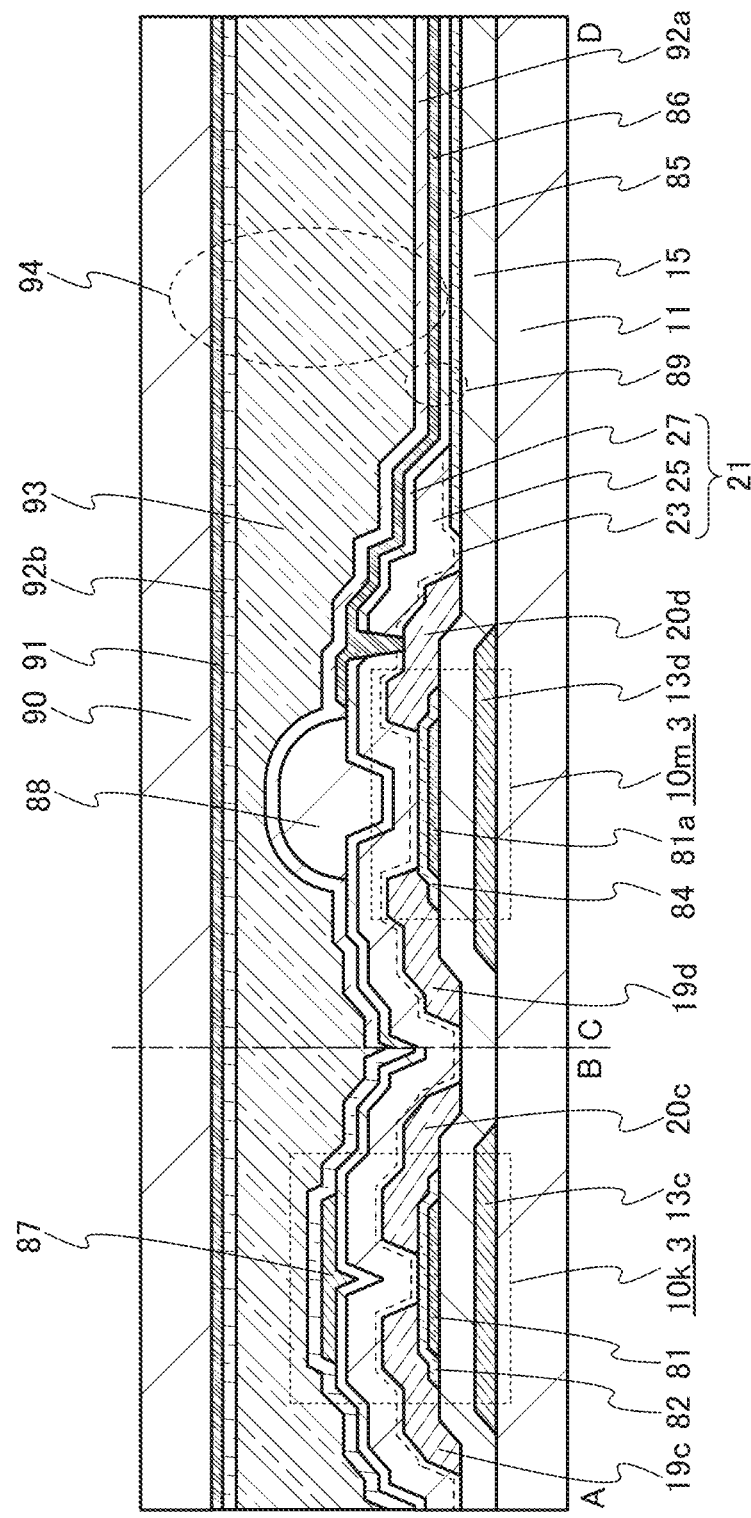
FIG. 28 is a cross-sectional view illustrating one embodiment of a liquid crystal display device.

The liquid crystal display device shown in FIG. 1 and the light-emitting device shown in FIG. 2 may include a transistor in which two oxide semiconductor films are stacked. Here, a variation of the liquid crystal display device shown in FIG. 1 is described. Specifically, as shown in FIG. 28, transistors in which oxide semiconductor films are stacked are provided. The transistors are a transistor 10k_3 in which the oxide semiconductor film 81 and the oxide semiconductor film 82 covering a side surface and a top surface of the oxide semiconductor film 81 are stacked over the gate insulating film 15 and a transistor 10m_3 in which the oxide semiconductor film 81a and the oxide semiconductor film 84 covering a side surface and a top surface of the oxide semiconductor film 81a are stacked over the gate insulating film 15.

Since the oxide semiconductor film 82 is formed to cover the top surface and the side surface of the oxide semiconductor film 81, the oxide semiconductor film 81 is not etched in a later step of forming a pair of electrodes. This is preferable because variations in the length of the oxide semiconductor film 81 in the channel width direction of the transistor can be reduced. In addition, since the oxide semiconductor film 84 is formed to cover the top surface and the side surface of the oxide semiconductor film 81a, the oxide semiconductor film 81a is not etched in a later step of forming a pair of electrodes. This is preferable because variations in the length of the oxide semiconductor film 81a in the channel width direction of the transistor can be reduced.

<Variation 4>

Figure 29:
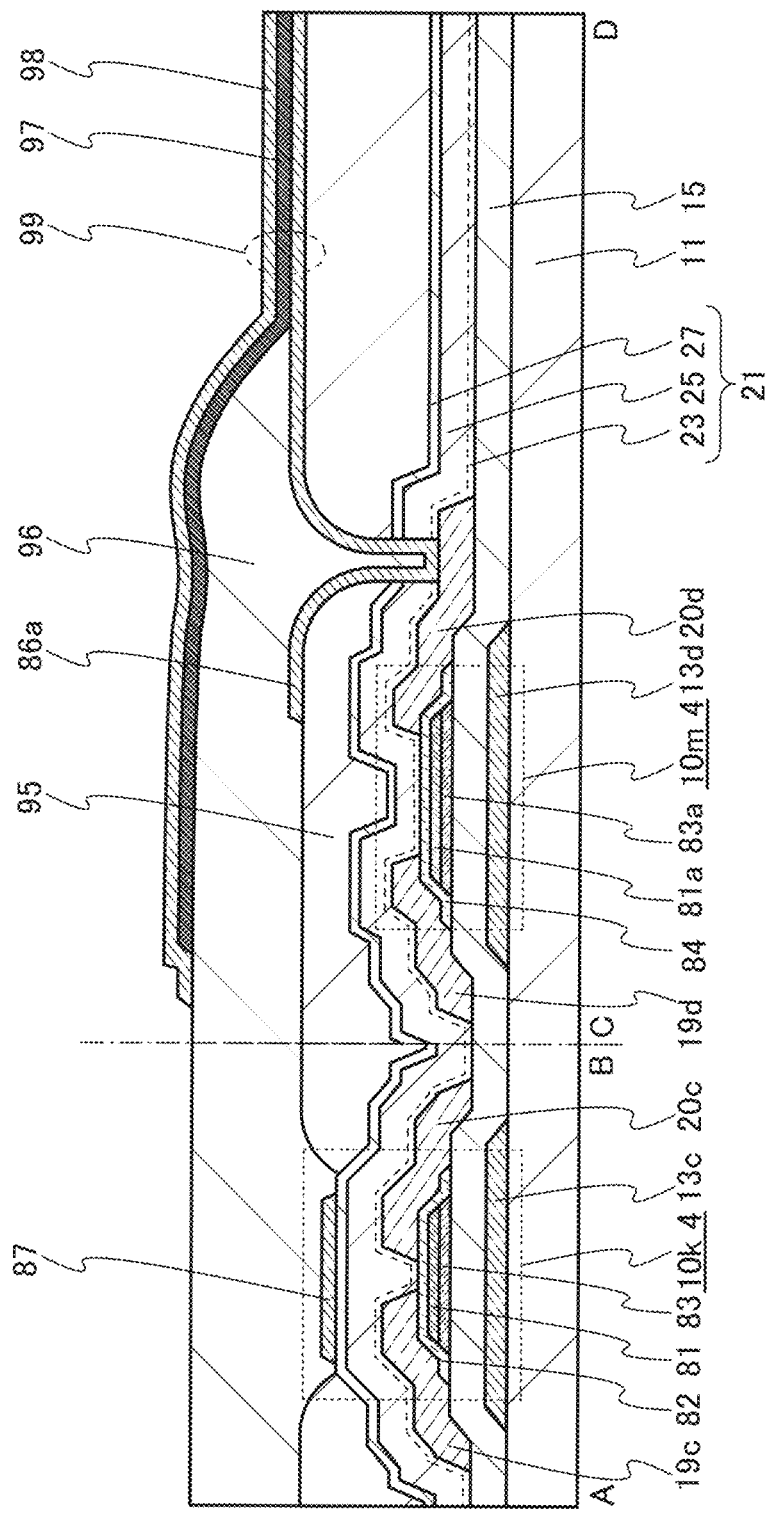
FIG. 29 is a cross-sectional view illustrating one embodiment of a light-emitting device.

The liquid crystal display device shown in FIG. 1 and the light-emitting device shown in FIG. 2 may include a transistor in which three or more oxide semiconductor films are stacked. Here, a variation of the light-emitting device shown in FIG. 2 is described. Specifically, as shown in FIG. 29, transistors in which oxide semiconductor films are stacked are provided. The transistors are the transistor 10k_4 in which the oxide semiconductor film 83, the oxide semiconductor film 81 over the oxide semiconductor film 83, and the oxide semiconductor film 82 covering a side surface of the oxide semiconductor film 83 and a side surface and a top surface of the oxide semiconductor film 81 are stacked over the gate insulating film 15 and the transistor 10m_4 in which the oxide semiconductor film 83a, the oxide semiconductor film 81a over the oxide semiconductor film 83a, and the oxide semiconductor film 84 covering a side surface of the oxide semiconductor film 83a and a side surface and a top surface of the oxide semiconductor film 81a are stacked over the gate insulating film 15.

Figure 12:
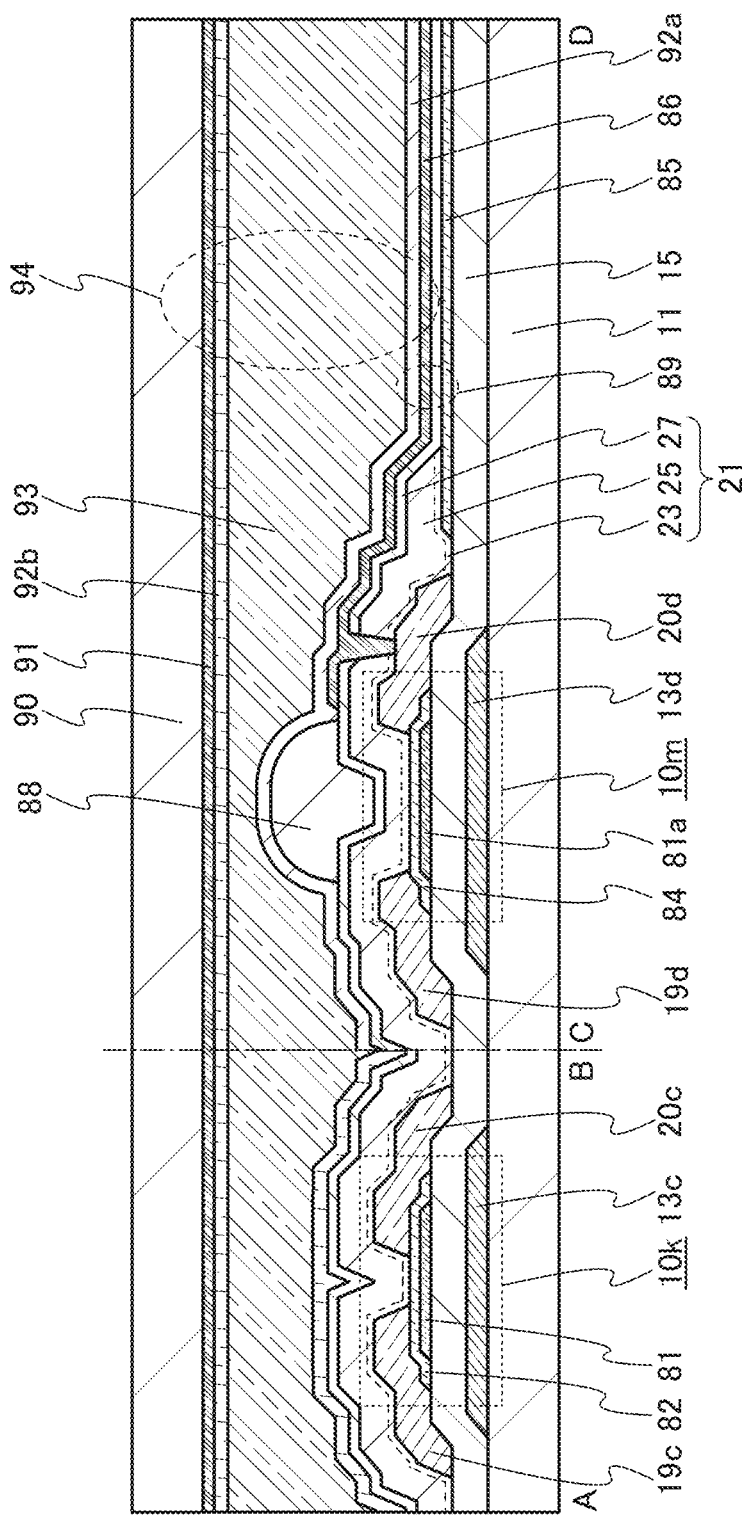
FIG. 12 is a cross-sectional view illustrating one embodiment of a liquid crystal display device.
Figure 13:
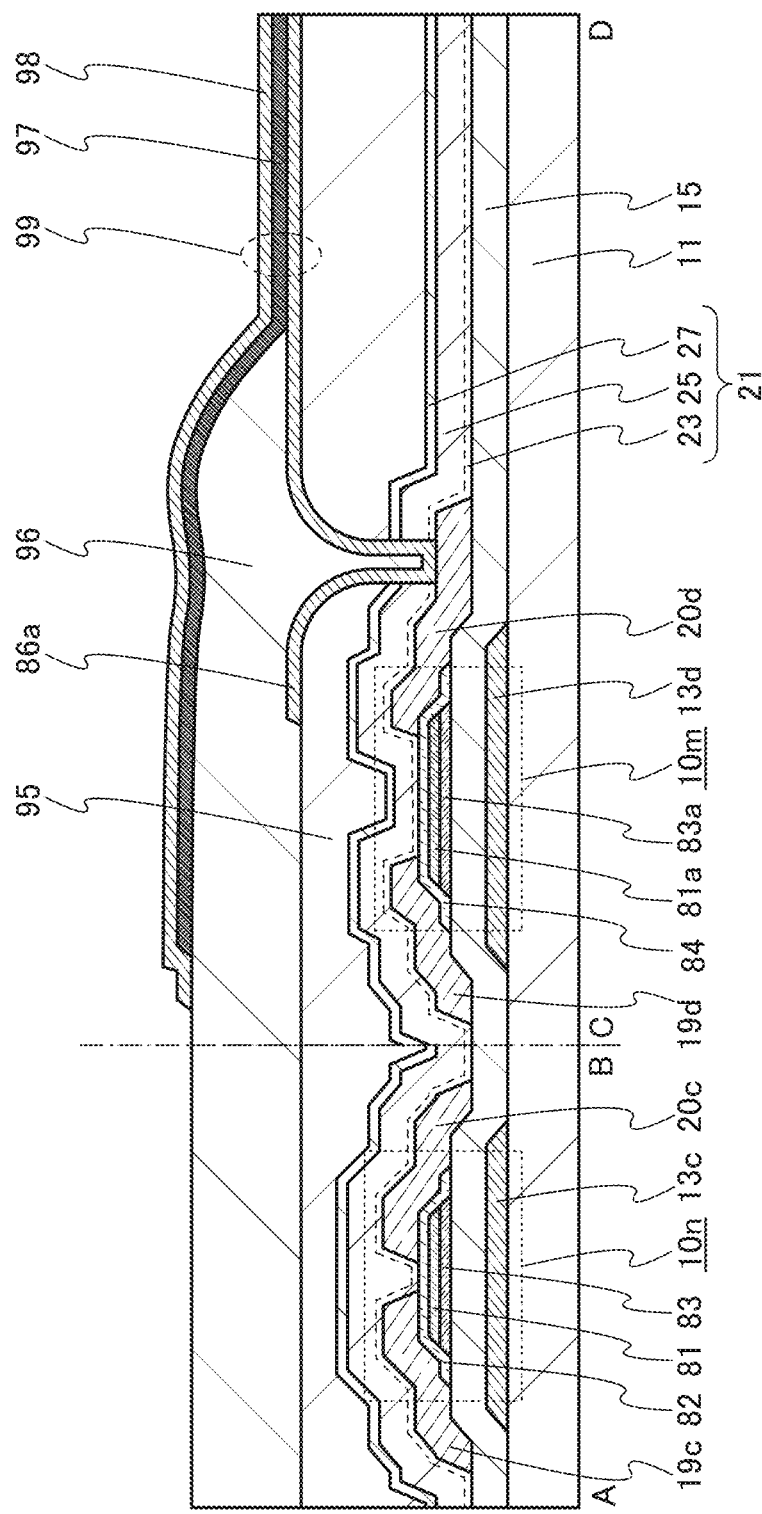
FIG. 13 is a cross-sectional view illustrating one embodiment of a light-emitting device.

Although FIG. 28 and FIG. 29 each illustrate the case where the conductive film 87 is provided, one embodiment of the present invention is not limited thereto. The conductive film 87 is not provided in some cases. FIG. 12 and FIG. 13 illustrate examples of such a case.

Figure 14:
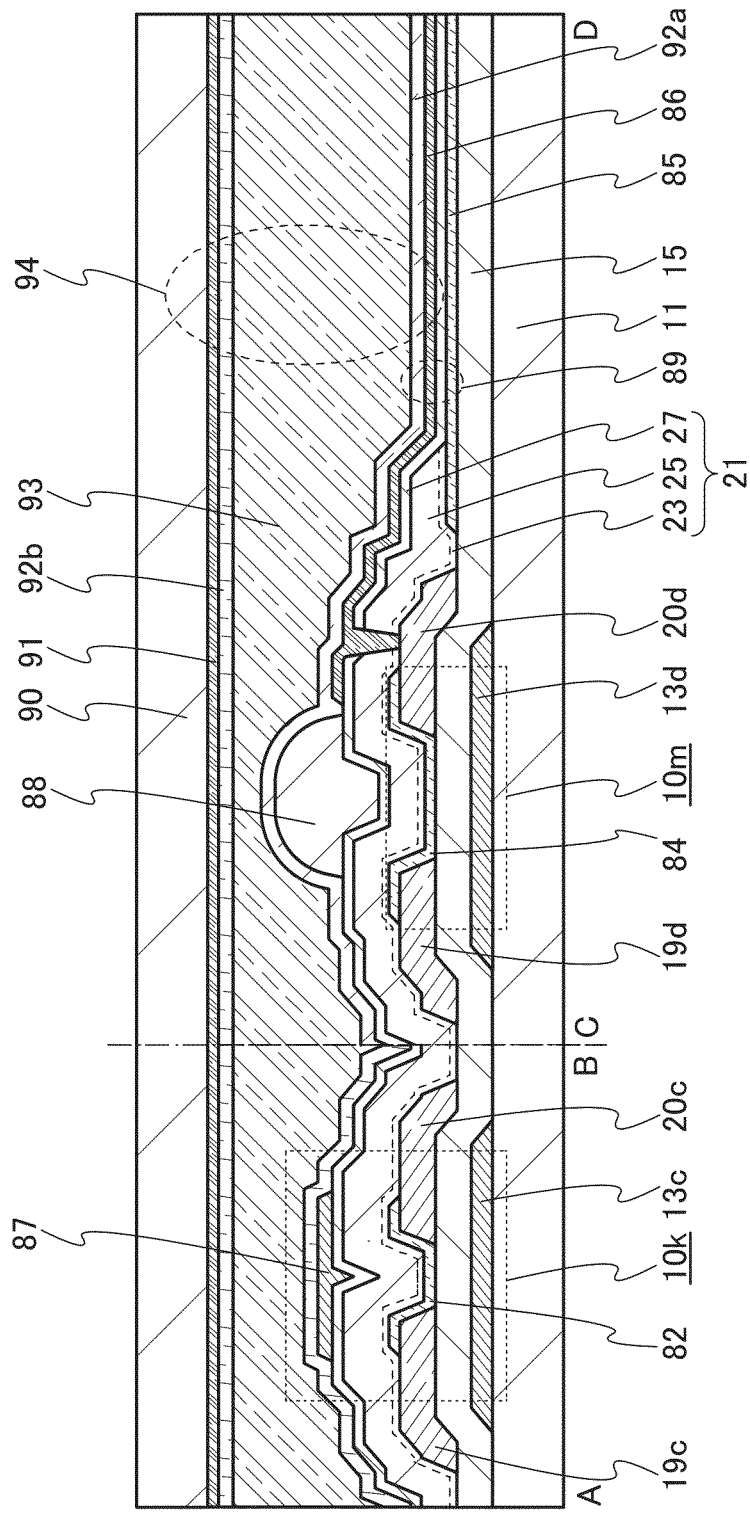
FIG. 14 is a cross-sectional view illustrating one embodiment of a liquid crystal display device.
Figure 15:
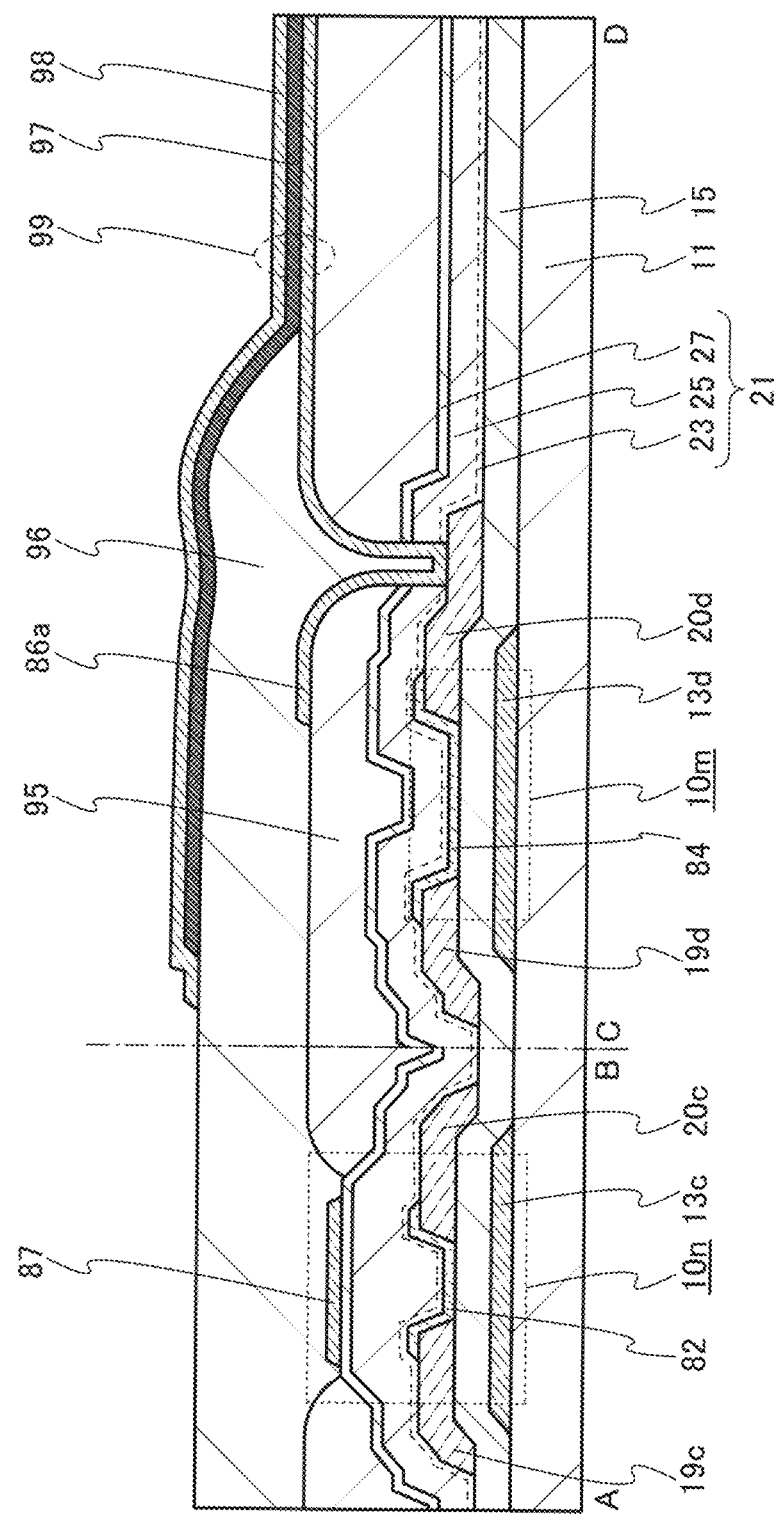
FIG. 15 is a cross-sectional view illustrating one embodiment of a light-emitting device.
Figure 16:
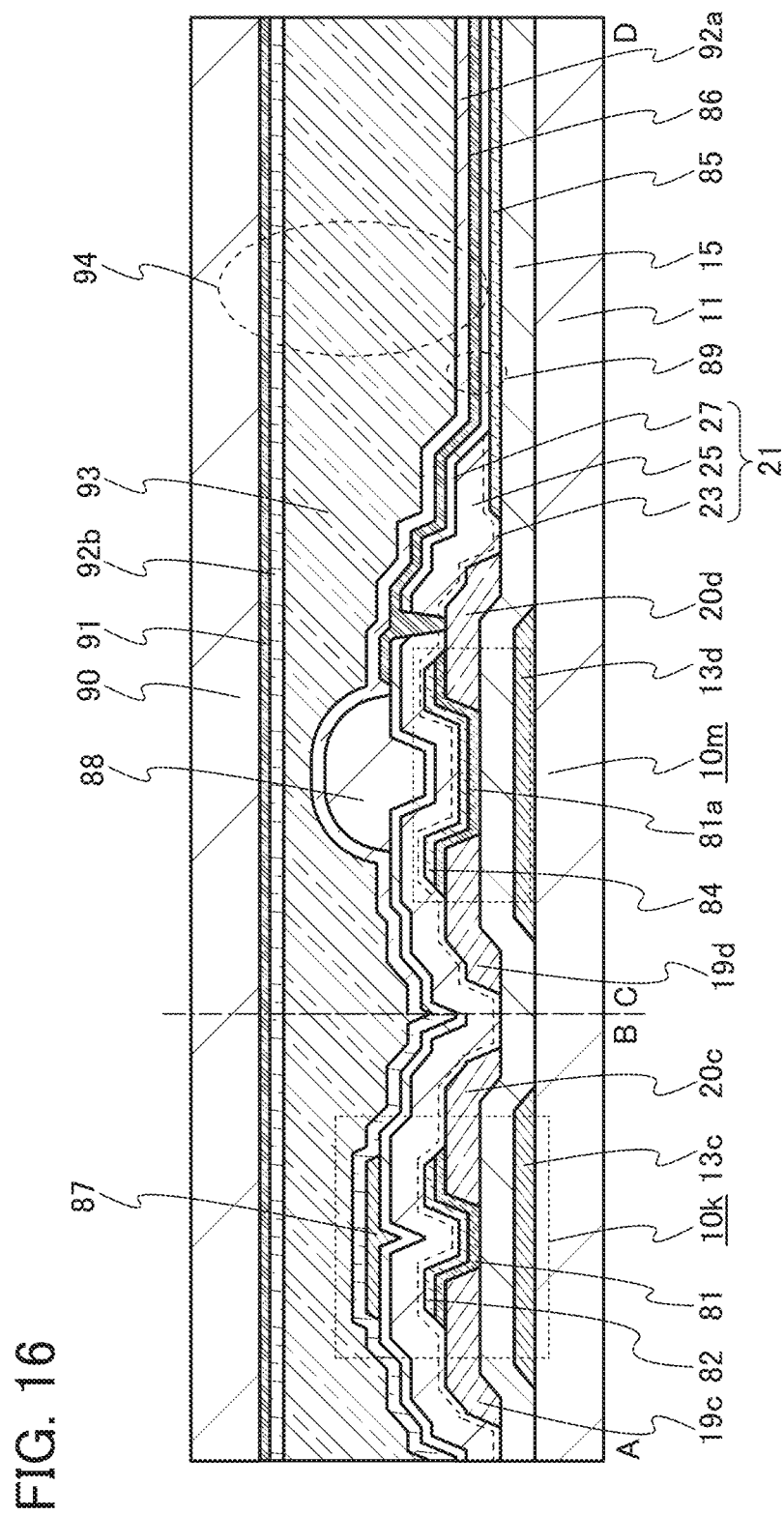
FIG. 16 is a cross-sectional view illustrating one embodiment of a liquid crystal display device.
Figure 17:
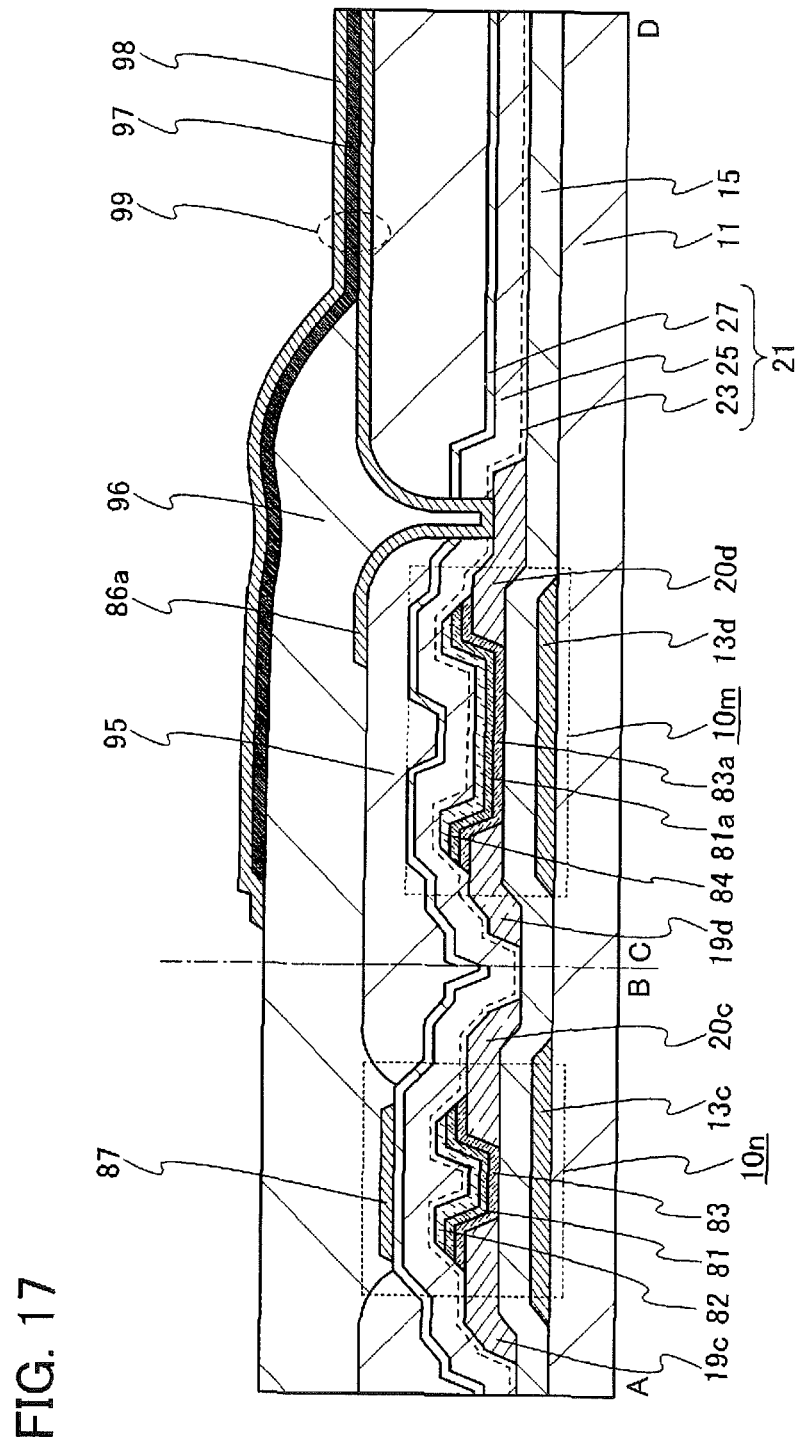
FIG. 17 is a cross-sectional view illustrating one embodiment of a light-emitting device.
Figure 18:
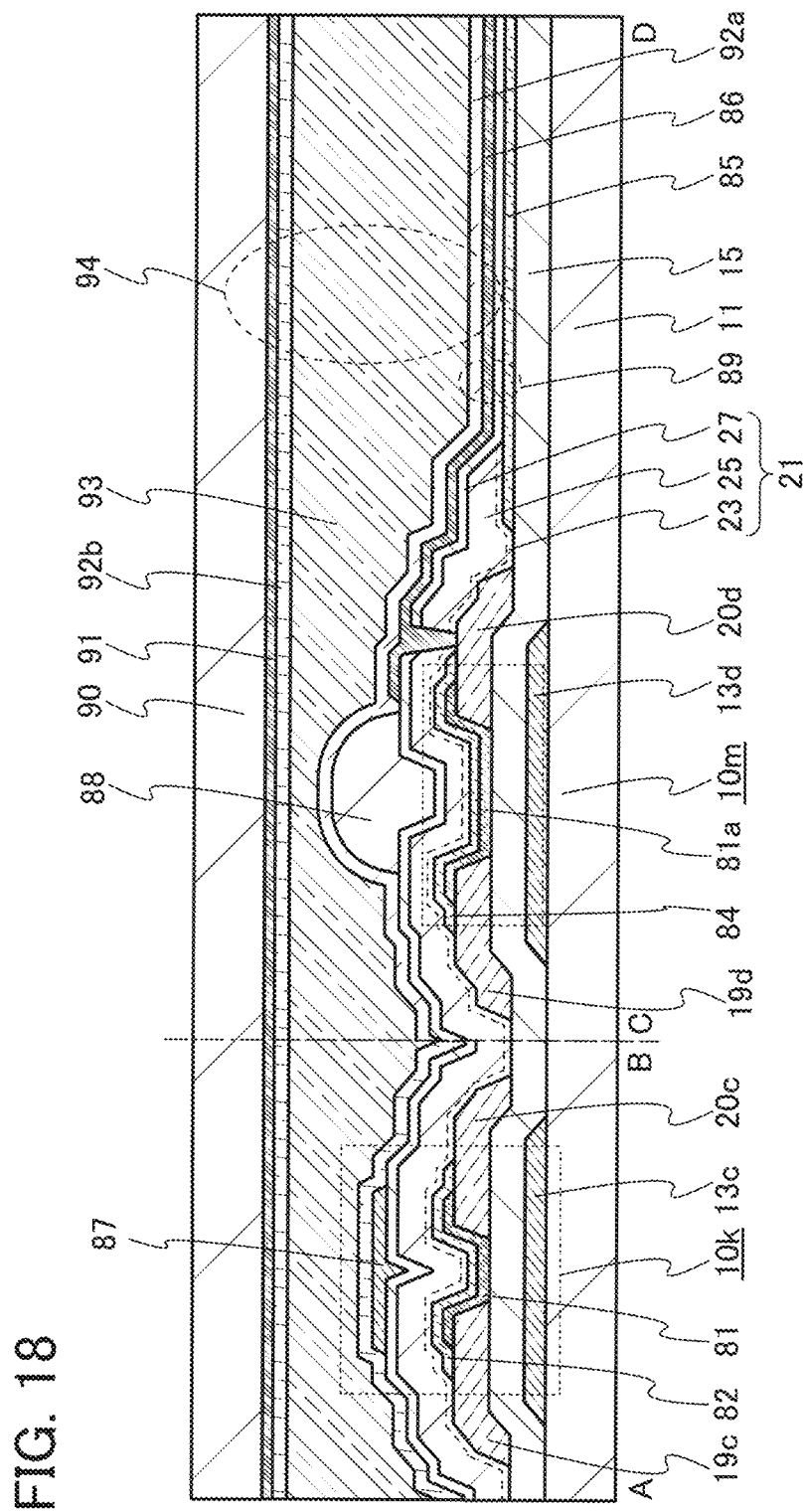
FIG. 18 is a cross-sectional view illustrating one embodiment of a liquid crystal display device.
Figure 19:
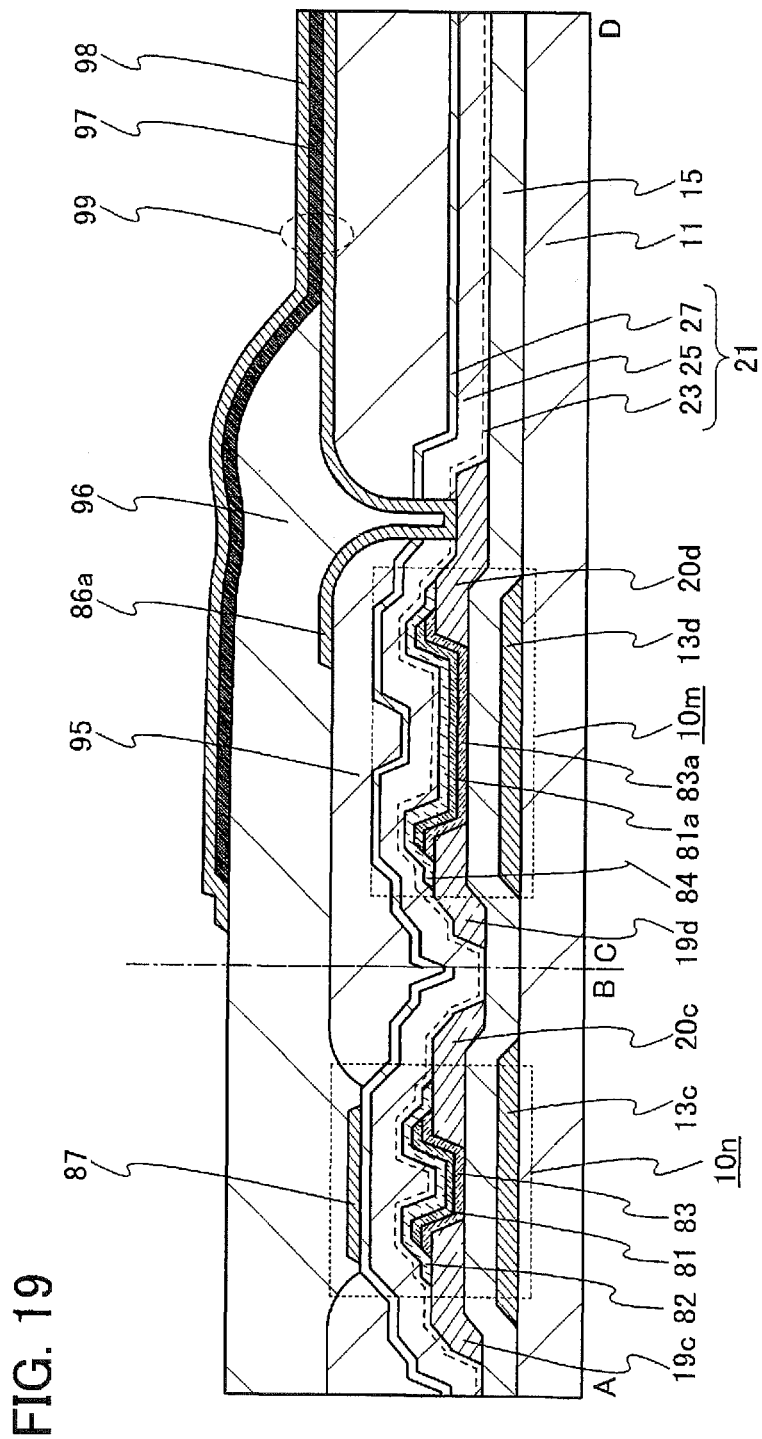
FIG. 19 is a cross-sectional view illustrating one embodiment of a light-emitting device.
Figure 20:
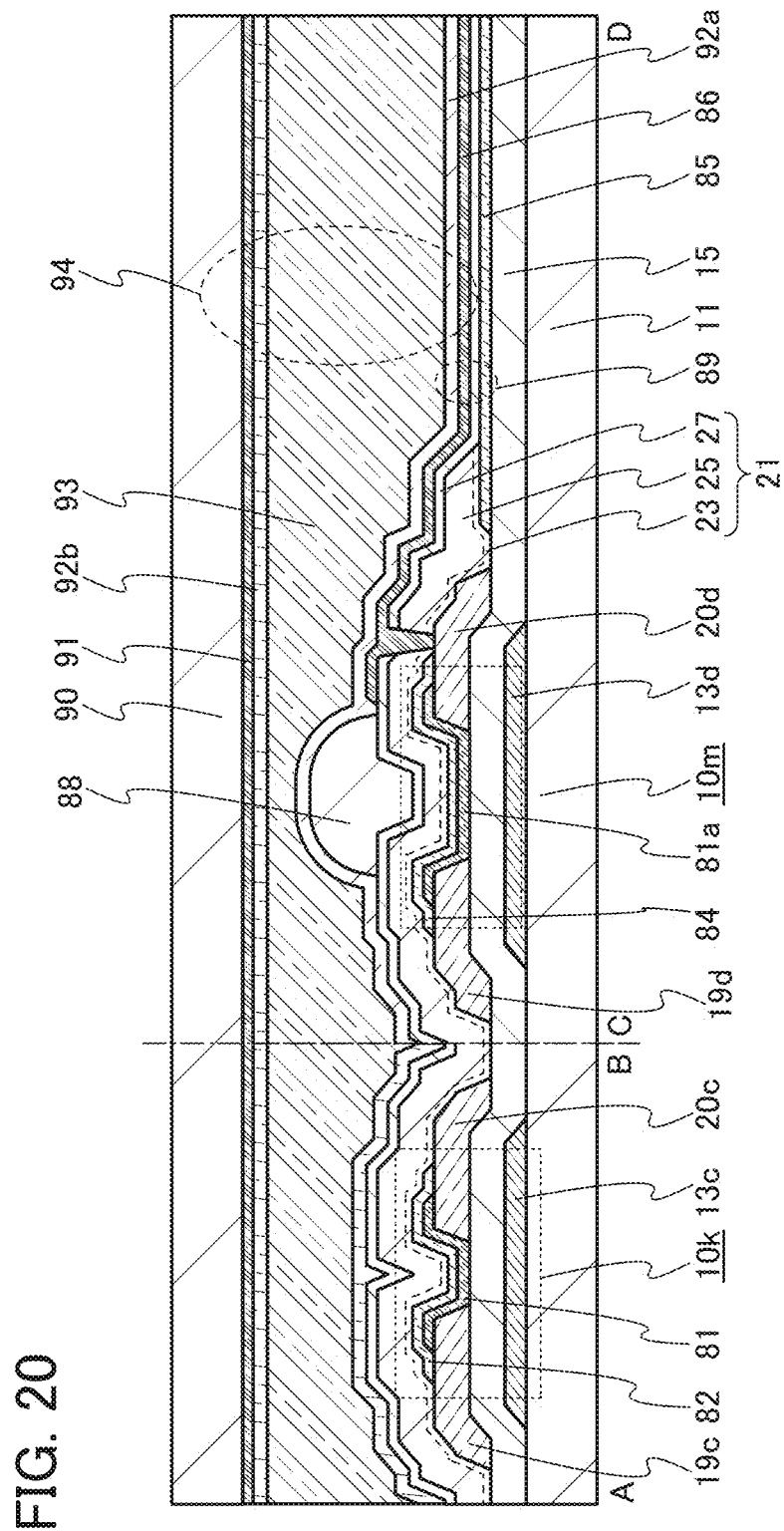
FIG. 20 is a cross-sectional view illustrating one embodiment of a liquid crystal display device.
Figure 21:
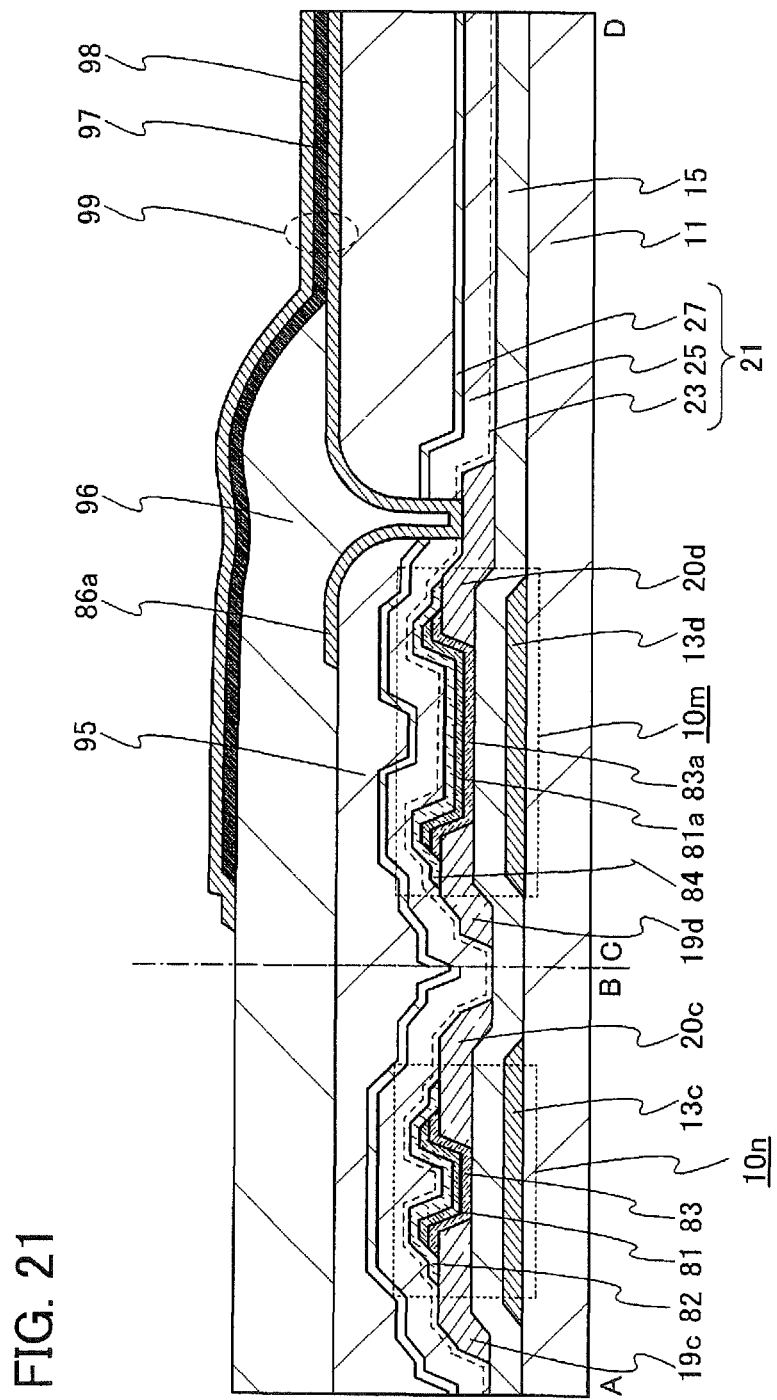
FIG. 21 is a cross-sectional view illustrating one embodiment of a light-emitting device.

Although the oxide semiconductor film 82, the oxide semiconductor film 84, and the like are provided below the electrodes 19c, 20c, 19d, and 20d and the like in FIG. 1, FIG. 2, and the like, one embodiment of the present invention is not limited thereto. The oxide semiconductor film 82, the oxide semiconductor film 84, and the like may be provided above the electrodes 19c, 20c, 19d, and 20d and the like. FIG. 14, FIG. 15, FIG. 16, FIG. 17, FIG. 18, and FIG. 19 illustrate examples of such a case. FIG. 14 shows an example of a liquid crystal display device including the transistor 10k in which the single layer of the oxide semiconductor film 82 is provided over the electrodes 19c and 20c, and FIG. 15 shows an example of a light-emitting device including a transistor 10n in which the single layer of the oxide semiconductor film 82 is provided over the electrodes 19c and 20c. FIG. 16 shows an example of a liquid crystal display device including the transistor 10k in which two oxide semiconductor films are provided over the electrodes 19c and 20c, and FIG. 17 shows an example of a light-emitting device including the transistor 10n in which three oxide semiconductor films are provided over the electrodes 19c and 20c. FIG. 18 shows an example of a liquid crystal display device including the transistor 10k in which two oxide semiconductor films are provided over the electrodes 19c and 20c, and FIG. 19 shows an example of a light-emitting device including the transistor 10n in which three oxide semiconductor films are provided over the electrodes 19c and 20c. Note that also in the structures shown in FIG. 18 and FIG. 19, the conductive film 87 can be omitted. FIG. 20 illustrates the structure of FIG. 18 without the conductive film 87, and FIG. 21 illustrates the structure of FIG. 19 without the conductive film 87.

<Variation 5>

Although FIG. 1 shows channel-etched transistors, channel-protective transistors can be used as appropriate.

<Variation 6>

Figure 22A:
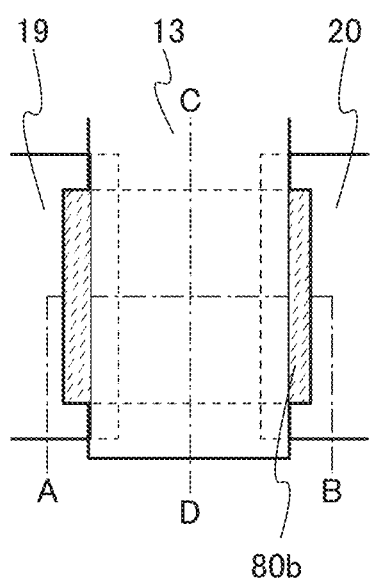
FIGS. 22A to 22C are a top view and cross-sectional views illustrating one embodiment of a transistor.
Figure 22C:
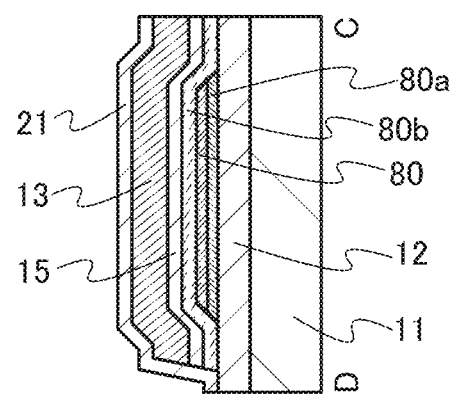
Figure 22B:
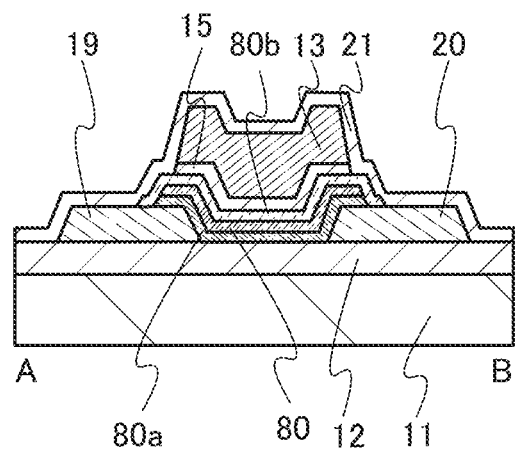

Although FIG. 1 shows bottom-gate transistors, transistors used for a pixel circuit and/or a driver circuit may have a top-gate bottom-contact structure as shown in FIGS. 22A to 22C. FIG. 22A is a top view of a transistor, and FIGS. 22B and 22C are cross-sectional views of the transistor. The cross-sectional view in the channel length direction along dashed-dotted line A-B in FIG. 22A and the cross-sectional view in the channel width direction along dashed-dotted line C-D in FIG. 22A are used to describe the structure of the transistor. A base insulating film 12 is formed over the substrate 11, and an electrode is formed over the base insulating film 12 and patterned to form an electrode 19 and an electrode 20. An oxide semiconductor film 80a and an oxide semiconductor film 80 are formed over the electrode 19 and the electrode 20. The oxide semiconductor film 80a and the oxide semiconductor film 80 are patterned, and then an oxide semiconductor film 80b is formed. The gate insulating film 15 is formed over the oxide semiconductor film 80b. Furthermore, a gate electrode 13 is formed and patterning is performed. Then, the protective film 21 is formed. In FIG. 22B, the oxide semiconductor film 80b is formed after the formation and patterning of the oxide semiconductor film 80a and the oxide semiconductor film 80; alternatively, patterning may be performed after formation of the oxide semiconductor film 80a, the oxide semiconductor film 80, and the oxide semiconductor film 80b. Furthermore, although the three-layer structure of the semiconductor films is formed in FIG. 22B, a two-layer structure or a single-layer semiconductor film may be used.

<Variation 7>

Figure 23A:
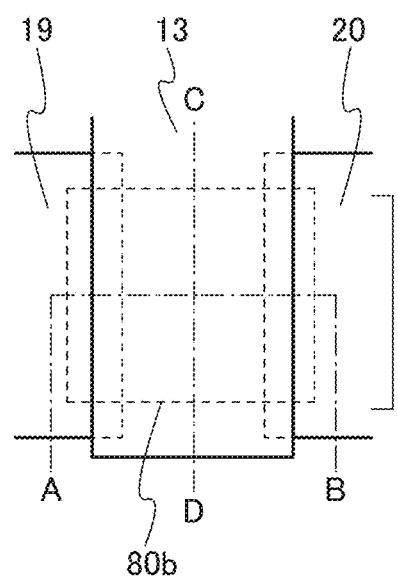
FIGS. 23A to 23C are a top view and cross-sectional views illustrating one embodiment of a transistor.
Figure 23C:
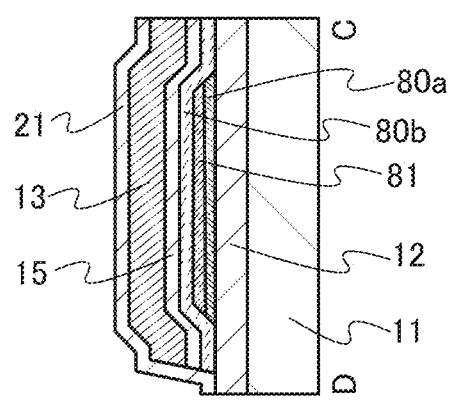
Figure 23B:
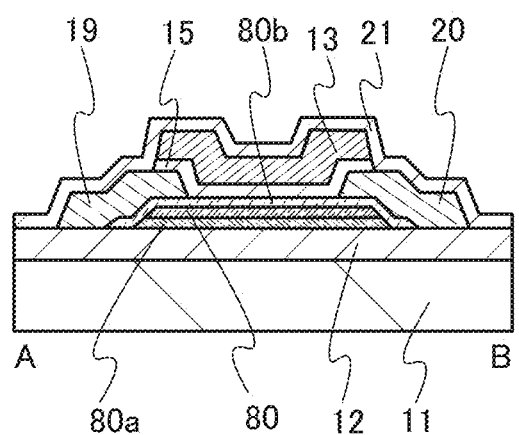

Although FIG. 1 shows bottom-gate transistors, transistors used for a pixel circuit and/or a driver circuit may have a top-gate top-contact structure as shown in FIGS. 23A to 23C. FIG. 23A is a top view of a transistor, and FIGS. 23B and 23C are cross-sectional views of the transistor. FIG. 23B showing a cross-section in the channel length direction along dashed-dotted line A-B in FIG. 23A and FIG. 23C showing a cross-section in the channel width direction along dashed-dotted line C-D in FIG. 23A are used to describe the structure of the transistor.

The base insulating film 12 is formed over the substrate 11, and the oxide semiconductor film 80a and the oxide semiconductor film 80 are formed over the base insulating film 12. The oxide semiconductor film 80a and the oxide semiconductor film 80 are patterned, and then the oxide semiconductor film 80b is formed. An electrode is formed over the oxide semiconductor film 80b and patterned to form the electrode 19 and the electrode 20. The gate insulating film 15 is formed over the electrode 19 and the electrode 20. Furthermore, the gate electrode 13 is formed and patterning is performed. Then, the protective film 21 is formed. In FIG. 23B, the oxide semiconductor film 80b is formed after the formation and patterning of the oxide semiconductor film 80a and the oxide semiconductor film 80; alternatively, patterning may be performed after formation of the oxide semiconductor film 80a, the oxide semiconductor film 80, and the oxide semiconductor film 80b. Furthermore, although the three-layer structure of the semiconductor films is formed in FIG. 23B, a two-layer structure or a single-layer semiconductor film may be used.

Note that the structures, methods, and the like described in this embodiment can be used as appropriate in combination with any of the structures, methods, and the like described in the other embodiments and examples.

Embodiment 2

In this embodiment, a structure example of a display device of one embodiment of the present invention is described.

<Structure Example>

Figure 6A:
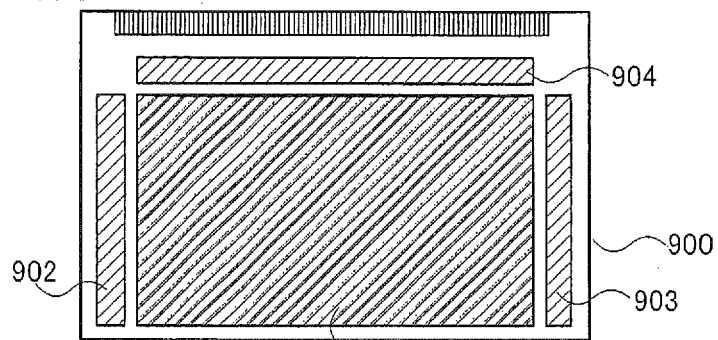
FIGS. 6A to 6C illustrate structures of display devices in one embodiment.
Figure 6B:
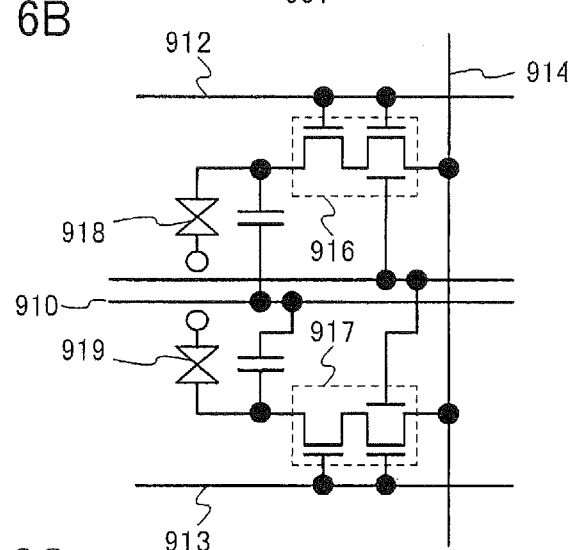
Figure 6C:
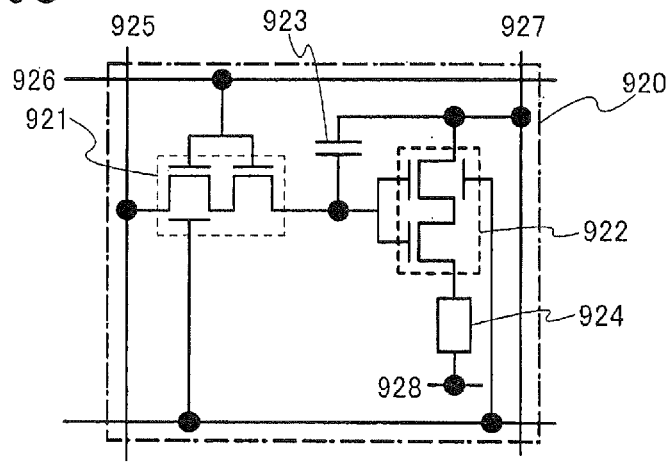

FIG. 6A is a top view of the display device of one embodiment of the present invention. FIG. 6B is a circuit diagram illustrating a pixel circuit that can be used in the case where a liquid crystal element is used in a pixel in the display device of one embodiment of the present invention. FIG. 6C is a circuit diagram illustrating a pixel circuit that can be used in the case where an organic EL element is used in a pixel in the display device of one embodiment of the present invention.

The transistor in the pixel portion can be formed in accordance with the above embodiment. Further, the transistor can be easily formed as an n-channel transistor, and thus, part of a driver circuit that can be formed using an n-channel transistor is formed over the same substrate as the transistor in the pixel portion. Thus, the pixel portion and the driver circuit are formed to have the structure described in Embodiment 1; consequently, a highly reliable display device can be provided. Furthermore, a display device being capable of high-speed operation and having a pixel portion that does not easily deteriorate due to light irradiation and provides high display quality can be provided.

FIG. 6A illustrates an example of a block diagram of an active matrix display device. A pixel portion 901, a first scan line driver circuit 902, a second scan line driver circuit 903, and a signal line driver circuit 904 are provided over a substrate 900 in the display device. In the pixel portion 901, a plurality of signal lines extended from the signal line driver circuit 904 are arranged, and a plurality of scan lines extended from the first scan line driver circuit 902 and the second scan line driver circuit 903 are arranged. Pixels each including a display element are provided in matrix in respective regions in each of which the scan line and the signal line intersect with each other. The substrate 900 of the display device is connected to a timing control circuit (also referred to as controller or control IC) through a connection portion such as a flexible printed circuit (FPC).

In FIG. 6A, the first scan line driver circuit 902, the second scan line driver circuit 903, and the signal line driver circuit 904 are formed over the same substrate 900 as the pixel portion 901. Accordingly, the number of components provided outside, such as a driver circuit, is reduced, so that a reduction in cost can be achieved. Further, if the driver circuit is provided outside the substrate 900, wirings would need to be extended and the number of wiring connections would increase. However, by providing the driver circuit over the substrate 900, the number of wiring connections can be reduced and the reliability or yield can be improved.

When the pixel portion and the driver circuit have the structure described in Embodiment 1, the first scan line driver circuit 902, the second scan line driver circuit 903, and the signal line driver circuit 904 can be formed using transistors with high field-effect mobility. Therefore, a demultiplexer circuit can be formed in the signal line driver circuit 904. A demultiplexer circuit distributes one input signal to a plurality of outputs; thus, using the demultiplexer circuit can reduce the number of input terminals for input signals. For example, when one pixel includes a red sub-pixel, a green sub-pixel, and a blue sub-pixel and a demultiplexer circuit corresponding to each pixel is provided, an input signal can be distributed by the demultiplexer circuit to be input to each sub-pixel. Consequently, the number of input terminals can be reduced to ⅓.

<Liquid Crystal Display Device>

FIG. 6B illustrates an example of a circuit configuration of the pixel. Here, a pixel circuit that can be used in a pixel of a VA liquid crystal display device is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 912 of a transistor 916 and a gate wiring 913 of a transistor 917 are separated so that different gate signals can be supplied thereto. In contrast, a source or drain electrode 914 functioning as a data line is shared by the transistors 916 and 917. Any of the transistors described in the above embodiment can be used as appropriate as each of the transistors 916 and 917. Thus, a highly reliable liquid crystal display device can be provided.

The shapes of a first pixel electrode electrically connected to the transistor 916 and a second pixel electrode electrically connected to the transistor 917 are described. The first pixel electrode and the second pixel electrode are separated by a slit. The first pixel electrode has a V shape and the second pixel electrode is provided so as to surround the first pixel electrode.

A gate electrode of the transistor 916 is connected to the gate wiring 912, and a gate electrode of the transistor 917 is connected to the gate wiring 913. When different gate signals are supplied to the gate wiring 912 and the gate wiring 913, operation timings of the transistor 916 and the transistor 917 can be varied. As a result, alignment of liquid crystals can be controlled.

Further, a storage capacitor may be formed using a capacitor wiring 910, a gate insulating film serving as a dielectric, and a capacitor electrode electrically connected to the first pixel electrode or the second pixel electrode.

The multi-domain pixel includes a first liquid crystal element 918 and a second liquid crystal element 919. The first liquid crystal element 918 includes the first pixel electrode, a counter electrode, and a liquid crystal layer therebetween. The second liquid crystal element 919 includes the second pixel electrode, a counter electrode, and a liquid crystal layer therebetween.

Note that a pixel circuit of the present invention is not limited to that shown in FIG. 6B. For example, a switch, a resistor, a capacitor, a transistor, a sensor, a logic circuit, or the like may be added to the pixel illustrated in FIG. 6B.

Although the VA liquid crystal display device is described here, any of the following modes may be employed as appropriate: a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, a transverse bend alignment (TBA) mode, and the like. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

<Light-Emitting Device>

FIG. 6C illustrates another example of a circuit configuration of the pixel. Here, a pixel structure of a display device using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 6C illustrates an applicable example of a pixel circuit. Here, an example in which an n-channel transistor is used in the pixel is shown. Further, digital time grayscale driving can be employed for the pixel circuit.

The configuration of the applicable pixel circuit and operation of a pixel employing digital time grayscale driving are described.

A pixel 920 includes a switching transistor 921, a driving transistor 922, a light-emitting element 924, and a capacitor 923. A gate electrode of the switching transistor 921 is connected to a scan line 926. A first electrode (one of a source electrode and a drain electrode) of the switching transistor 921 is connected to a signal line 925. A second electrode (the other of the source electrode and the drain electrode) of the switching transistor 921 is connected to a gate electrode of the driving transistor 922. The gate electrode of the driving transistor 922 is connected to a power supply line 927 through the capacitor 923, a first electrode of the driving transistor 922 is connected to the power supply line 927, and a second electrode of the driving transistor 922 is connected to a first electrode (pixel electrode) of the light-emitting element 924. A second electrode of the light-emitting element 924 corresponds to a common electrode 928. The common electrode 928 is electrically connected to a common potential line formed over the same substrate as the common electrode 928.

As the switching transistor 921 and the driving transistor 922, any of the transistors described in the above embodiment can be used as appropriate. In this manner, a highly reliable organic EL display device can be provided.

The potential of the second electrode (the common electrode 928) of the light-emitting element 924 is set to be a low power supply potential. Note that the low power supply potential is lower than a high power supply potential supplied to the power supply line 927. For example, the low power supply potential can be GND, 0 V, or the like. The high power supply potential and the low power supply potential are set to be higher than or equal to the forward threshold voltage of the light-emitting element 924, and the difference between the potentials is applied to the light-emitting element 924, whereby current is supplied to the light-emitting element 924, leading to light emission. The forward voltage of the light-emitting element 924 refers to a voltage at which a desired luminance is obtained, and includes at least a forward threshold voltage.

Note that gate capacitance of the driving transistor 922 may be used as a substitute for the capacitor 923, so that the capacitor 923 can be omitted. The gate capacitance of the driving transistor 922 may be formed between the semiconductor film and the gate electrode.

Next, a signal input to the driving transistor 922 is described. In the case of a voltage-input voltage driving method, a video signal for sufficiently turning on or off the driving transistor 922 is input to the driving transistor 922. In order for the driving transistor 922 to operate in a linear region, voltage higher than the voltage of the power supply line 927 is applied to the gate electrode of the driving transistor 922. Voltage higher than or equal to voltage that is the sum of power supply line voltage and the threshold voltage $V_{th}$ of the driving transistor 922 is applied to the signal line 925.

In the case where analog grayscale driving is performed, voltage higher than or equal to voltage that is the sum of the forward voltage of the light-emitting element 924 and the threshold voltage $V_{th}$ of the driving transistor 922 is applied to the gate electrode of the driving transistor 922. A video signal by which the driving transistor 922 is operated in a saturation region is input, so that current is supplied to the light-emitting element 924. In order for the driving transistor 922 to operate in a saturation region, the potential of the power supply line 927 is set higher than the gate potential of the driving transistor 922. When an analog video signal is used, current corresponding to the video signal can be supplied to the light-emitting element 924 and analog grayscale driving can be performed.

Note that the configuration of the pixel circuit is not limited to that shown in FIG. 6C. For example, a switch, a resistor, a capacitor, a sensor, a transistor, a logic circuit, or the like may be added to the pixel circuit illustrated in FIG. 6C.

In the case where any of the transistors described in the above embodiment is used for the circuit shown in FIGS. 6B and 6C, the source electrode (the first electrode) is electrically connected to the low potential side and the drain electrode (the second electrode) is electrically connected to the high potential side. Further, the potential of the first gate electrode (and the third gate electrode) may be controlled by a control circuit or the like, and a potential lower than the potential applied to the source electrode may be input to the second gate electrode through a wiring that is not illustrated.

This embodiment can be combined with any of the other embodiments disclosed in this specification as appropriate.

Embodiment 3

In this embodiment, one embodiment that can be applied to the oxide semiconductor film in any of the transistors included in the semiconductor device described in Embodiment 1 is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed using a CAAC-OS film. Furthermore, the oxide semiconductor film may include an amorphous oxide semiconductor and an oxide semiconductor having a crystal grain. Described below are the CAAC-OS and the microcrystalline oxide semiconductor.

First, a CAAC-OS film is described. Note that a CAAC-OS can be referred to as an oxide semiconductor including c-axis aligned nanocrystals (CANC).

A CAAC-OS film is one of oxide semiconductor films having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 7A:
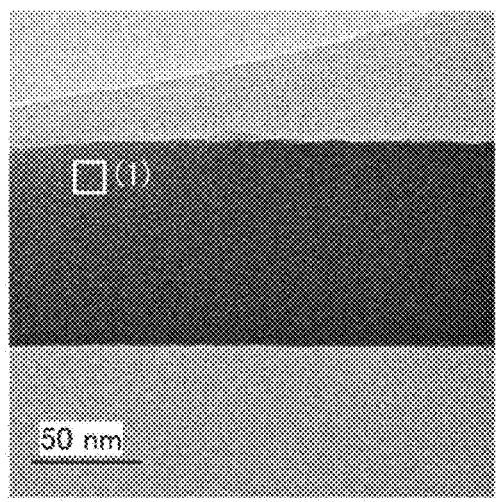
FIGS. 7A to 7D are Cs-corrected high-resolution TEM images of a cross section of a CAAC-OS and a cross-sectional schematic view of a CAAC-OS.

A CAAC-OS observed with TEM is described below. FIG. 7A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 7B:
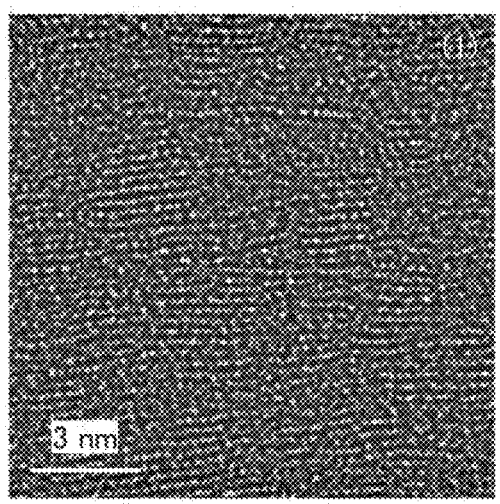

FIG. 7B is an enlarged Cs-corrected high-resolution TEM image of a region (1) in FIG. 7A. FIG. 7B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 7C:
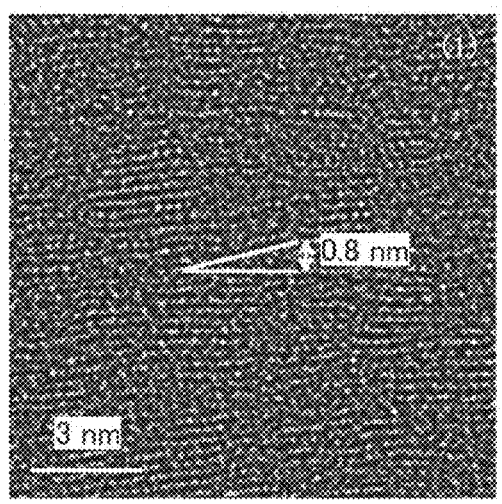

As shown in FIG. 7B, the CAAC-OS has a characteristic atomic arrangement. The characteristic atomic arrangement is denoted by an auxiliary line in FIG. 7C. FIGS. 7B and 7C prove that the size of a pellet is approximately 1 nm to 3 nm, and the size of a space caused by tilt of the pellets is approximately 0.8 nm. Therefore, the pellet can also be referred to as a nanocrystal (nc).

Figure 7D:
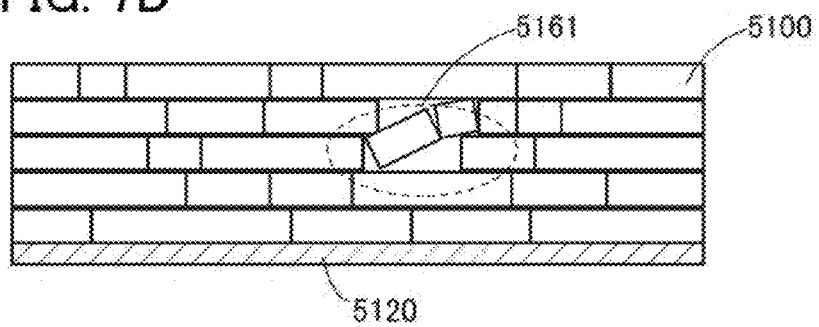

Here, according to the Cs-corrected high-resolution TEM images, the schematic arrangement of pellets 5100 of a CAAC-OS over a substrate 5120 is illustrated by such a structure in which bricks or blocks are stacked (see FIG. 7D). The part in which the pellets are tilted as observed in FIG. 7C corresponds to a region 5161 shown in FIG. 7D.

FIG. 30A shows a Cs-corrected high-resolution TEM image of a plane of the CAAC-OS observed from a direction substantially perpendicular to the sample surface. FIGS. 30B, 30C, and 30D are enlarged Cs-corrected high-resolution TEM images of regions (1), (2), and (3) in FIG. 30A, respectively. FIGS. 30B, 30C, and 30D indicate that metal atoms are arranged in a triangular, quadrangular, or hexagonal configuration in a pellet. However, there is no regularity of arrangement of metal atoms between different pellets.

Figure 31A:
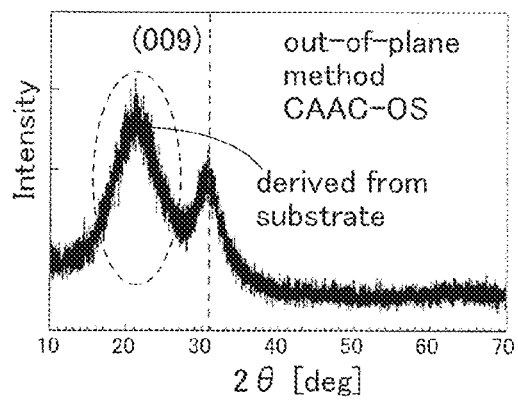
FIGS. 31A to 31C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 31A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 31B:
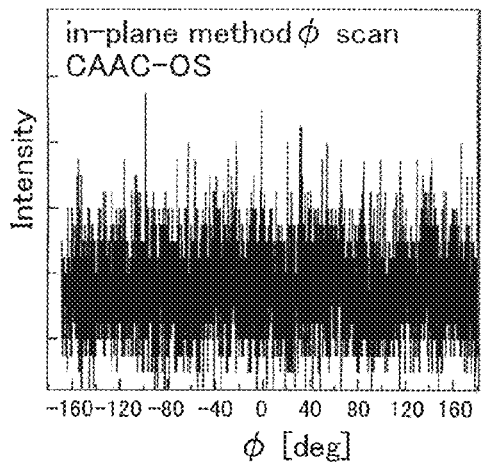
Figure 31C:
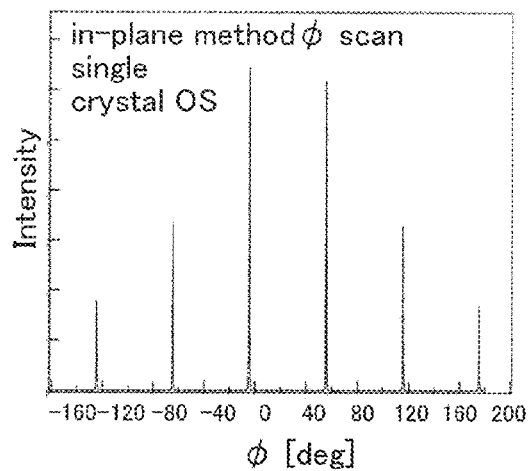

On the other hand, in structural analysis of the CAAC-OS by an in-plane method in which an X-ray is incident on a sample in a direction substantially perpendicular to the c-axis, a peak appears when $2\theta$ is around 56°. This peak is derived from the (110) plane of the $InGaZnO_4$ crystal. In the case of the CAAC-OS, when analysis ($\phi$ scan) is performed with $2\theta$ fixed at around 56° and with the sample rotated using a normal vector of the sample surface as an axis ($\phi$ axis), as shown in FIG. 31B, a peak is not clearly observed. In contrast, in the case of a single crystal oxide semiconductor of $InGaZnO_4$, when $\phi$ scan is performed with $2\theta$ fixed at around 56°, as shown in FIG. 31C, six peaks which are derived from crystal planes equivalent to the (110) plane are observed. Accordingly, the structural analysis using XRD shows that the directions of a-axes and b-axes are different in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 32A might be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 32B shows a diffraction pattern obtained in such a manner that an electron beam with a probe diameter of 300 nm is incident on the same sample in a direction perpendicular to the sample surface. As shown in FIG. 32B, a ring-like diffraction pattern is observed. Thus, the electron diffraction also indicates that the a-axes and b-axes of the pellets included in the CAAC-OS do not have regular alignment. The first ring in FIG. 32B is considered to be derived from the (010) plane, the (100) plane, and the like of the $InGaZnO_4$ crystal. The second ring in FIG. 32B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

Next, a microcrystalline oxide semiconductor film is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 33:
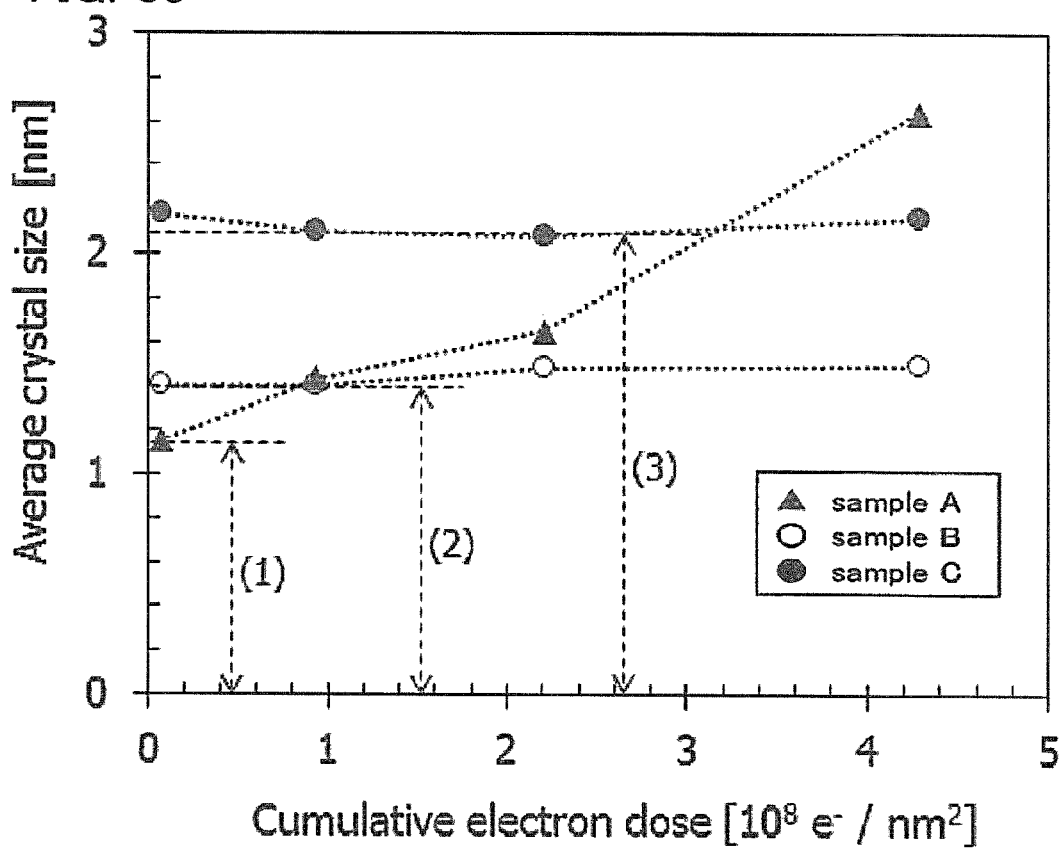
FIG. 33 shows a change in crystal part of an In—Ga—Zn oxide induced by electron irradiation.

FIG. 33 shows change in the average size of crystal parts (at 22 points to 45 points) in each sample. Note that the crystal part size corresponds to the length of a lattice fringe. FIG. 33 indicates that the crystal part size in the a-like OS increases with an increase in the cumulative electron dose. Specifically, as shown by (1) in FIG. 33, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 33, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

In the case where an oxide semiconductor film has a plurality of structures, the structures can be analyzed using nanobeam electron diffraction in some cases.

Figure 8A:
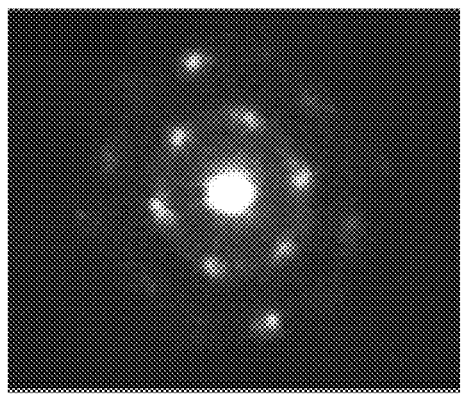
FIGS. 8A and 8B show nanobeam electron diffraction patterns of oxide semiconductor films and FIGS. 8C and 8D illustrate an example of a transmission electron diffraction measurement apparatus.
Figure 8B:
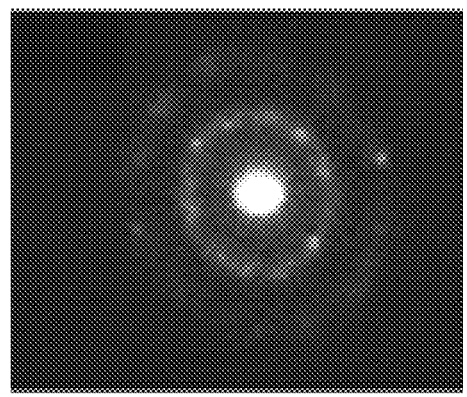
Figure 8C:
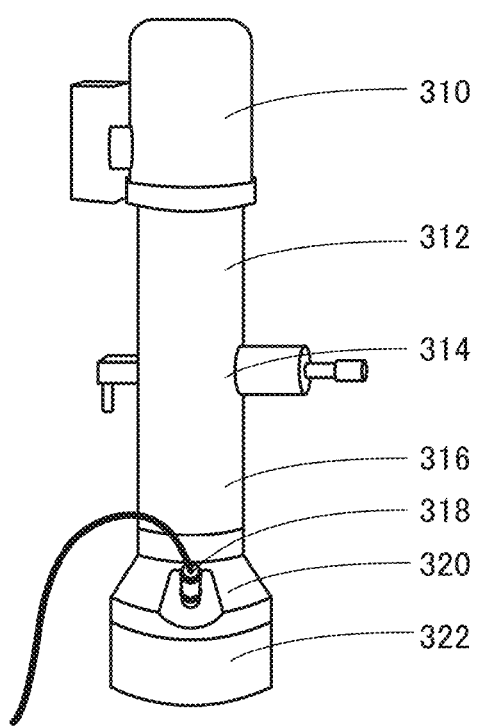

FIG. 8C illustrates a transmission electron diffraction measurement apparatus which includes an electron gun chamber 310, an optical system 312 below the electron gun chamber 310, a sample chamber 314 below the optical system 312, an optical system 316 below the sample chamber 314, an observation chamber 320 below the optical system 316, a camera 318 installed in the observation chamber 320, and a film chamber 322 below the observation chamber 320. The camera 318 is provided to face toward the inside of the observation chamber 320. Note that the film chamber 322 is not necessarily provided.

Figure 8D:
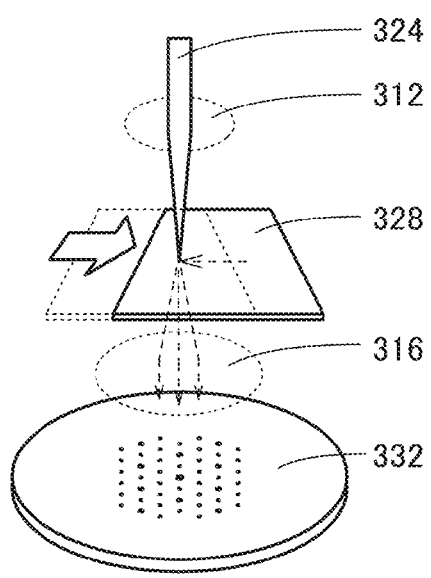

FIG. 8D illustrates an internal structure of the transmission electron diffraction measurement apparatus illustrated in FIG. 8C. In the transmission electron diffraction measurement apparatus, a substance 328 which is positioned in the sample chamber 314 is irradiated with electrons emitted from an electron gun installed in the electron gun chamber 310 through the optical system 312. Electrons passing through the substance 328 enter a fluorescent plate 332 provided in the observation chamber 320 through the optical system 316. On the fluorescent plate 332, a pattern corresponding to the intensity of the incident electron appears, which allows measurement of a transmission electron diffraction pattern.

The camera 318 is installed so as to face the fluorescent plate 332 and can take a picture of a pattern appearing in the fluorescent plate 332. An angle formed by a straight line which passes through the center of a lens of the camera 318 and the center of the fluorescent plate 332 and an upper surface of the fluorescent plate 332 is, for example, 15° or more and 80° or less, 30° or more and 75° or less, or 45° or more and 70° or less. As the angle is reduced, distortion of the transmission electron diffraction pattern taken by the camera 318 becomes larger. Note that if the angle is obtained in advance, the distortion of an obtained transmission electron diffraction pattern can be corrected. Note that the film chamber 322 may be provided with the camera 318. For example, the camera 318 may be set in the film chamber 322 so as to be opposite to the incident direction of electrons 324.

In this case, a transmission electron diffraction pattern with less distortion can be taken from the rear surface of the fluorescent plate 332.

A holder for fixing the substance 328 that is a sample is provided in the sample chamber 314. The holder transmits electrons passing through the substance 328. The holder may have, for example, a function of moving the substance 328 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 328.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 324 that are a nanobeam in the substance, as illustrated in FIG. 8D. At this time, when the substance 328 is a CAAC-OS film, a diffraction pattern shown in FIG. 8A is observed. When the substance 328 is an nc-OS film, a diffraction pattern shown in FIG. 8B is observed.

Even when the substance 328 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 9A:
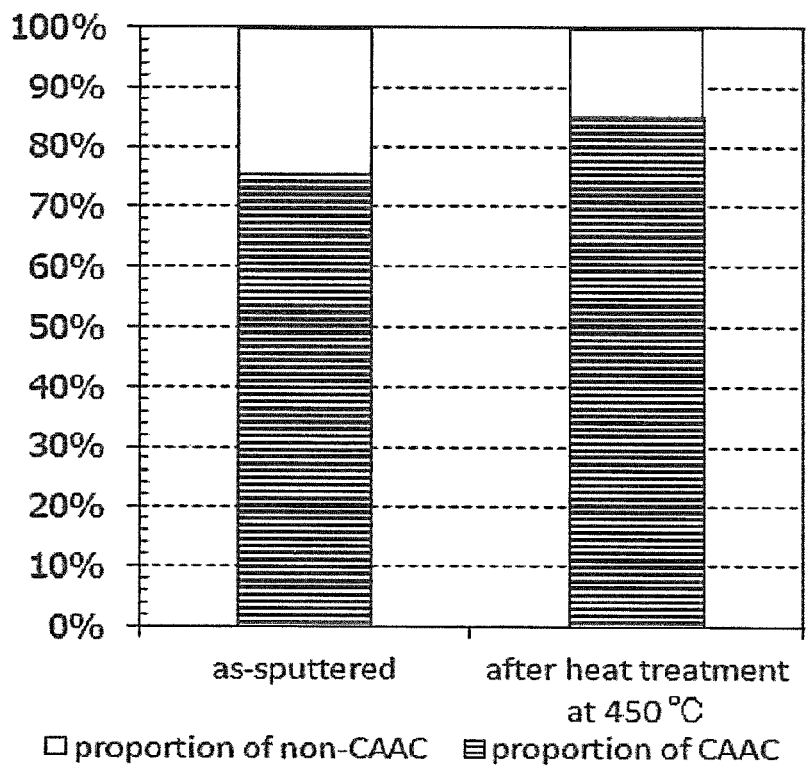
FIG. 9A shows an example of structural analysis by transmission electron diffraction measurement and FIGS. 9B and 9C show plan-view TEM images.

FIG. 9A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at high temperatures (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 9B:
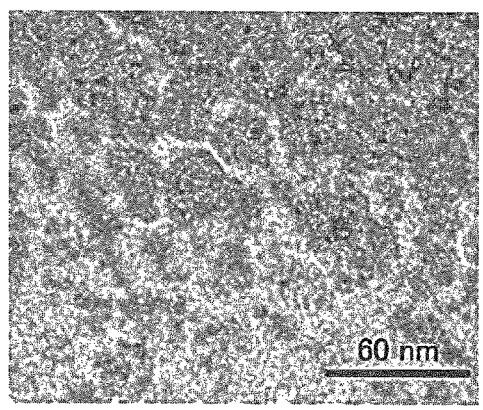
Figure 9C:
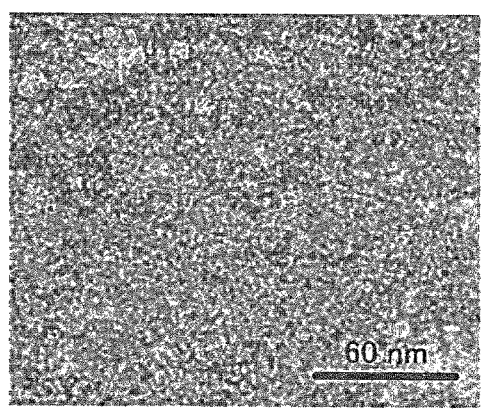

FIGS. 9B and 9C are plan-view TEM images of the CAAC-OS film obtained just after the deposition and the CAAC-OS film subjected to the heat treatment at 450° C., respectively. Comparison between FIGS. 9B and 9C shows that the CAAC-OS film subjected to the heat treatment at 450° C. has more uniform film quality. That is, the heat treatment at high temperatures improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments and examples.

Embodiment 4

In this embodiment, a display module and electronic devices that can be formed using a semiconductor device of one embodiment of the present invention are described.

Figure 10:
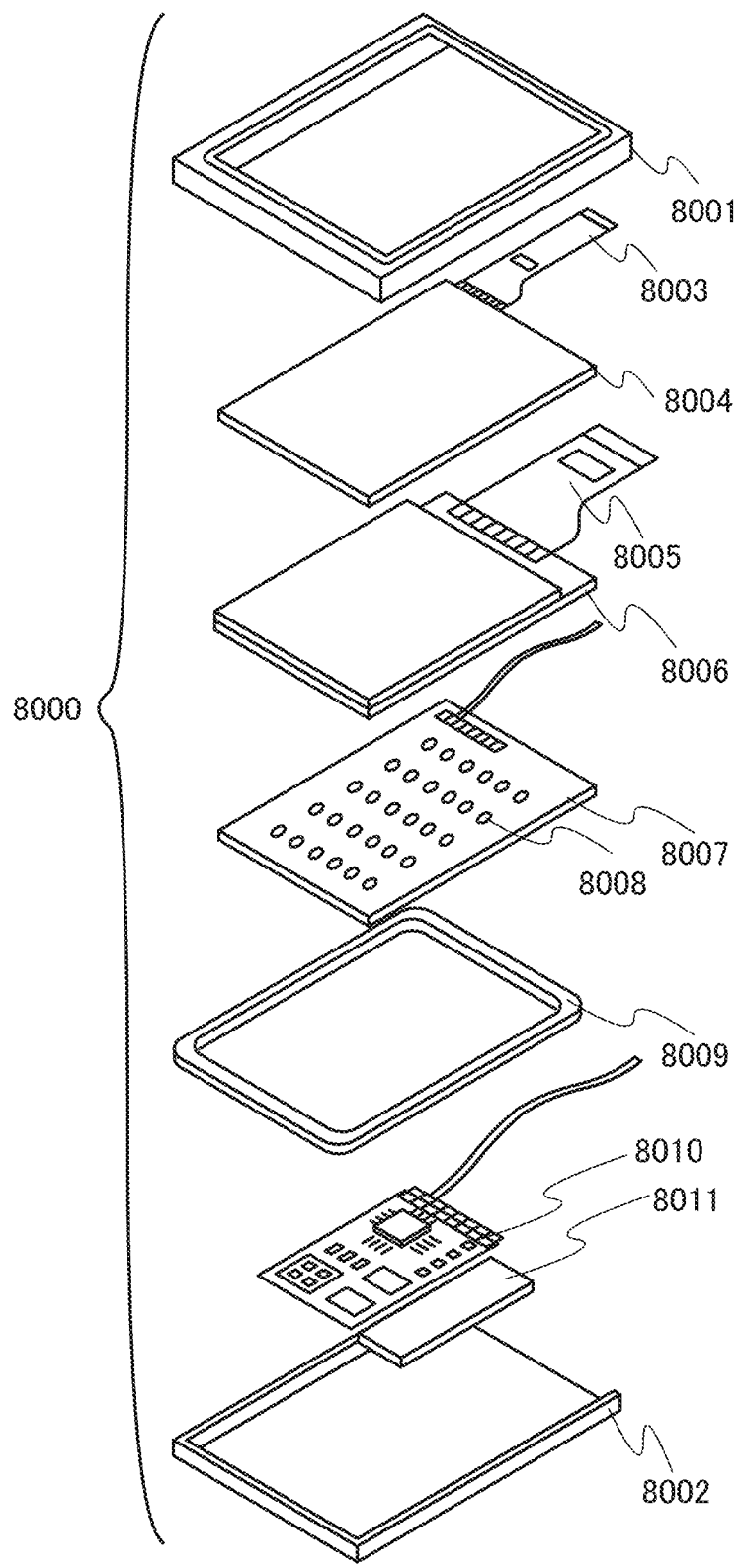
FIG. 10 illustrates a display module.

In a display module 8000 illustrated in FIG. 10, a touch panel 8004 connected to an FPC 8003, a display device cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for, for example, the display device cell 8006.

The shapes and sizes of the upper cover 8001 and the lower cover 8002 can be changed as appropriate in accordance with the sizes of the touch panel 8004 and the display device cell 8006.

The touch panel 8004 can be a resistive touch panel or a capacitive touch panel and can be formed to overlap with the display device cell 8006. A counter substrate (sealing substrate) of the display device cell 8006 can have a touch panel function. A photosensor may be provided in each pixel of the display device cell 8006 to form an optical touch panel. An electrode for a touch sensor may be provided in each pixel of the display device cell 8006 to form a capacitive touch panel.

The backlight unit 8007 includes a light source 8008. The light source 8008 may be provided at an end portion of the backlight unit 8007 and a light diffusing plate may be used.

The frame 8009 protects the display device cell 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 11A to 11D are external views of electronic devices each including the semiconductor device of one embodiment of the present invention.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 11A:
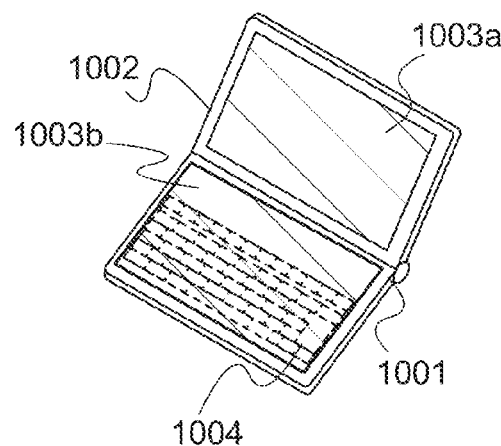
FIGS. 11A to 11D are each an external view of an electronic device in one embodiment.

FIG. 11A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal display device or an organic light-emitting panel is fabricated using any of the transistors described in the above embodiment as a switching element and used in the display portion 1003a or 1003b, whereby a highly reliable portable information terminal can be provided.

The portable information terminal illustrated in FIG. 11A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 11A may transmit and receive data wirelessly. Through wireless communication, desired book data or the like can be purchased and downloaded from an e-book server.

Figure 11B:
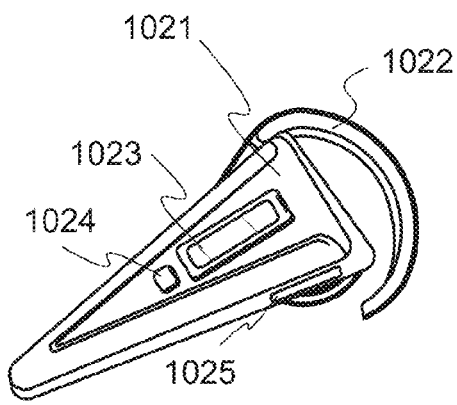

FIG. 11B illustrates a portable music player including, in a main body 1021, a display portion 1023, a fixing portion 1022 with which the portable music player can be worn on the ear, a speaker, an operation button 1024, an external memory slot 1025, and the like. A liquid crystal display device or an organic light-emitting panel is fabricated using any of the transistors described in the above embodiment as a switching element, and used in the display portion 1023, whereby a highly reliable portable music player can be provided.

Furthermore, when the portable music player illustrated in FIG. 11B has an antenna, a microphone function, or a wireless communication function and is used with a mobile phone, a user can talk on the phone wirelessly in a hands-free way while driving a car or the like.

Figure 11C:
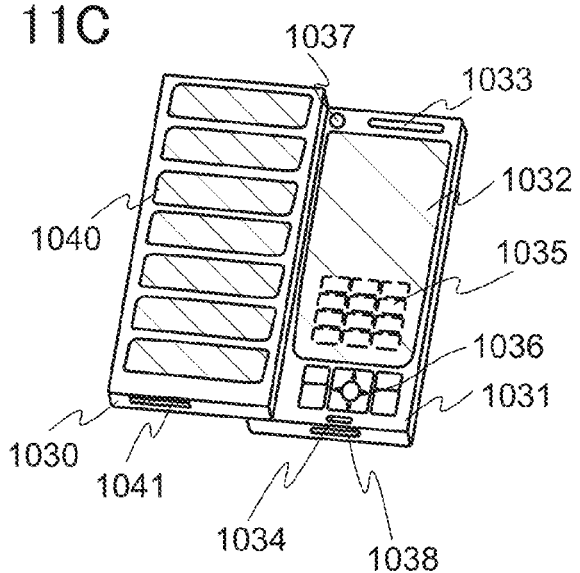

FIG. 11C illustrates a mobile phone that includes two housings, a housing 1030 and a housing 1031. The housing 1031 includes a display device 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiment is used in the display device 1032, whereby a highly reliable mobile phone can be provided.

Further, the display device 1032 includes a touch panel. A plurality of operation keys 1035 that are displayed as images are indicated by dotted lines in FIG. 11C. Note that a boosting circuit by which a voltage output from the solar cell 1040 is increased to be sufficiently high for each circuit is also included.

In the display device 1032, the direction of display is changed as appropriate depending on the application mode. Further, the mobile phone is provided with the camera lens 1037 on the same surface as the display device 1032, and thus it can be used as a video phone. The speaker 1033 and the microphone 1034 can be used for videophone calls, recording, and playing sound, etc. as well as voice calls. Moreover, the housings 1030 and 1031 in a state where they are opened as illustrated in FIG. 11C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 11D:
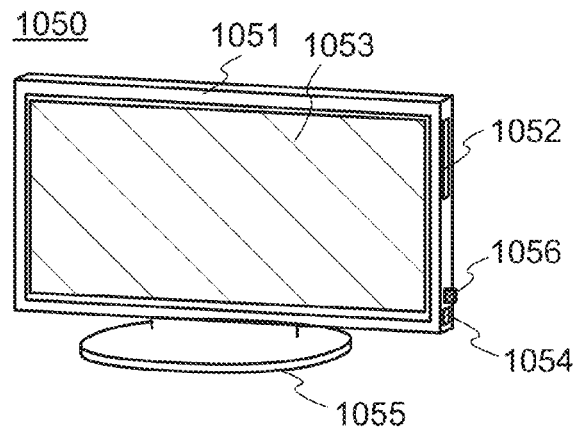

FIG. 11D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiment is used in the display portion 1053 and the CPU, whereby the television set 1050 can have high reliability.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in the above embodiment is extremely small, when the transistor is used in the external memory 1056 or the CPU, the television set 1050 can have high reliability and sufficiently reduced power consumption.

This embodiment can be combined with any of the other embodiments disclosed in this specification as appropriate.

Embodiment 5

In this embodiment, a liquid crystal display device and a light-emitting device are described as examples of a semiconductor device, with reference to FIG. 34, FIG. 35, FIGS. 36A to 36C, FIGS. 37A and 37B, and FIGS. 38A and 38B. In this embodiment, in the liquid crystal display device or the light-emitting device, a first transistor and a second transistor including different numbers of oxide semiconductor films are used. The first transistor and the second transistor include oxide semiconductor films with different structures.

<Structure of Display Device>

First, a liquid crystal display device is described.

Figure 34:
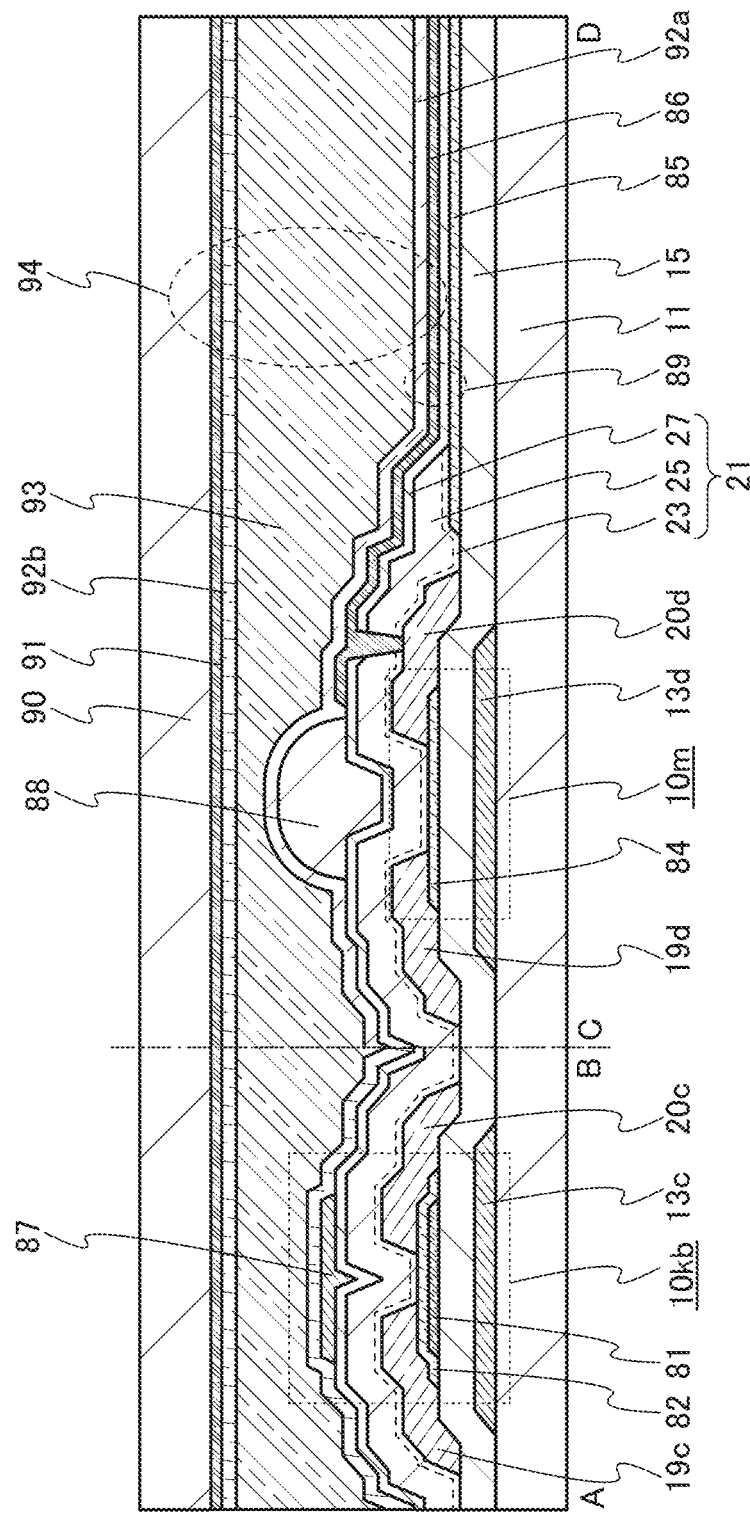
FIG. 34 is a cross-sectional view illustrating one embodiment of a liquid crystal display device.

FIG. 34 is a cross-sectional view of the liquid crystal display device; a transistor formed in a driver circuit portion is shown in a cross section A-B, and a transistor formed in a pixel portion is shown in a cross section C-D.

A transistor 10kb shown in the cross section A-B in FIG. 34 includes the gate electrode 13c over the substrate 11, the gate insulating film 15 over the substrate 11 and the gate electrode 13c, the first oxide semiconductor film 81 overlapping with the gate electrode 13c with the gate insulating film 15 positioned therebetween, the second oxide semiconductor film 82 covering the first oxide semiconductor film 81, and the pair of electrodes 19c and 20c in contact with the second oxide semiconductor film 82. The protective film 21 is formed over the gate insulating film 15, the second oxide semiconductor film 82, and the pair of electrodes 19c and 20c. The conductive film 87 may be provided over the protective film 21.

The protective film 21 includes the oxide insulating film 23, the oxide insulating film 25 containing oxygen at a higher proportion than oxygen in the stoichiometric composition, and the nitride insulating film 27.

The transistor 10m shown in the cross section C-D in FIG. 34 includes the gate electrode 13d over the substrate 11, the gate insulating film 15 over the substrate 11 and the gate electrode 13d, the oxide semiconductor film 84 overlapping with the gate electrode 13d with the gate insulating film 15 therebetween, and the pair of electrodes 19d and 20d in contact with the oxide semiconductor film 84. The protective film 21 is formed over the gate insulating film 15, the oxide semiconductor film 84, and the pair of electrodes 19d and 20d. The organic insulating film 88 may be provided over the protective film 21. The transistor 10m shown in the cross section C-D in FIG. 34 is the same as the transistor 10m shown in the cross section C-D in FIG. 1.

In the liquid crystal display device shown in this embodiment, the transistor in the driver circuit portion and the transistor in the pixel portion include oxide semiconductor films with different structures.

The first oxide semiconductor film 81 and the second oxide semiconductor film 82 have different compositions, and the second oxide semiconductor film 82 and the oxide semiconductor film 84 have the same composition. In other words, the first oxide semiconductor film 81 is formed in a step different from the step of forming the second oxide semiconductor film 82 and the oxide semiconductor film 84. In addition, the second oxide semiconductor film 82 and the oxide semiconductor film 84 are formed in the same step.

A channel region is formed in the first oxide semiconductor film 81 included in the transistor 10kb. For this reason, the first oxide semiconductor film 81 is thicker than the second oxide semiconductor film 82.

The thickness of the first oxide semiconductor film 81 is greater than or equal to 3 nm and less than or equal to 200 nm, preferably greater than or equal to 3 nm and less than or equal to 100 nm, further preferably greater than or equal to 30 nm and less than or equal to 50 nm. The thickness of each of the second oxide semiconductor film 82 and the oxide semiconductor film 84 is smaller than that of the first oxide semiconductor film 81 and is greater than or equal to 3 nm and less than or equal to 100 nm, preferably greater than or equal to 10 nm and less than or equal to 100 nm, further preferably greater than or equal to 30 nm and less than or equal to 50 nm.

The first oxide semiconductor film 81, the second oxide semiconductor film 82, and the oxide semiconductor film 84 are each formed using a metal oxide containing at least In; typically, an In—Ga oxide, an In-M-Zn oxide (M is Al, Ga, Y, Zr, La, Ce, or Nd), or the like can be used.

In the first oxide semiconductor film 81, the proportion of In atoms is higher than that of Zn or M (M is Al, Ga, Y, Zr, La, Ce, or Nd) atoms. In the case where the first oxide semiconductor film 81 contains an In-M-Zn oxide (M is Al, Ga, Y, Zr, La, Ce, or Nd), and a target having the atomic ratio of the metal elements of In:M:Zn=$x_3$:$y_3$:$z_3$ is used for forming the first oxide semiconductor film 81, $x_3/y_3$ is preferably greater than 1 and less than or equal to 6. Typical examples of the atomic ratio of the metal elements in the target are In:M:Zn=2:1:1.5, In:M:Zn=2:1:2.3, In:M:Zn=2:1:3, In:M:Zn=3:1:2, In:M:Zn=3:1:3, and In:M:Zn=3:1:4.

In the second oxide semiconductor film 82 and the oxide semiconductor film 84, the proportion of In atoms is lower than or equal to that of Zn or M (M is Al, Ga, Y, Zr, La, Ce, or Nd) atoms. In the case where the second oxide semiconductor film 82 and the oxide semiconductor film 84 contain an In-M-Zn oxide (M is Al, Ga, Y, Zr, La, Ce, or Nd), and a target having the atomic ratio of the metal elements of In:M:Zn=$x_4$:$y_4$:$z_4$ is used for forming the second oxide semiconductor film 82 and the oxide semiconductor film 84, $x_4/y_4$ is preferably greater than or equal to 1/6 and less than or equal to 1, and $z_4/y_4$ is preferably greater than or equal to 1/3 and less than or equal to 6, further preferably greater than or equal to 1 and less than or equal to 6. Note that when $z_4/y_4$ is greater than or equal to 1 and less than or equal to 6, CAAC-OS films are easily formed as the second oxide semiconductor film 82 and the oxide semiconductor film 84. Typical examples of the atomic ratio of the metal elements in the target are In:M:Zn=1:1:1, In:M:Zn=1:1:1.2, In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

A transistor including an oxide semiconductor film in which the proportion of In atoms is higher than that of Zn or M (M is Al, Ga, Y, Zr, La, Ce, or Nd) atoms, which is used as the first oxide semiconductor film 81, has high field-effect mobility. Typically, the transistor has a field-effect mobility of greater than 10 cm$^2$/V·s and less than 60 cm$^2$/V·s, preferably greater than or equal to 15 cm$^2$/V·s and less than 50 cm$^2$/V·s. However, the off-state current of the transistor is increased due to light irradiation. For this reason, a transistor including an oxide semiconductor film in which the proportion of In atoms is higher than that of Zn or M (M is Al, Ga, Y, Zr, La, Ce, or Nd) atoms is provided in a region that is blocked from light, such as a driver circuit portion;

thus, the transistor has high field-effect mobility and low off-state current. Consequently, a driver circuit portion capable of high-speed operation can be formed.

A transistor including an oxide semiconductor film in which the proportion of In atoms is lower than or equal to that of Zn or M (M is Al, Ga, Y, Zr, La, Ce, or Nd) atoms, which is used as the second oxide semiconductor film 82 and the oxide semiconductor film 84, has a small amount of increase in off-state current caused by light irradiation. For this reason, a transistor including an oxide semiconductor film in which the proportion of In atoms is lower than or equal to that of Zn or M (M is Al, Ga, Y, Zr, La, Ce, or Nd) atoms is provided in a pixel portion; thus, a pixel portion that does not easily deteriorate due to light irradiation and provides high display quality can be formed. The transistor including the oxide semiconductor film has a field-effect mobility of greater than or equal to 3 cm$^2$/V·s and less than or equal to 10 cm$^2$/V·s.

Furthermore, the transistor 10$kb$ in the driver circuit portion includes the conductive film 87 covering the first oxide semiconductor film 81 with the protective film 21 therebetween. The potential of the conductive film 87 can be set to a ground potential or a given potential. Alternatively, the conductive film 87 can be connected to the gate electrode 13$c$, in which case the transistor can have high field-effect mobility and high on-state current.

In the liquid crystal display device shown in this embodiment, the transistor in the driver circuit portion and the transistor in the pixel portion may have different channel lengths.

Typically, the channel length of the transistor 10$kb$ included in the driver circuit portion is less than 2.5 μm, preferably greater than or equal to 1.45 μm and less than or equal to 2.2 μm. The channel length of the transistor 10$m$ included in the pixel portion is greater than or equal to 2.5 μm, preferably greater than or equal to 2.5 μm and less than or equal to 20 μm.

When the channel length of the transistor 10$kb$ included in the driver circuit portion is set to less than 2.5 μm, preferably greater than or equal to 1.45 μm and less than or equal to 2.2 μm, the field-effect mobility can be further increased and the on-state current can be increased. Consequently, a driver circuit portion capable of high-speed operation can be formed.

Each of the first oxide semiconductor film 81, the second oxide semiconductor film 82, and the oxide semiconductor film 84 which partly serve as channel regions of the transistors has an energy gap of 2 eV or more, preferably 2.5 eV or more, further preferably 3 eV or more. With the use of an oxide semiconductor having such a wide energy gap, the off-state current of the transistors 10$kb$ and 10$m$ can be reduced.

Oxide semiconductor films with a low carrier density are used for the first oxide semiconductor film 81, the second oxide semiconductor film 82, and the oxide semiconductor film 84. For example, oxide semiconductor films each having a carrier density of $1\times10^{17}$/cm$^3$ or lower, preferably $1\times10^{15}$/cm$^3$ or lower, further preferably $1\times10^{13}$/cm$^3$ or lower, still further preferably $1\times10^{11}$/cm$^3$ or lower are used for the first oxide semiconductor film 81, the second oxide semiconductor film 82, and the oxide semiconductor film 84.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain the required semiconductor characteristics of the transistor, it is preferable that the carrier density, the impurity concentration, the defect density, the atomic ratio of a metal element to oxygen, the interatomic distance, the density, and the like of each of the first oxide semiconductor film 81, the second oxide semiconductor film 82, and the oxide semiconductor film 84 be set to appropriate values.

Note that oxide semiconductor films each having a low impurity concentration and a low density of defect states can be used for the first oxide semiconductor film 81, the second oxide semiconductor film 82, and the oxide semiconductor film 84, in which case the transistors can have more excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor in which a channel region is formed in the oxide semiconductor film has a small variation in electrical characteristics and high reliability. As examples of the impurities, hydrogen, nitrogen, alkali metal, and alkaline earth metal are given.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor that contains hydrogen is likely to be normally on.

Accordingly, it is preferable that not only oxygen vacancies but also hydrogen be reduced as much as possible in the first oxide semiconductor film 81, the second oxide semiconductor film 82, and the oxide semiconductor film 84. Specifically, in each of the first oxide semiconductor film 81, the second oxide semiconductor film 82, and the oxide semiconductor film 84, the concentration of hydrogen which is measured by secondary ion mass spectrometry (SIMS) is set to be lower than or equal to $5\times10^{19}$ atoms/cm$^3$, preferably lower than or equal to $1\times10^{19}$ atoms/cm$^3$, further preferably lower than or equal to $5\times10^{18}$ atoms/cm$^3$, still further preferably lower than or equal to $1\times10^{18}$ atoms/cm$^3$, yet still further preferably lower than or equal to $5\times10^{17}$ atoms/cm$^3$, yet still furthermore preferably lower than or equal to $1\times10^{16}$ atoms/cm$^3$.

When silicon or carbon that is one of elements belonging to Group 14 is contained in the first oxide semiconductor film 81, the second oxide semiconductor film 82, and the oxide semiconductor film 84, oxygen vacancies are increased, and the first oxide semiconductor film 81, the second oxide semiconductor film 82, and the oxide semiconductor film 84 become n-type films. Thus, the concentration of silicon or carbon, which is measured by SIMS, in each of the first oxide semiconductor film 81, the second oxide semiconductor film 82, and the oxide semiconductor film 84 is set to be lower than or equal to $2 \times 10^{18}$ atoms/cm$^3$, preferably lower than or equal to $2 \times 10^{17}$ atoms/cm$^3$.

Further, the concentration of alkali metal or alkaline earth metal in each of the first oxide semiconductor film 81, the second oxide semiconductor film 82, and the oxide semiconductor film 84, which is measured by SIMS, is lower than or equal to $1 \times 10^{18}$ atoms/cm$^3$, preferably lower than or equal to $2 \times 10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal in the first oxide semiconductor film 81, the second oxide semiconductor film 82, and the oxide semiconductor film 84.

Further, when containing nitrogen, the first oxide semiconductor film 81, the second oxide semiconductor film 82, and the oxide semiconductor film 84 easily become n-type by generation of electrons serving as carriers and an increase of carrier density. A transistor including an oxide semiconductor that contains nitrogen is likely to be normally on. For this reason, nitrogen in the oxide semiconductor film is preferably reduced as much as possible; the concentration of nitrogen that is measured by SIMS is preferably set to be, for example, lower than or equal to $5 \times 10^{18}$ atoms/cm$^3$.

Next, a structure of a light-emitting device is described with reference to FIG. 35.

Figure 35:
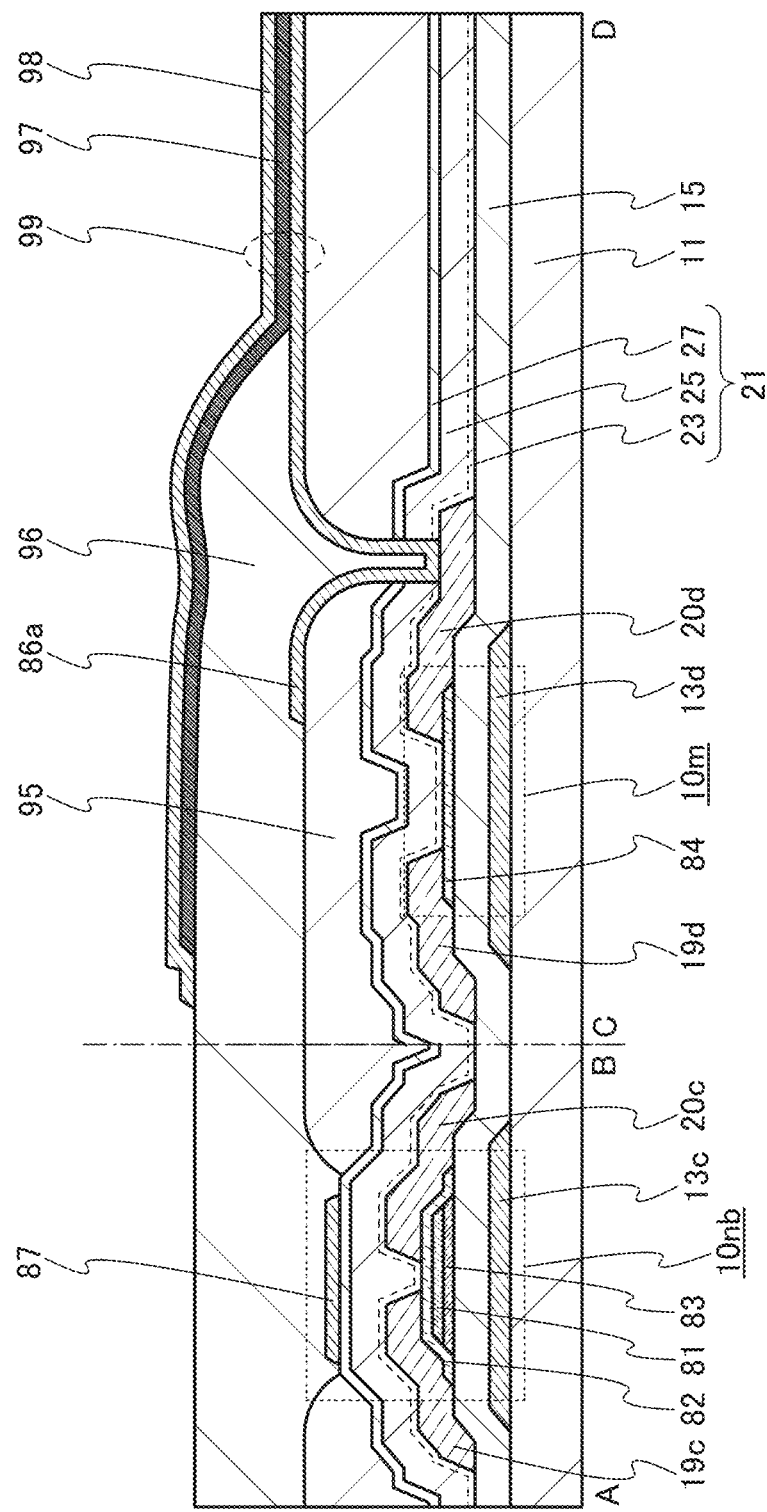
FIG. 35 is a cross-sectional view illustrating one embodiment of a light-emitting device.

FIG. 35 is a cross-sectional view of the light-emitting device; a transistor 10$nb$ formed in a driver circuit portion is shown in a cross section A-B, and the transistor 10$m$ formed in a pixel portion is shown in a cross section C-D. The transistor 10$m$ shown in the cross section C-D in FIG. 35 is the same as the transistor 10$m$ shown in the cross section C-D in FIG. 2, and the same reference numerals are used for the same parts.

The transistor 10$nb$ shown in the cross section A-B in FIG. 35 includes the third oxide semiconductor film 83 between the gate insulating film 15 and the first oxide semiconductor film 81. For the other components, components similar to those of the transistor 10$kb$ shown in FIG. 34 can be used as appropriate. Note that the transistor 10$kb$ shown in FIG. 34 can be used instead of the transistor 10$nb$ as appropriate.

In the transistor 10$nb$, a channel region is formed in the first oxide semiconductor film 81. For this reason, the first oxide semiconductor film 81 is thicker than the second oxide semiconductor film 82 and the third oxide semiconductor film 83.

In the third oxide semiconductor film 83, the proportion of In atoms is lower than that of Zn or M (M is Al, Ga, Y, Zr, La, Ce, or Nd) atoms. In the case where the third oxide semiconductor film 83 contains an In-M-Zn oxide (M is Al, Ga, Y, Zr, La, Ce, or Nd), and a target having the atomic ratio of the metal elements of In:M:Zn=$x_5$:$y_5$:$z_5$ is used for forming the third oxide semiconductor film 83, $x_5/y_5$ is preferably greater than or equal to 1/6 and less than 1, and $z_5/y_5$ is preferably greater than or equal to 1/3 and less than or equal to 6, further preferably greater than or equal to 1 and less than or equal to 6. Note that when $z_5/y_5$ is greater than or equal to 1 and less than or equal to 6, a CAAC-OS film is easily formed as the third oxide semiconductor film 83.

Typical examples of the atomic ratio of the metal elements in the target are In:M:Zn=1:3:2, In:M:Zn=1:3:4, In:M:Zn=1:3:6, In:M:Zn=1:3:8, In:M:Zn=1:4:4, In:M:Zn=1:4:5, In:M:Zn=1:4:6, In:M:Zn=1:4:7, In:M:Zn=1:4:8, In:M:Zn=1:5:5, In:M:Zn=1:5:6, In:M:Zn=1:5:7, In:M:Zn=1:5:8, and In:M:Zn=1:6:8.

The thickness of the third oxide semiconductor film 83 is smaller than that of the first oxide semiconductor film 81 and is greater than or equal to 2 nm and less than or equal to 100 nm, preferably greater than or equal to 2 nm and less than or equal to 50 nm, further preferably greater than or equal to 3 nm and less than or equal to 15 nm. Since the third oxide semiconductor film 83 is provided between the gate insulating film 15 and the first oxide semiconductor film 81, a change in the threshold voltage of the transistor 10$nb$ can be reduced.

<Method for Manufacturing Display Device>

A method for manufacturing transistors included in the display device is described. Here, using the light-emitting device shown in FIG. 35 as an example of the display device, a method for manufacturing the transistor 10$m$ and the transistor 10$nb$ is described with reference to FIGS. 36A to 36C, FIGS. 37A and 37B, and FIGS. 38A and 38B.

The films included in the transistors 10$m$ and 10$nb$ (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

As shown in FIG. 36A, the gate electrodes 13$c$ and 13$d$ and the gate insulating film 15 are formed over the substrate 11. Next, in the cross section A-B, the third oxide semiconductor film 83 and the first oxide semiconductor film 81 are formed over the gate insulating film 15.

The formation method of the gate electrodes 13$c$ and 13$d$ and the formation method of the gate insulating film 15 are described in Embodiment 1 and therefore are not described here.

Here, a silicon oxynitride film is formed as the gate insulating film 15 by a plasma CVD method.

A formation method of the third oxide semiconductor film 83 and the first oxide semiconductor film 81 is described below. An oxide semiconductor film to be the third oxide semiconductor film 83 and an oxide semiconductor film to be the first oxide semiconductor film 81 are formed over the gate insulating film 15 by a sputtering method, a coating method, a pulsed laser deposition method, a laser ablation method, a thermal CVD method, or the like. Then, after a mask is formed over the stacked oxide semiconductor films by a photolithography process, the stacked oxide semiconductor films are partly etched using the mask. Thus, as illustrated in FIG. 36B, the third oxide semiconductor film 83 and the first oxide semiconductor film 81, which are over the gate insulating film 15 and subjected to element isolation so as to partly overlap with the gate electrode 13$c$, are formed. After that, the mask is removed.

As a power supply device for generating plasma in the case of forming an oxide semiconductor film by a sputtering method, an RF power supply device, an AC power supply device, a DC power supply device, or the like can be used as appropriate.

As a sputtering gas, a rare gas (typically argon) atmosphere, an oxygen atmosphere, or a mixed gas of a rare gas and oxygen is used as appropriate. In the case of the mixed gas of a rare gas and oxygen, the proportion of oxygen to a rare gas is preferably increased.

Further, a target may be appropriately selected in accordance with the composition of the oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film, the conditions described in Embodiment 1 are preferably used.

Here, a 10-nm-thick oxide semiconductor film and a 35-nm-thick oxide semiconductor film are formed in this order by a sputtering method using a target having the atomic ratio of the metal elements of In:Ga:Zn=1:3:6 and a target having the atomic ratio of the metal elements of In:Ga:Zn=3:1:2, respectively, a mask is formed over the oxide semiconductor films, and then the oxide semiconductor films are selectively etched.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which is described later, is greater than or equal to 70% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. This means that an oxide semiconductor film with a low impurity concentration and a low density of defect states can be formed.

Then, as shown in FIG. 36B, an oxide semiconductor film is formed over the gate insulating film 15 and the first oxide semiconductor film 81 and etched into a desired shape; thus, the second oxide semiconductor film 82 covering the first oxide semiconductor film 81 and the third oxide semiconductor film 83 is formed in the cross section A-B in FIG. 36B, and the oxide semiconductor film 84 is formed in the cross section C-D in FIG. 36B.

In this step, the second oxide semiconductor film 82 is formed to cover a side surface of the third oxide semiconductor film 83 and a top surface and a side surface of the first oxide semiconductor film 81, to prevent the third oxide semiconductor film 83 and the first oxide semiconductor film 81 from being etched in a later step of forming a pair of electrodes. This is preferable because variations in the lengths of the third oxide semiconductor film 83 and the first oxide semiconductor film 81 in the channel width direction of the transistor can be reduced.

Next, heat treatment may be performed to dehydrogenate or dehydrate the oxide semiconductor films. The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

Here, heat treatment is performed at 450° C. in a mixed gas of nitrogen and oxygen, and after that, another heat treatment is performed at 450° C. in an oxygen atmosphere.

Note that instead of this heat treatment, similar heat treatment may be performed after the step shown in FIG. 36A.

Next, as illustrated in FIG. 36C, the pair of electrodes 19*c* and 20*c* is formed over the second oxide semiconductor film 82, and the pair of electrodes 19*d* and 20*d* is formed over the oxide semiconductor film 84.

Here, a 50-nm-thick copper-manganese alloy film, a 400-nm-thick copper film, and a 100-nm-thick copper-manganese alloy film are stacked in this order by a sputtering method. Next, a mask is formed over the copper-manganese alloy film by a photolithography process and the copper-manganese alloy films and the copper film are dry-etched with the use of the mask, so that the pair of electrodes 19*c* and 20*c* and the pair of electrodes 19*d* and 20*d* are formed.

Note that heat treatment may be performed after the pair of electrodes 19*c* and 20*c* and the pair of electrodes 19*d* and 20*d* are formed. For example, this heat treatment can be performed in a manner similar to that of the heat treatment performed after the second oxide semiconductor film 82 and the oxide semiconductor film 84 are formed.

After the pair of electrodes 19*c* and 20*c* and the pair of electrodes 19*d* and 20*d* are formed, cleaning treatment is preferably performed to remove an etching residue. A short circuit between the pair of electrodes 19*c* and 20*c* and a short circuit between the pair of electrodes 19*d* and 20*d* can be suppressed by this cleaning treatment. The cleaning treatment can be performed using an alkaline solution such as a TMAH solution; an acidic solution such as a hydrofluoric acid, an oxalic acid solution, or a phosphoric acid solution; or water.

Then, as shown in FIG. 37A, the protective film 21 is formed over the gate insulating film 15, the second oxide semiconductor film 82, the oxide semiconductor film 84, the pair of electrodes 19*c* and 20*c*, and the pair of electrodes 19*d* and 20*d*.

The protective film 21 can be formed by a sputtering method, a CVD method, an evaporation method, or the like.

As each of the oxide insulating films 23 and 25 included in the protective film 21, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

The nitride insulating film 27 can be formed by a sputtering method, a CVD method, or the like.

Heat treatment may be performed after formation of the oxide insulating film 25. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. By the heat treatment, part of oxygen contained in the oxide insulating film 25 can be moved to the first oxide semiconductor film 81, the second oxide semiconductor film 82, the third oxide semiconductor film 83, and the oxide semiconductor film 84, so that the number of oxygen vacancies contained in these oxide semiconductor films can be reduced.

Here, heat treatment is performed at 350° C. in a mixed atmosphere containing nitrogen and oxygen for one hour.

Furthermore, heat treatment can be performed after formation of the nitride insulating film 27 so that hydrogen or the like is released from the protective film 21.

Here, heat treatment is performed at 350° C. in a mixed atmosphere containing nitrogen and oxygen for one hour.

Through the above steps, transistors in each of which a shift in the threshold voltage is reduced can be manufactured. Further, transistors in each of which a change in electrical characteristics is reduced can be manufactured.

Next, as shown in FIG. 37B, the insulating film 95 including an opening where the protective film 21 over the second oxide semiconductor film 82 of the transistor 10nb is partly exposed and an opening where the electrode 20d of the transistor 10m is partly exposed is formed. Then, the conductive film 87 is formed over the protective film 21 to overlap with the second oxide semiconductor film 82 of the transistor 10nb, and the first electrode 86a connected to the electrode 20d of the transistor 10m is formed over the insulating film 95.

Here, the insulating film 95 is formed using photosensitive polyimide.

Figure 38A:
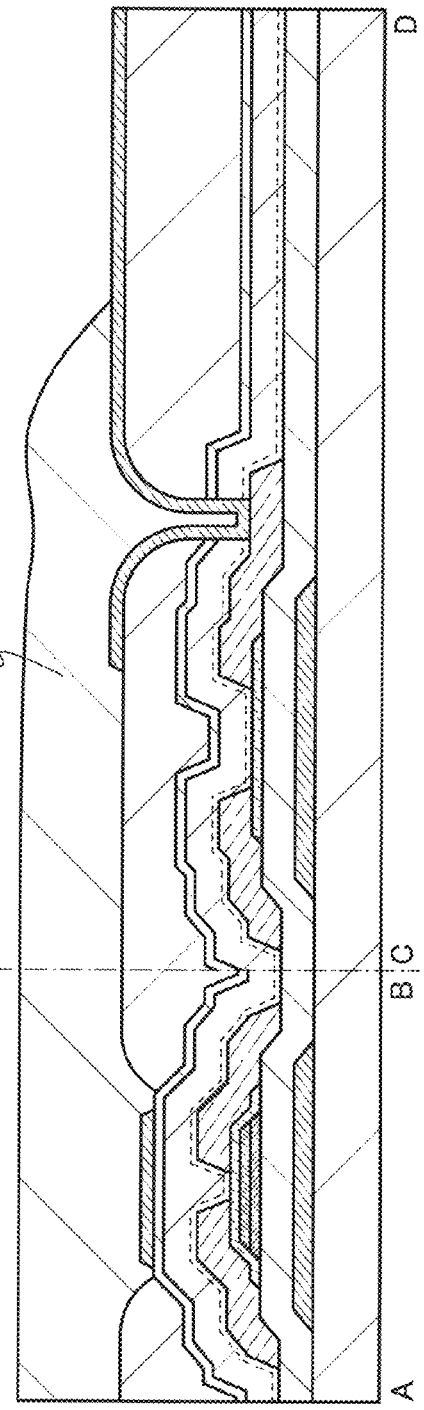
FIGS. 38A and 38B are cross-sectional views illustrating one embodiment of a method for manufacturing a transistor.

Next, as shown in FIG. 38A, the insulating film 96 is formed over the insulating film 95, the conductive film 87, and the first electrode 86a. The insulating film 96 can be formed by a method similar to that of the insulating film 95 as appropriate.

Figure 38B:
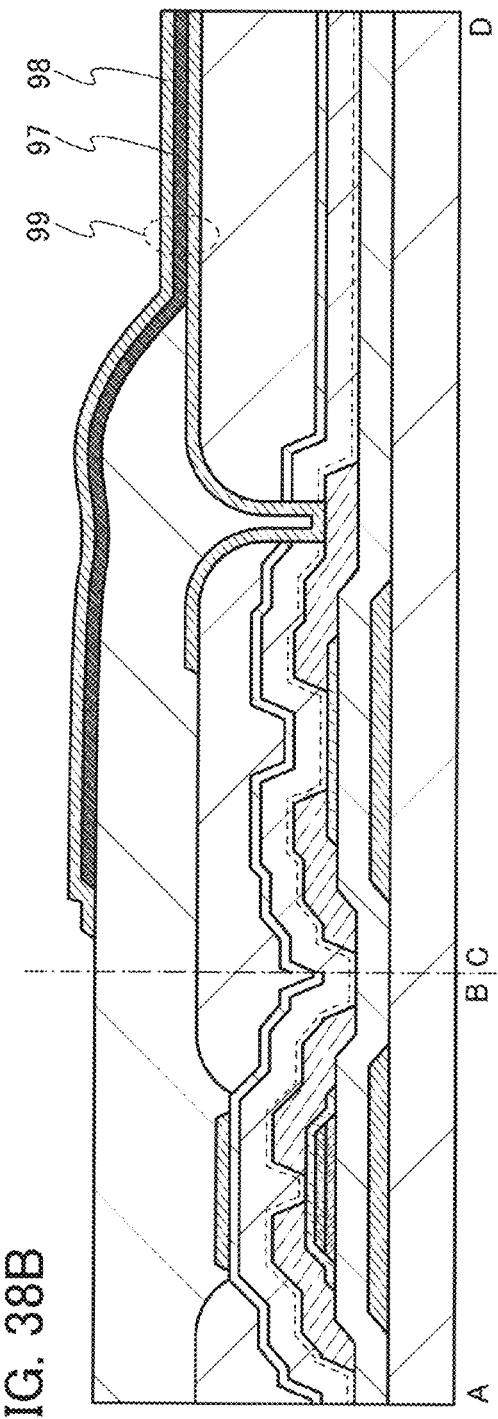

Then, as shown in FIG. 38B, the EL layer 97 is formed over the insulating film 96 and the first electrode 86a.

Through the above steps, a display device being capable of high-speed operation and having a pixel portion that does not easily deteriorate due to light irradiation and provides high display quality can be manufactured.

Although the first oxide semiconductor film 81, the second oxide semiconductor film 82, the third oxide semiconductor film 83, the oxide semiconductor film 84, and the like are provided below the electrodes 19c, 20c, 19d, and 20d and the like in FIG. 34, FIG. 35, and the like, one embodiment of the present invention is not limited thereto.
<Variation 8>

Although the transistors described in Embodiment 5 are channel-etched transistors, channel-protective transistors can be used as appropriate.
<Variation 9>

Although the transistors described in Embodiment 5 are bottom-gate transistors, transistors used for a pixel circuit and/or a driver circuit may have a top-gate bottom-contact structure as shown in FIGS. 22A to 22C.
<Variation 10>

Although the transistors described in Embodiment 5 are bottom-gate transistors, transistors used for a pixel circuit and/or a driver circuit may have a top-gate top-contact structure as shown in FIGS. 23A to 23C.

Note that the structures, methods, and the like described in this embodiment can be used as appropriate in combination with any of the structures, methods, and the like described in the other embodiments and examples.

Embodiment 6

In this embodiment, display devices having structures partly different from those in Embodiment 1 and Embodiment 5 are described.

Figure 43:
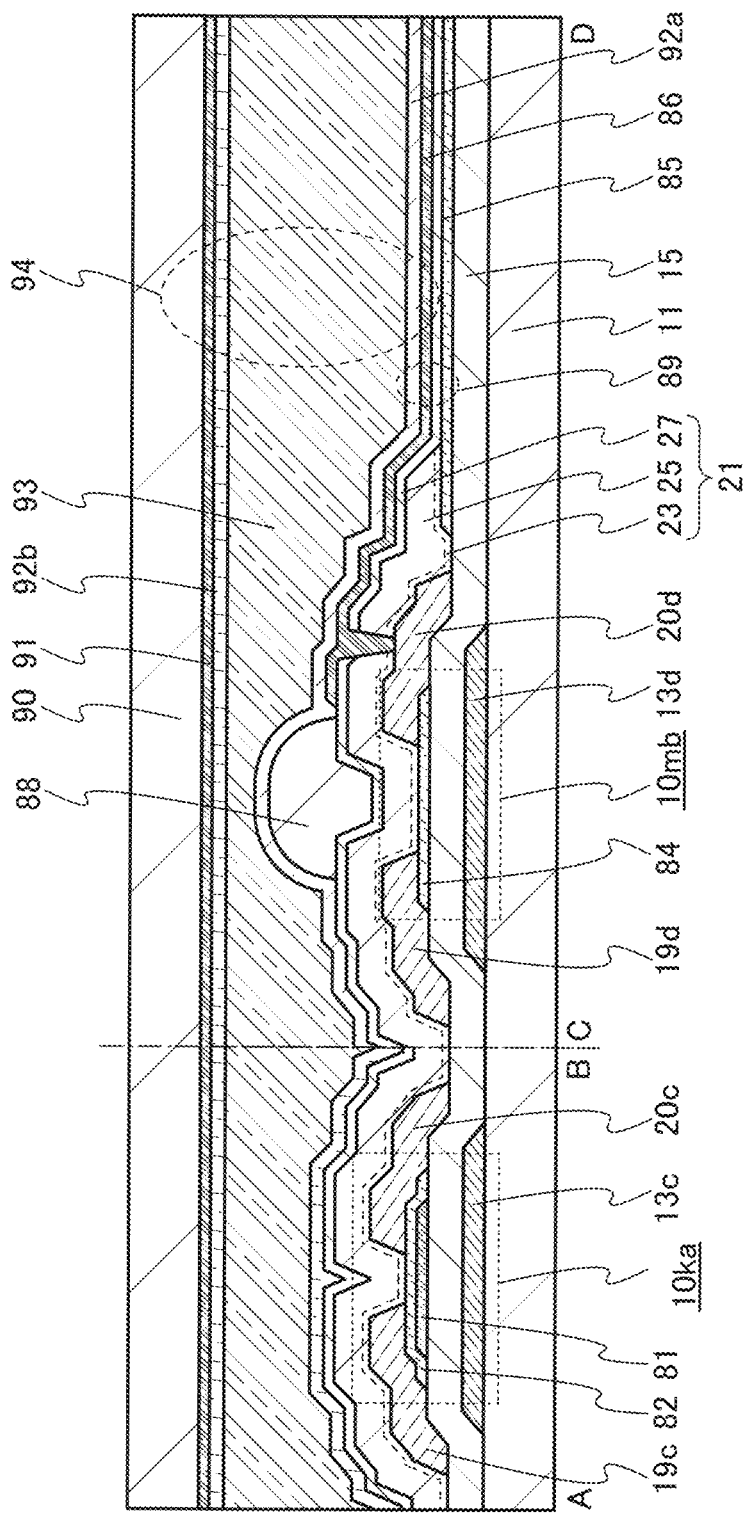
FIG. 43 is a cross-sectional view illustrating one embodiment of a liquid crystal display device.

FIG. 43 is a cross-sectional view of a liquid crystal display device; a transistor formed in a driver circuit portion is shown in a cross section A-B, and a transistor formed in a pixel portion is shown in a cross section C-D. The structure shown in FIG. 43 differs from those in FIG. 1 and FIG. 34 in that the conductive film 87 is not formed in the driver circuit portion.

A transistor 10ka shown in the cross section A-B in FIG. 43 includes the gate electrode 13c over the substrate 11, the gate insulating film 15 over the substrate 11 and the gate electrode 13c, the first oxide semiconductor film 81 overlapping with the gate electrode 13c with the gate insulating film 15 positioned therebetween, the second oxide semiconductor film 82 covering the first oxide semiconductor film 81, and the pair of electrodes 19c and 20c in contact with the second oxide semiconductor film 82. The protective film 21 is formed over the gate insulating film 15, the second oxide semiconductor film 82, and the pair of electrodes 19c and 20c. In the transistor 10kb in the cross section A-B in FIG. 34, the conductive film 87 is formed over the protective film 21, whereas in the transistor 10ka in the cross section A-B in FIG. 43, the conductive film 87 is not formed. The transistors have the same structure except for this point.

The protective film 21 includes the oxide insulating film 23, the oxide insulating film 25 containing oxygen at a higher proportion than oxygen in the stoichiometric composition, and the nitride insulating film 27.

A transistor 10mb shown in the cross section C-D in FIG. 43 includes the gate electrode 13d over the substrate 11, the gate insulating film 15 over the substrate 11 and the gate electrode 13d, the oxide semiconductor film 84 overlapping with the gate electrode 13d with the gate insulating film 15 therebetween, and the pair of electrodes 19d and 20d in contact with the oxide semiconductor film 84. The protective film 21 is formed over the gate insulating film 15, the oxide semiconductor film 84, and the pair of electrodes 19d and 20d. The organic insulating film 88 may be provided over the protective film 21.

The oxide semiconductor film 85 having conductivity is formed over the gate insulating film 15. The oxide semiconductor film 85 having conductivity is formed in the following manner: an oxide semiconductor film is formed at the same time as the second oxide semiconductor film 82 and the oxide semiconductor film 84 and made to be in contact with the nitride insulating film 27, so that the oxide semiconductor film has increased number of oxygen vacancies and increased hydrogen concentration and thus has increased conductivity.

In addition, the pixel electrode 86 is provided over the protective film 21 to be connected to the electrode 20d of the transistor 10mb through an opening in the protective film 21. The pixel electrode 86 can be formed using a light-transmitting conductive film.

The oxide semiconductor film 85 having conductivity, the nitride insulating film 27, and the pixel electrode 86 form the capacitor 89. The oxide semiconductor film 85 having conductivity and the pixel electrode 86 transmit light; accordingly, the capacitor 89 transmits light. Therefore, it is possible to increase the area of the capacitor 89 in a pixel. This makes it possible to form a pixel that has high aperture ratio and is provided with the capacitor 89 having high capacitance value.

The alignment film 92a is provided over the protective film 21, the pixel electrode 86, and the organic insulating film 88.

In the liquid crystal display device, the counter substrate 90 is provided. In addition, the counter electrode 91 and the alignment film 92b are provided in this order from the counter substrate 90 side between the substrate 11 and the counter substrate 90.

The liquid crystal layer 93 is provided between the alignment film 92a and the alignment film 92b. The pixel electrode 86, the liquid crystal layer 93, and the counter electrode 91 form the liquid crystal element 94.

In the liquid crystal display device shown in this embodiment, the transistor in the driver circuit portion and the transistor in the pixel portion include oxide semiconductor films with different structures. The components other than the transistors are the same as those shown in FIG. 1 and FIG. 34, and the same reference numerals are used for the same parts.

The first oxide semiconductor film 81 and the second oxide semiconductor film 82 have different compositions, and the second oxide semiconductor film 82 and the oxide semiconductor film 84 have the same composition. In other words, the first oxide semiconductor film 81 is formed in a step different from the step of forming the second oxide semiconductor film 82 and the oxide semiconductor film 84. In addition, the second oxide semiconductor film 82 and the oxide semiconductor film 84 are formed in the same step.

A channel region is formed in the first oxide semiconductor film 81 included in the transistor 10ka. For this reason, the first oxide semiconductor film 81 is thicker than the second oxide semiconductor film 82.

The thickness of the first oxide semiconductor film 81 is greater than or equal to 3 nm and less than or equal to 200 nm, preferably greater than or equal to 3 nm and less than or equal to 100 nm, further preferably greater than or equal to 30 nm and less than or equal to 50 nm. The thickness of each of the second oxide semiconductor film 82 and the oxide semiconductor film 84 is smaller than that of the first oxide semiconductor film 81 and is greater than or equal to 3 nm and less than or equal to 100 nm, preferably greater than or equal to 10 nm and less than or equal to 100 nm, further preferably greater than or equal to 30 nm and less than or equal to 50 nm.

Any of the materials described in Embodiment 5 can be used for the first oxide semiconductor film 81, the second oxide semiconductor film 82, and the oxide semiconductor film 84.

In the liquid crystal display device shown in this embodiment, the transistor in the driver circuit portion and the transistor in the pixel portion may have different channel lengths.

Typically, the channel length of the transistor 10ka included in the driver circuit portion is less than 2.5 µm, preferably greater than or equal to 1.45 µm and less than or equal to 2.2 µm. The channel length of the transistor 10mb included in the pixel portion is greater than or equal to 2.5 µm, preferably greater than or equal to 2.5 µm and less than or equal to 20 µm.

When the channel length of the transistor 10ka included in the driver circuit portion is set to less than 2.5 µm, preferably greater than or equal to 1.45 µm and less than or equal to 2.2 µm, the field-effect mobility can be increased and the on-state current can be increased. Consequently, a driver circuit portion capable of high-speed operation can be formed.

Each of the first oxide semiconductor film 81, the second oxide semiconductor film 82, and the oxide semiconductor film 84 which partly serve as channel regions of the transistors has an energy gap of 2 eV or more, preferably 2.5 eV or more, further preferably 3 eV or more. With the use of an oxide semiconductor having such a wide energy gap, the off-state current of the transistors 10ka and 10mb can be reduced.

Next, other components of the liquid crystal display device are described in detail. The details of the components of the liquid crystal display device already described in Embodiment 1 can be referred to. Part of the description in Embodiment 1 is repeated below.

Alternatively, a flexible substrate may be used as the substrate 11, and the transistors 10ka and 10mb may be provided directly on the flexible substrate. Further alternatively, a separation layer may be provided between the substrate 11 and the transistors 10ka and 10mb. The separation layer can be used when part or the whole of a semiconductor device formed over the separation layer is separated from the substrate 11 and transferred onto another substrate. In such a case, the transistors 10ka and 10mb can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

The thickness of the gate insulating film 15 is greater than or equal to 5 nm and less than or equal to 400 nm, preferably greater than or equal to 10 nm and less than or equal to 300 nm, further preferably greater than or equal to 50 nm and less than or equal to 250 nm.

Each of the oxide insulating films 23 and 25 can be formed using a material similar to that of the gate insulating film as appropriate.

The oxide insulating film 23 may be an oxide insulating film containing nitrogen and having a small number of defects.

Figure 44:
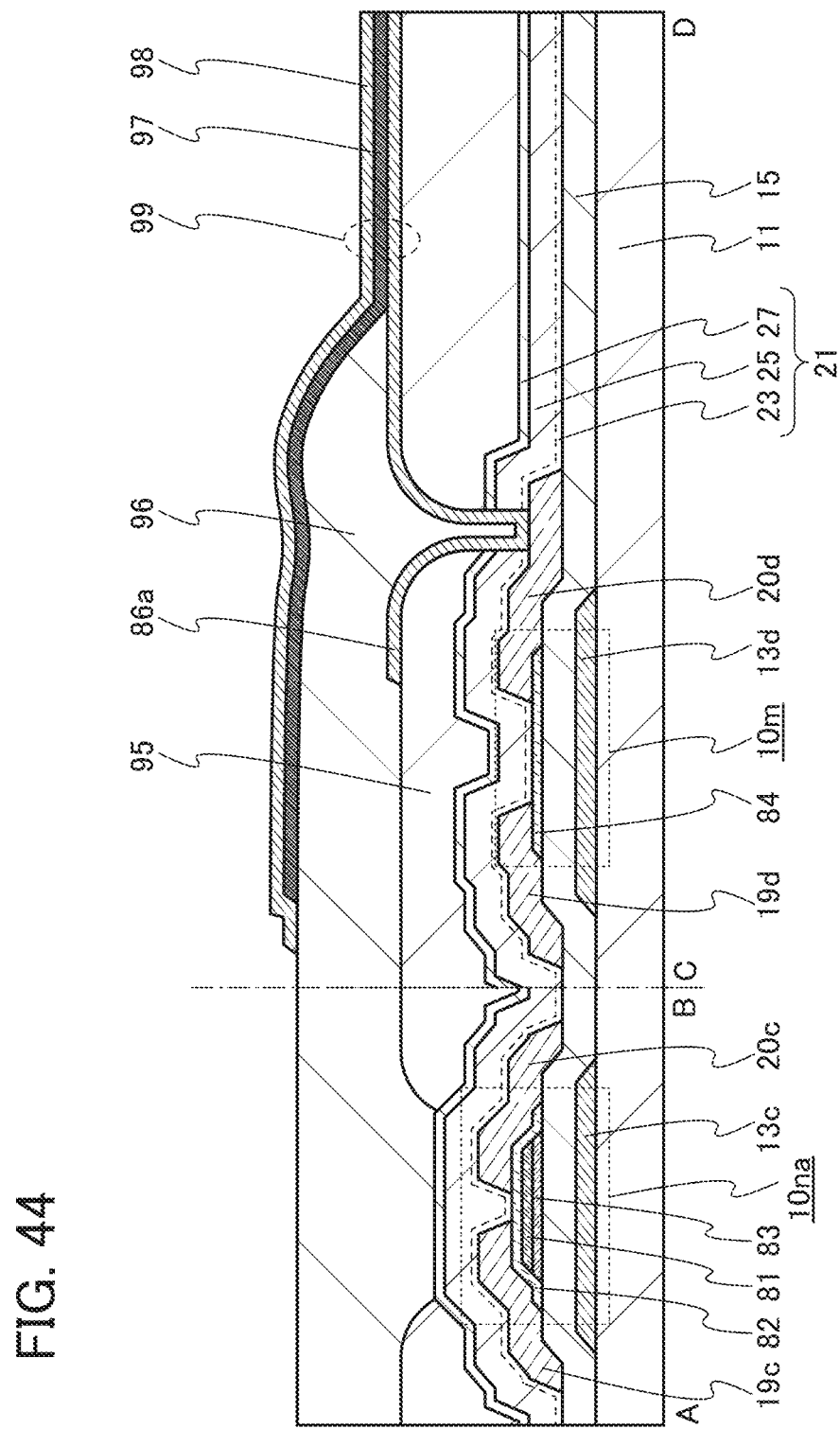
FIG. 44 is a cross-sectional view illustrating one embodiment of a light-emitting device.

Next, a structure of a light-emitting device is described with reference to FIG. 44. Note that many portions in FIG. 44 are the same as those in FIG. 35, and such portions are not described here. In the transistor 10nb in the cross section A-B in FIG. 35, the conductive film 87 is formed over the protective film 21, whereas in a transistor 10na in the cross section A-B in FIG. 44, the conductive film 87 is not formed. The transistors have the same structure except for this point.

FIG. 44 is a cross-sectional view of the light-emitting device; the transistor 10na formed in a driver circuit portion is shown in a cross section A-B, and the transistor 10m formed in a pixel portion is shown in a cross section C-D.

<Method for Manufacturing Display Device>

A method for manufacturing transistors included in the display device is described. The transistor 10na in the cross section A-B in FIG. 44 has the same structure as the transistor 10nb in the cross section A-B in FIG. 35 except that the conductive film 87 is not formed, and the formation method is the same as that in Embodiment 5 if the conductive film 87 is not formed. Accordingly, the description is omitted here.

Figure 45:
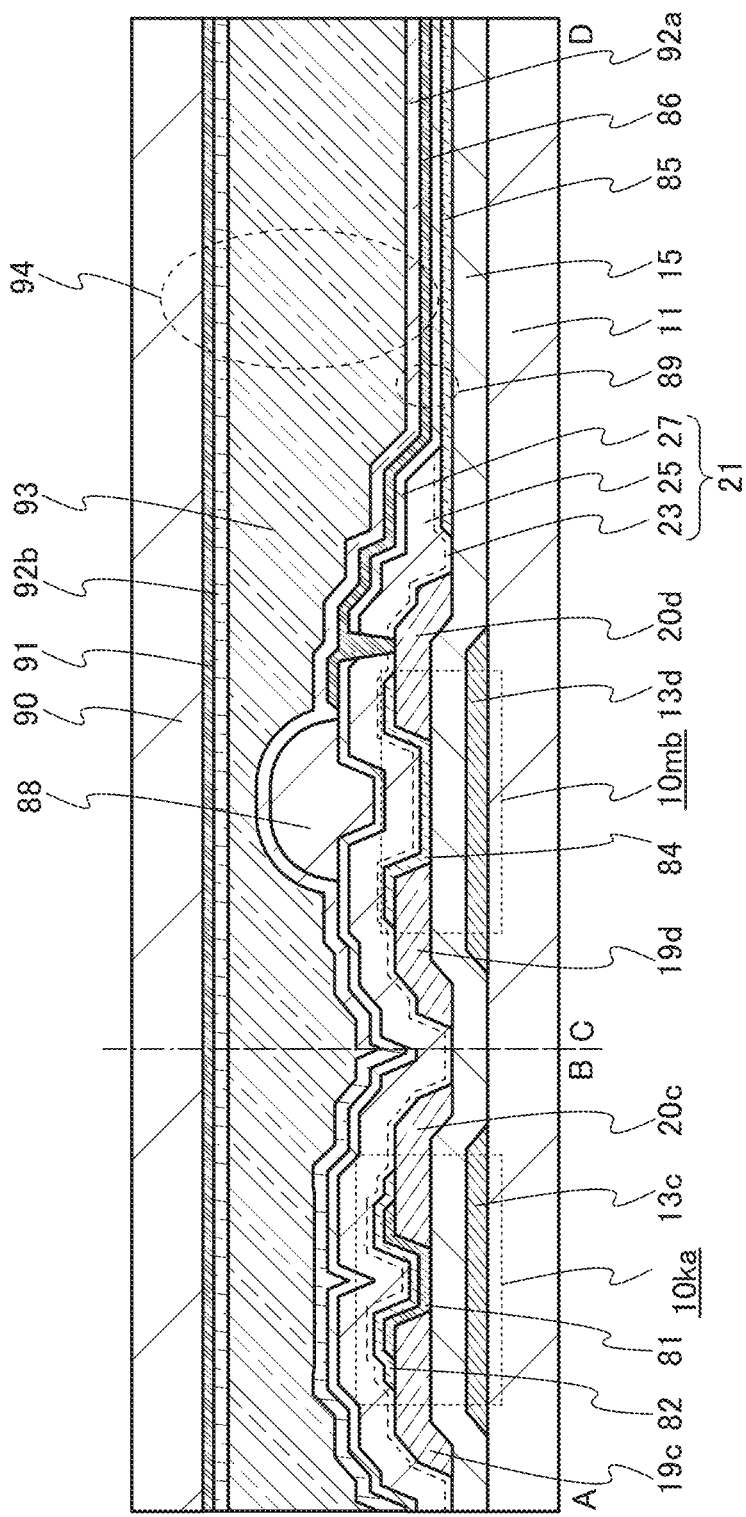
FIG. 45 is a cross-sectional view illustrating one embodiment of a liquid crystal display device.
Figure 46:
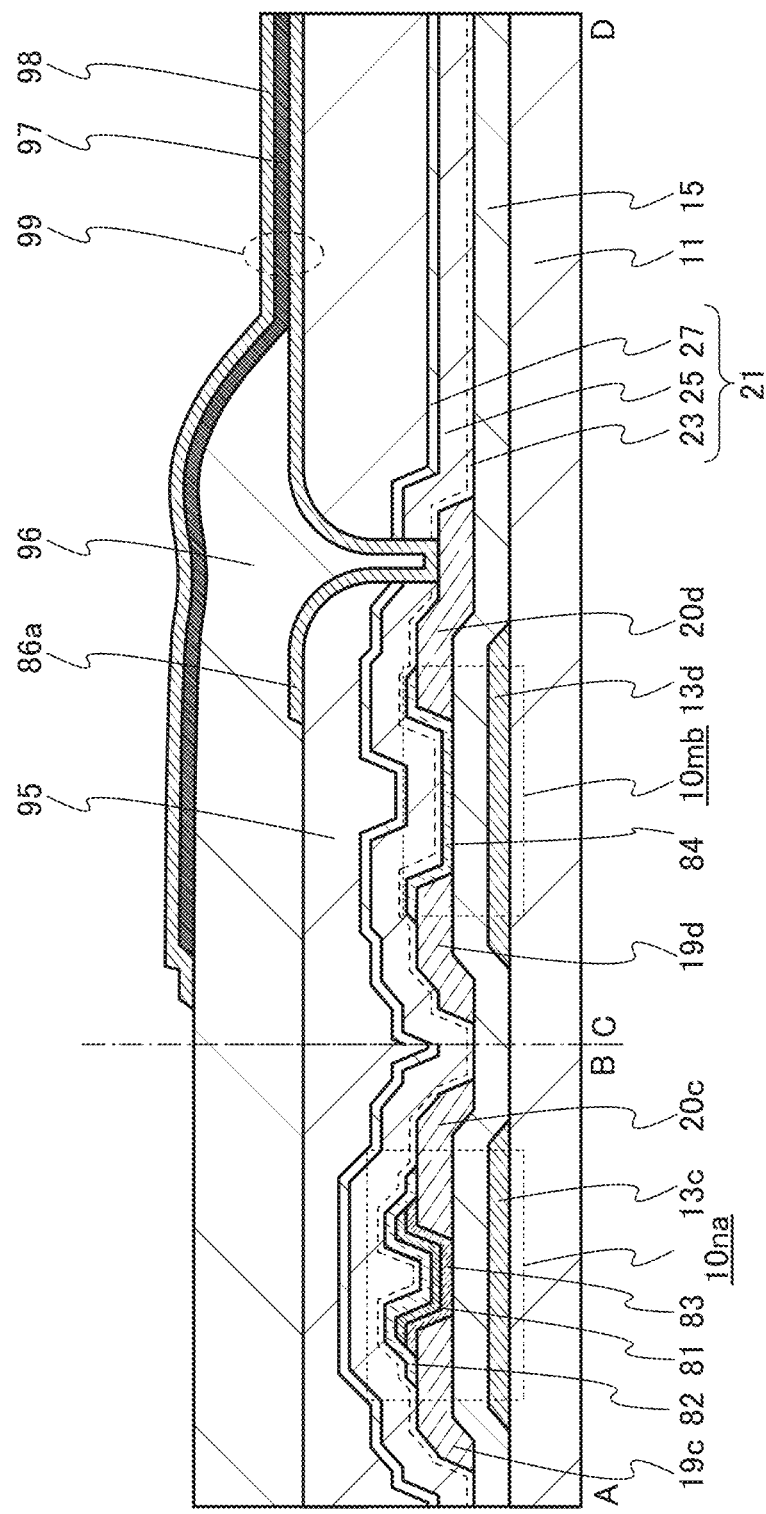
FIG. 46 is a cross-sectional view illustrating one embodiment of a light-emitting device.

Although the first oxide semiconductor film 81, the second oxide semiconductor film 82, the third oxide semiconductor film 83, the oxide semiconductor film 84, and the like are provided below the electrodes 19c, 20c, 19d, and 20d and the like in FIG. 43, FIG. 44, and the like, one embodiment of the present invention is not limited thereto. The first oxide semiconductor film 81, the second oxide semiconductor film 82, the third oxide semiconductor film 83, the oxide semiconductor film 84, and the like may be provided above the electrodes 19c, 20c, 19d, and 20d and the like. FIG. 45 and FIG. 46 illustrate examples of such a case.

<Variation 11>

Although FIG. 43 shows channel-etched transistors, channel-protective transistors can be used as appropriate.

<Variation 12>

Although FIG. 43 shows bottom-gate transistors, transistors used for a pixel circuit and/or a driver circuit may have a top-gate bottom-contact structure as shown in FIGS. 22A to 22C.

<Variation 13>

Although FIG. 43 shows bottom-gate transistors, transistors used for a pixel circuit and/or a driver circuit may have a top-gate top-contact structure as shown in FIGS. 23A to 23C.

Note that the structures, methods, and the like described in this embodiment can be used as appropriate in combination with any of the structures, methods, and the like described in the other embodiments and examples.

Example 1

In this example, examination results of the $V_g$-$I_d$ characteristics and the reliability of fabricated transistors are described.

<Fabrication of Samples>

In this example, a sample 1, which included a transistor suitable for a driver circuit of a display device of one embodiment of the present invention, and a sample 2, which included a transistor suitable for a pixel of the display device, were fabricated. Specifically, a sample corresponding to the transistor 10$k$ illustrated in FIG. 1 was fabricated as the sample 1, which is one embodiment of the present invention. In addition, a sample corresponding to the transistor 10$m$ illustrated in FIG. 1 was fabricated as the sample 2, which is one embodiment of the present invention.

<Sample 1>

First, a glass substrate was used as a substrate, and a gate electrode was formed over the substrate.

The gate electrode was formed in the following manner: a 100-nm-thick tungsten film was formed by a sputtering method, a mask was formed over the tungsten film by a photolithography process, and the tungsten film was partly etched using the mask.

Next, an insulating film serving as a gate insulating film was formed over the gate electrode.

As the gate insulating film, a stack including a 400-nm-thick silicon nitride film and a 50-nm-thick silicon oxynitride film was used.

Note that the silicon nitride film was formed to have a three-layer structure of a first silicon nitride film, a second silicon nitride film, and a third silicon nitride film.

The first silicon nitride film was formed to have a thickness of 50 nm under the following conditions: silane at a flow rate of 200 sccm, nitrogen at a flow rate of 2000 sccm, and an ammonia gas at a flow rate of 100 sccm were supplied to a treatment chamber of a plasma CVD apparatus as a source gas, the pressure in the treatment chamber was controlled to 100 Pa, and a power of 2000 W was supplied with the use of a 27.12 MHz high-frequency power source. The second silicon nitride film was formed to have a thickness of 300 nm under the following conditions: silane at a flow rate of 200 sccm, nitrogen at a flow rate of 2000 sccm, and an ammonia gas at a flow rate of 2000 sccm were supplied to the treatment chamber of the plasma CVD apparatus as a source gas, the pressure in the treatment chamber was controlled to 100 Pa, and a power of 2000 W was supplied with the use of a 27.12 MHz high-frequency power source. The third silicon nitride film was formed to have a thickness of 50 nm under the following conditions: silane at a flow rate of 200 sccm and nitrogen at a flow rate of 5000 sccm were supplied to the treatment chamber of the plasma CVD apparatus as a source gas, the pressure in the treatment chamber was controlled to 100 Pa, and a power of 2000 W was supplied with the use of a 27.12 MHz high-frequency power source. Note that the first silicon nitride film, the second silicon nitride film, and the third silicon nitride film were each formed at a substrate temperature of 350° C.

The silicon oxynitride film was formed under the following conditions: silane at a flow rate of 20 sccm and dinitrogen monoxide at a flow rate of 3000 sccm were supplied to the treatment chamber of the plasma CVD apparatus as a source gas; the pressure in the treatment chamber was controlled to 40 Pa; and a power of 100 W was supplied with the use of a 27.12 MHz high-frequency power source. Note that the silicon oxynitride film was formed at a substrate temperature of 350° C.

Next, an oxide semiconductor film was formed to overlap with the gate electrode with the gate insulating film positioned therebetween.

Here, a 35-nm-thick oxide semiconductor film was formed over the gate insulating film by a sputtering method.

The oxide semiconductor film was formed under the following conditions: a sputtering target containing In, Ga, and Zn at an atomic ratio of 1:1:1 was used; a mixed gas of argon and oxygen with a proportion of oxygen of 50% was supplied into a treatment chamber of a sputtering apparatus; the pressure in the treatment chamber was controlled to 0.6 Pa; and a power of 2.5 kW was supplied. Note that the oxide semiconductor film was formed at a substrate temperature of 170° C.

Next, a pair of electrodes in contact with the oxide semiconductor film was formed.

First, a conductive film was formed over the gate insulating film and the oxide semiconductor film. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and the conductive film was partly etched using the mask. Through the above steps, the pair of electrodes was formed.

After that, a second gate insulating film was formed over the oxide semiconductor film and the pair of electrodes. Here, the second gate insulating film was formed to have a three-layer structure of a 50-nm-thick first oxide insulating film, a 400-nm-thick second oxide insulating film, and a 100-nm-thick nitride insulating film.

The first oxide insulating film was formed by a plasma CVD method under the following conditions: silane at a flow rate of 20 sccm and dinitrogen monoxide at a flow rate of 3000 sccm were used as a source gas; the pressure in the treatment chamber was 200 Pa; the substrate temperature was 350° C.; and a high-frequency power of 100 W was supplied to parallel-plate electrodes.

The second oxide insulating film was formed by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. Here, the heat treatment was performed at 350° C. in a mixed atmosphere of nitrogen and oxygen for one hour.

Then, the nitride insulating film was formed over the second oxide insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas; the pressure in the treatment chamber was 100 Pa; the substrate temperature was 350° C.; and a high-frequency power of 1000 W was supplied to parallel-plate electrodes.

Subsequently, in a region where the oxide semiconductor film and the pair of electrodes were not provided, an opening that reaches the gate electrode was formed in the gate insulating film and the second gate insulating film. The opening was formed in the following manner: a mask was formed over the second gate insulating film by a photolithography process, and the gate insulating film and the second gate insulating film were partly etched using the mask.

After that, a second gate electrode serving as a back gate electrode was formed over the second gate insulating film. The back gate electrode was electrically connected to the gate electrode through the opening provided in the gate insulating film and the second gate insulating film.

Here, as the back gate electrode, a 100-nm-thick conductive film of an indium oxide-tin oxide compound (ITO-SiO$_2$) containing silicon oxide was formed by a sputtering method. Note that the composition of a target used for forming the conductive film was In$_2$O$_3$:SnO$_2$:SiO$_2$=85:10:5 [wt %]. After that, heat treatment was performed at 250° C. in a nitrogen atmosphere for one hour.

Through the above process, the sample 1 of this example was fabricated.

<Sample 2>

The sample 2 differs from the sample 1 in that a back gate electrode is not provided and that a 1.5-μm-thick acrylic resin film is provided over the nitride insulating film.

The sample 2 was fabricated using the above-described fabrication process of the sample 1, excluding the step of forming the back gate electrode. Other steps for fabricating the sample 2 are similar to those for fabricating the sample 1; thus, the descriptions for the sample 1 can be referred to.

Note that as each of the samples 1 and 2, three kinds of transistors were fabricated in which channel widths W were 50 μm and channel lengths L were 2 μm, 3 μm, and 6 μm.

<V$_g$-I$_d$ Characteristics>

Next, initial V$_g$-I$_d$ characteristics of the transistors included in the samples 1 and 2 were measured. Here, changes in current flowing between a source and a drain (hereinafter referred to as drain current: I$_d$), that is, V$_g$-I$_d$ characteristics were measured under the following conditions: the substrate temperature was 25° C., the potential difference between the source and the drain (hereinafter referred to as drain voltage: V$_d$) was 1 V or 10 V, and the potential difference between the source and the gate electrodes (hereinafter referred to as gate voltage: V$_g$) was changed from −15 V to 15 V.

Here, the transistors of the sample 1 were driven by a method in which gate voltage is applied in a state where the gate electrode and the back gate electrode are electrically connected to each other. In such a driving method, the back gate electrode always has the same gate voltage as the gate electrode.

Figure 24A:
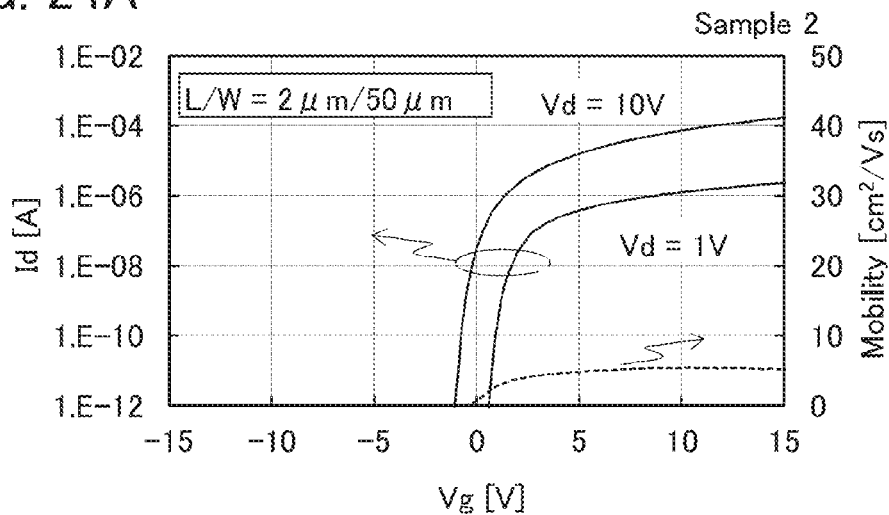
FIGS. 24A to 24C show electrical characteristics of transistors.
Figure 24B:
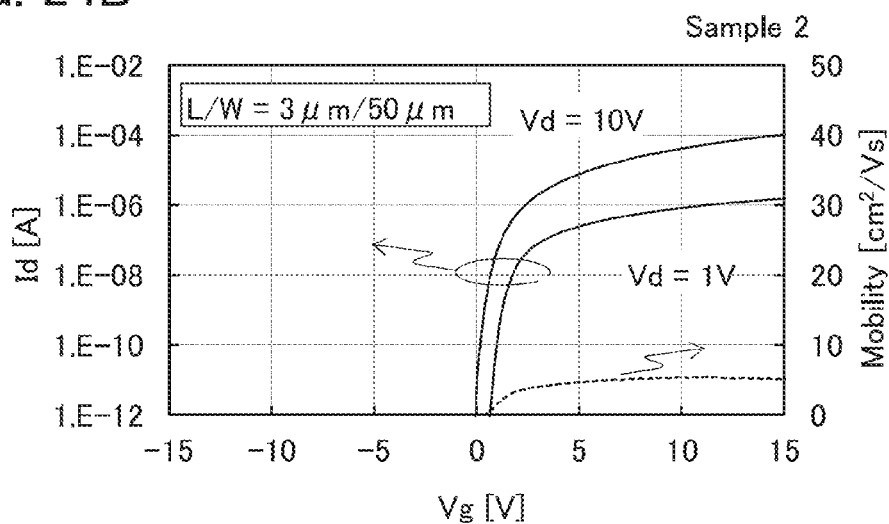
Figure 24C:
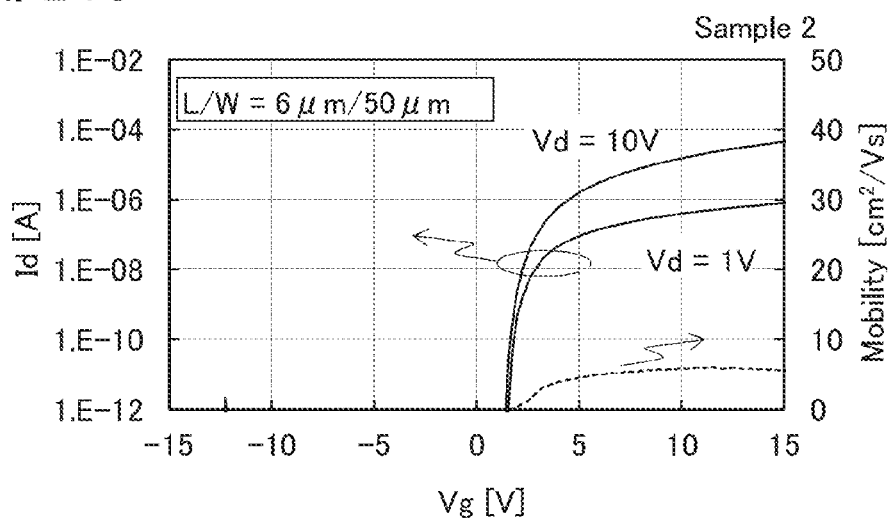

FIGS. 24A to 24C show the V$_g$-I$_d$ characteristics of the sample 2. FIGS. 24A to 24C show results of the transistors with channel lengths L of 2 μm, 3 μm, and 6 μm, respectively. Similarly, FIGS. 25A to 25C show the V$_g$-I$_d$ characteristics of the sample 1.

In each of FIGS. 24A to 24C and FIGS. 25A to 25C, the lateral axis, the first longitudinal axis, and the second longitudinal axis represent gate voltage V$_g$, drain current I$_d$, and field-effect mobility, respectively. Here, to show field-effect mobility in a saturation region, field-effect mobility calculated when drain voltage V$_d$ was 10 V is shown.

The results of the sample 2 in FIGS. 24A to 24C show that a shift of the threshold voltage in the negative direction is further suppressed as the channel length L becomes longer. An effect of suppressing the shift of the threshold voltage in the negative direction is particularly significant when the drain voltage 17a is high. Note that the field-effect mobility hardly changes regardless of the channel length L.

Figure 25A:
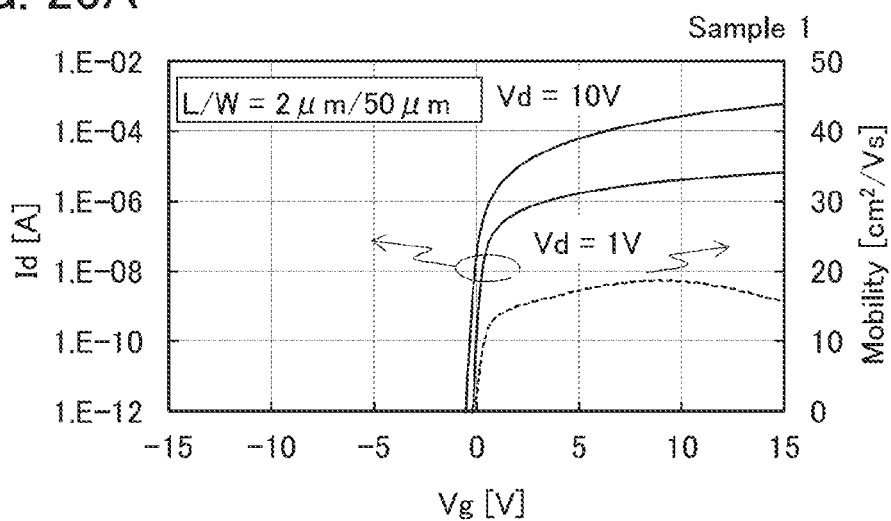
FIGS. 25A to 25C show electrical characteristics of transistors.
Figure 25B:
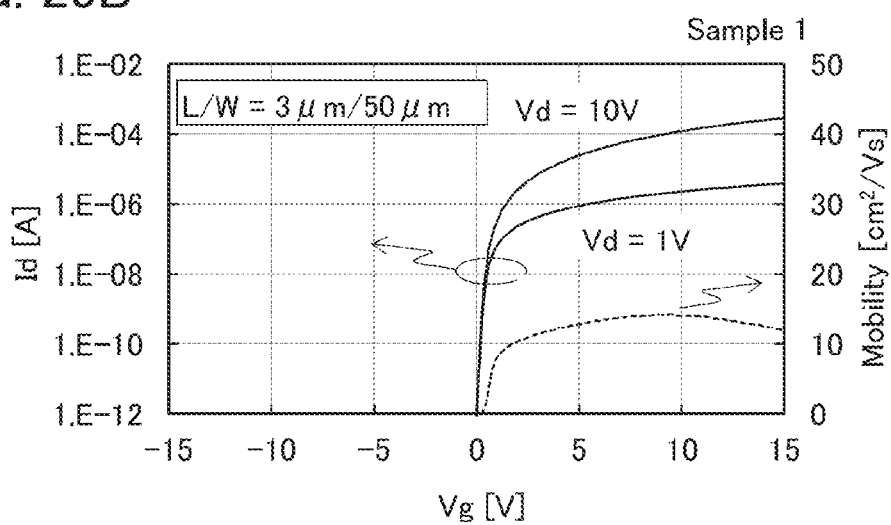
Figure 25C:
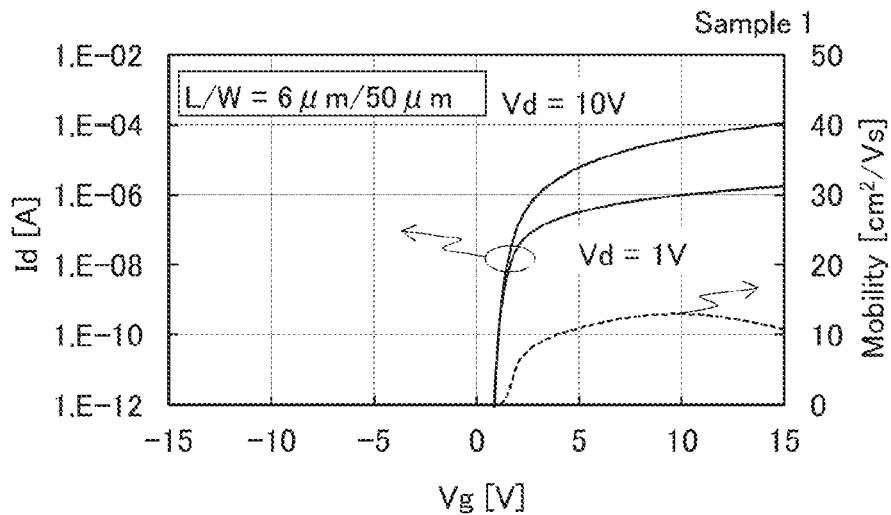

Further, as shown in FIGS. 25A to 25C, the field-effect mobility of the sample 1 is improved in comparison with the sample 2 regardless of the channel length L. In addition, the field-effect mobility is further improved as the channel length L becomes shorter. Furthermore, using the driving method in which gate voltage is applied in a state where the gate electrode and the back gate electrode are electrically connected to each other leads to an extremely small change in the threshold voltage with respect to the drain voltage 17a even when the channel length L is short (i.e., L=2 μm).

The above results show that when a transistor of one embodiment of the present invention is driven by the driving method in which gate voltage is applied in a state where the gate electrode and the back gate electrode are electrically connected to each other, the field-effect mobility is further improved as the channel length L becomes shorter. Thus, when the channel length L is made short (specifically, L=2 μm) and the above driving method is employed in a transistor in the driver circuit that requires high field-effect mobility, and the channel length L of a transistor in the pixel that requires normally-off characteristics is made longer than that of the transistor in the driver circuit, a display device that can operate at high speed with low power consumption can be provided.

Example 2

In this example, examination results of the V$_g$-I$_d$ characteristics and the reliability of fabricated transistors are described.

<Fabrication of Samples>

In this example, samples 3 to 6, which include transistors suitable for a display device of one embodiment of the present invention, were fabricated. Specifically, samples corresponding to the transistor 10k in the driver circuit illustrated in FIG. 1 were fabricated as the samples 3 to 6, which are embodiments of the present invention.

First, a glass substrate was used as a substrate, and a gate electrode was formed over the substrate.

The gate electrode was formed in the following manner: a 150-nm-thick tungsten film was formed by a sputtering method, a mask was formed over the tungsten film by a photolithography process, and the tungsten film was partly etched using the mask.

Next, an insulating film serving as a gate insulating film was formed over the gate electrode.

As the gate insulating film, a stack including a 400-nm-thick silicon nitride film and a 50-nm-thick silicon oxynitride film was used. The gate insulating film was formed by a plasma CVD method.

Next, an oxide semiconductor film was formed to overlap with the gate electrode with the gate insulating film positioned therebetween.

Here, the oxide semiconductor film was formed over the gate insulating film by a sputtering method.

The oxide semiconductor film used for the sample 3 was formed with a thickness of 35 nm under the following conditions: a sputtering target containing In, Ga, and Zn at an atomic ratio of 1:1:1 was used; a mixed gas of argon and oxygen with a proportion of oxygen of 33% was supplied into a treatment chamber of a sputtering apparatus; and the pressure in the treatment chamber was controlled to 0.4 Pa. Note that the oxide semiconductor film was formed at a substrate temperature of 300° C.

The oxide semiconductor film used for the sample 4 was formed with a thickness of 35 nm under the following conditions: a sputtering target containing In, Ga, and Zn at an atomic ratio of 3:1:2 was used; a mixed gas of argon and oxygen with a proportion of oxygen of 33% was supplied into a treatment chamber of a sputtering apparatus; and the pressure in the treatment chamber was controlled to 0.4 Pa. Note that the oxide semiconductor film was formed at a substrate temperature of 300° C.

The oxide semiconductor film used for the sample 5 was formed with a thickness of 35 nm under the following conditions: a sputtering target containing In, Ga, and Zn at an atomic ratio of 3:1:3 was used; a mixed gas of argon and oxygen with a proportion of oxygen of 33% was supplied into a treatment chamber of a sputtering apparatus; and the pressure in the treatment chamber was controlled to 0.4 Pa. Note that the oxide semiconductor film was formed at a substrate temperature of 300° C.

The oxide semiconductor film used for the sample 6 was formed with a thickness of 35 nm under the following conditions: a sputtering target containing In, Ga, and Zn at an atomic ratio of 3:1:4 was used; a mixed gas of argon and oxygen with a proportion of oxygen of 33% was supplied into a treatment chamber of a sputtering apparatus; and the pressure in the treatment chamber was controlled to 0.4 Pa. Note that the oxide semiconductor film was formed at a substrate temperature of 300° C.

Next, a pair of electrodes in contact with the oxide semiconductor film was formed.

First, a conductive film was formed over the gate insulating film and the oxide semiconductor film. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and the conductive film was partly etched using the mask. Through the above steps, the pair of electrodes was formed.

After that, a second gate insulating film was formed over the oxide semiconductor film and the pair of electrodes. Here, the second gate insulating film was formed to have a three-layer structure of a 50-nm-thick first oxide insulating film, a 400-nm-thick second oxide insulating film, and a 100-nm-thick nitride insulating film.

The first oxide insulating film was formed by a plasma CVD method under the following conditions: silane at a flow rate of 20 sccm and dinitrogen monoxide at a flow rate of 3000 sccm were used as a source gas; the pressure in the treatment chamber was 200 Pa; the substrate temperature was 350° C.; and a high-frequency power of 100 W was supplied to parallel-plate electrodes.

The second oxide insulating film was formed by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. Here, the heat treatment was performed at 350° C. in a mixed atmosphere of nitrogen and oxygen for one hour.

Then, the nitride insulating film was formed over the second oxide insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas; the pressure in the treatment chamber was 100 Pa; the substrate temperature was 350° C.; and a high-frequency power of 1000 W was supplied to parallel-plate electrodes.

Subsequently, in a region where the oxide semiconductor film and the pair of electrodes were not provided, an opening that reaches the gate electrode was formed in the gate insulating film and the second gate insulating film. The opening was formed in the following manner: a mask was formed over the second gate insulating film by a photolithography process, and the gate insulating film and the second gate insulating film were partly etched using the mask.

After that, a second gate electrode serving as a back gate electrode was formed over the second gate insulating film. The back gate electrode was electrically connected to the gate electrode through the opening provided in the gate insulating film and the second gate insulating film.

Here, as the back gate electrode, a 110-nm-thick conductive film of an indium oxide-tin oxide compound (ITO-SiO$_2$) containing silicon oxide was formed by a sputtering method. Note that the composition of a target used for forming the conductive film was In$_2$O$_3$:SnO$_2$:SiO$_2$=85:10:5 [wt %].

After that, heat treatment was performed at 250° C. in a nitrogen atmosphere for one hour.

Through the above process, the samples 3, 4, 5, and 6 of this example were fabricated.

Note that as each of the samples 3 to 6, three kinds of transistors were fabricated in which channel widths W were 50 μm and channel lengths L were 3 μm, 6 μm, and 10 μm.

<$V_g$-$I_d$ Characteristics>

Next, initial $V_g$-$I_d$ characteristics of the transistors included in the samples 3 to 6 were measured. Here, changes in current flowing between a source and a drain (hereinafter referred to as drain current: $I_d$), that is, $V_g$-$I_d$ characteristics were measured under the following conditions: the substrate temperature was 25° C., the potential difference between the source and the drain (hereinafter referred to as drain voltage: KO was 1 V or 10 V, and the potential difference between the source and the gate electrodes (hereinafter referred to as gate voltage: $V_g$) was changed from −20 V to 20 V.

FIG. 39 shows $V_g$-$I_d$ characteristics of the samples 3 to 6.

In FIG. 39, the lateral axis, the first longitudinal axis, and the second longitudinal axis represent gate voltage $V_g$, drain current $I_d$, and field-effect mobility, respectively. Here, to show field-effect mobility in a saturation region, field-effect mobility calculated when drain voltage $V_d$ was 10 V is shown.

As shown in FIG. 39, the field-effect mobility of the transistors of the samples 4 to 6 is approximately two to three times that of the transistors of the sample 3. Furthermore, the transistors of the sample 4 have the highest field-effect mobility.

<Reliability>

Next, the reliability of the samples 3 to 6 was evaluated. The evaluation was carried out by measuring $V_g$-$I_d$ characteristics under light irradiation. For the method for measuring $V_g$-$I_d$ characteristics, the above description of the measurement method can be referred to.

Note that a xenon lamp was used for the light irradiation. The samples were irradiated with light having wavelengths of 400 nm, 450 nm, and 500 nm in a direction perpendicular to the samples.

Figure 40:
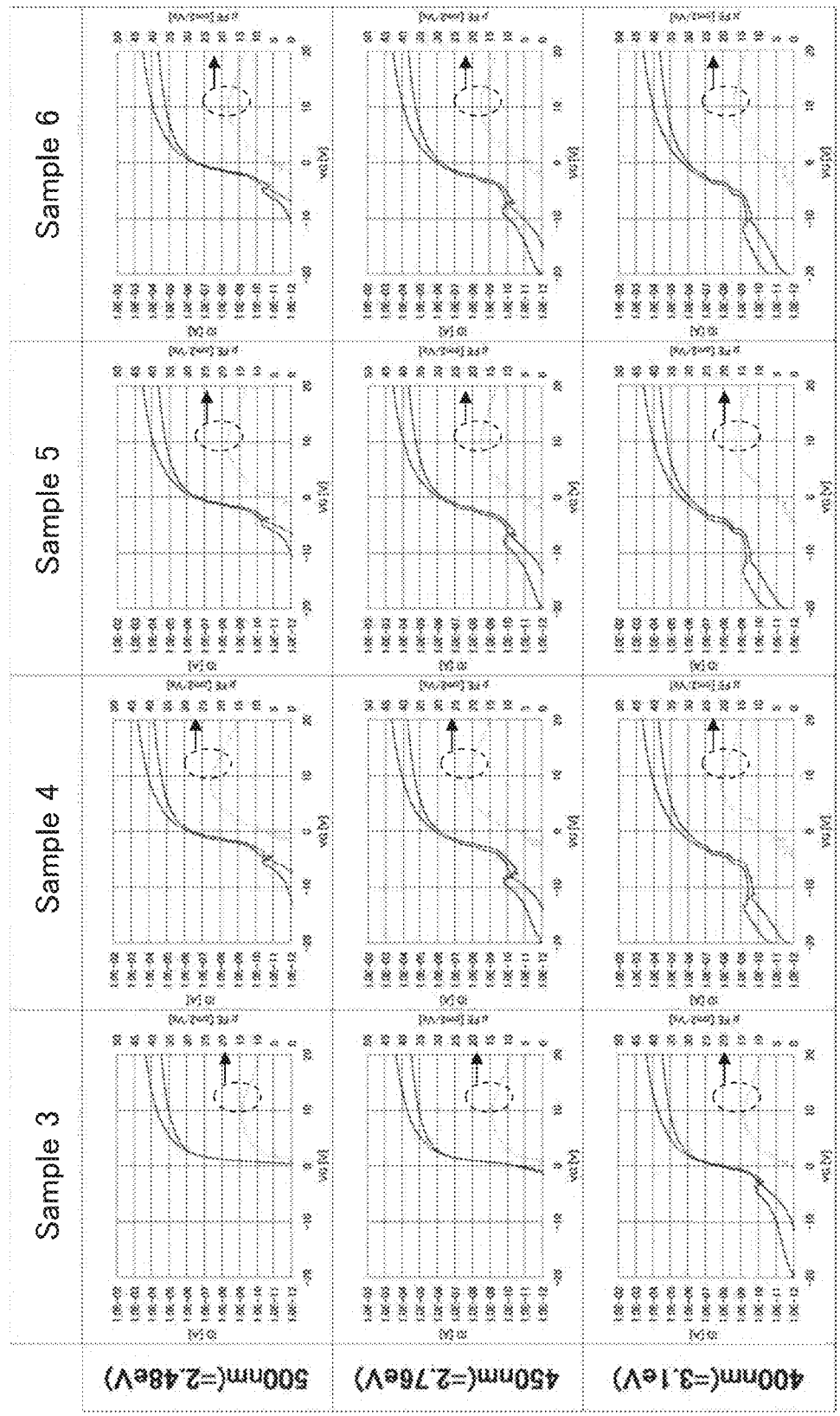
FIG. 40 shows electrical characteristics of transistors.

FIG. 40 shows the $V_g$-$I_d$ characteristics of the samples 3 to 6 under light irradiation.

According to FIG. 40, in the samples 4 to 6 with a high proportion of indium, the amount of increase in off-state current under light irradiation is larger than in the sample 3. In the sample 3, an increase in off-state current is not observed under irradiation with light having a wavelength of 500 nm, which is in the visible light range.

The above results show that the transistors of the sample 3 are suitable for a transistor in a pixel, which might be exposed to light. The results also show that the transistors of the samples 4 to 6 are suitable for a transistor in a driver circuit, which can be blocked from light, because the transistors of the samples 4 to 6 have high field-effect mobility while they exhibit an increase in off-state current under light irradiation.

Example 3

In this example, a sample 8, which included a transistor suitable for a pixel of a display device of one embodiment of the present invention, and a sample 7, which included a transistor suitable for a driver circuit of the display device, were fabricated. Specifically, a sample corresponding to the transistor 10m in the pixel illustrated in FIG. 34 was fabricated as the sample 8, which is one embodiment of the present invention. In addition, a sample corresponding to the transistor 10kb in the driver circuit illustrated in FIG. 34 was fabricated as the sample 7, which is one embodiment of the present invention. Here, the transistor 10kb does not have the second oxide semiconductor film 82.

First, a glass substrate was used as a substrate, and a gate electrode was formed over the substrate.

The gate electrode was formed in the following manner: a 100-nm-thick tungsten film was formed by a sputtering method, a mask was formed over the tungsten film by a photolithography process, and the tungsten film was partly etched using the mask.

Next, an insulating film serving as a gate insulating film was formed over the gate electrode.

The gate insulating film was formed by stacking a 50-nm-thick silicon nitride film, a 300-nm-thick silicon oxynitride film, and a 50-nm-thick silicon oxynitride film. The gate insulating film was formed by a plasma CVD method.

Next, an oxide semiconductor film was formed to overlap with the gate electrode with the gate insulating film positioned therebetween.

Here, the oxide semiconductor film was formed over the gate insulating film by a sputtering method.

The oxide semiconductor film used for the sample 7 was formed with a thickness of 35 nm under the following conditions: a sputtering target containing In, Ga, and Zn at an atomic ratio of 1:1:1 was used; a mixed gas of argon and oxygen with a proportion of oxygen of 50% was supplied into a treatment chamber of a sputtering apparatus; the pressure in the treatment chamber was controlled to 0.6 Pa; and a direct-current power of 2.5 kW was supplied. Note that the oxide semiconductor film was formed at a substrate temperature of 170° C.

The oxide semiconductor film used for the sample 8 was formed with a thickness of 35 nm under the following conditions: a sputtering target containing In, Ga, and Zn at an atomic ratio of 3:1:2 was used; a mixed gas of argon and oxygen with a proportion of oxygen of 50% was supplied into a treatment chamber of a sputtering apparatus; the pressure in the treatment chamber was controlled to 0.6 Pa; and a direct-current power of 5 kW was supplied. Note that the oxide semiconductor film was formed at a substrate temperature of 170° C.

Next, a pair of electrodes in contact with the oxide semiconductor film was formed.

First, a conductive film was formed over the gate insulating film and the oxide semiconductor film. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and the conductive film was partly etched using the mask. Through the above steps, the pair of electrodes was formed.

After that, a second gate insulating film was formed over the oxide semiconductor film and the pair of electrodes. Here, the second gate insulating film was formed to have a three-layer structure of a 50-nm-thick first oxide insulating film, a 400-nm-thick second oxide insulating film, and a 100-nm-thick nitride insulating film.

The first oxide insulating film was formed by a plasma CVD method under the following conditions: silane at a flow rate of 30 sccm and dinitrogen monoxide at a flow rate of 4000 sccm were used as a source gas; the pressure in the treatment chamber was 200 Pa; the substrate temperature was 350° C.; and a high-frequency power of 150 W was supplied to parallel-plate electrodes.

The second oxide insulating film was formed by a plasma CVD method under the following conditions: silane at a flow rate of 200 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, heat treatment was performed to release water, nitrogen, hydrogen, and the like from the first oxide insulating film and the second oxide insulating film and to supply part of the oxygen contained in the second oxide insulating film into the oxide semiconductor film. Here, the heat treatment was performed at 350° C. in a mixed atmosphere of nitrogen and oxygen for one hour.

Then, the nitride insulating film was formed over the second oxide insulating film. The nitride insulating film was formed by a plasma CVD method under the following conditions: silane at a flow rate of 50 sccm, nitrogen at a flow rate of 5000 sccm, and an ammonia gas at a flow rate of 100 sccm were used as a source gas; the pressure in the treatment chamber was 100 Pa; the substrate temperature was 350° C.; and a high-frequency power of 1000 W was supplied to parallel-plate electrodes.

Subsequently, in a region where the oxide semiconductor film and the pair of electrodes were not provided, an opening that reaches the gate electrode was formed in the gate insulating film and the second gate insulating film. The opening was formed in the following manner: a mask was formed over the second gate insulating film by a photolithography process, and the gate insulating film and the second gate insulating film were partly etched using the mask.

After that, a second gate electrode serving as a back gate electrode was formed over the second gate insulating film. The back gate electrode was electrically connected to the gate electrode through the opening provided in the gate insulating film and the second gate insulating film.

Here, as the back gate electrode, a 100-nm-thick conductive film of an indium oxide-tin oxide compound (ITO—$SiO_2$) containing silicon oxide was formed by a sputtering method. Note that the composition of a target used for forming the conductive film was $In_2O_3$:$SnO_2$:$SiO_2$=85:10:5 [wt %].

After that, heat treatment was performed at 250° C. in a nitrogen atmosphere for one hour.

Through the above process, the samples 7 and 8 of this example were fabricated. In the fabrication of the sample 8, the step of forming the back gate electrode in the above-described fabrication process was skipped.

Note that as each of the samples 7 and 8, two kinds of transistors were fabricated in which channel widths W were 50 μm and channel lengths L were 3 μm and 6 μm.

<Reliability>

Next, the reliability of the transistors of the samples 7 and 8 were evaluated. For the evaluation of the reliability, gate bias-temperature stress tests were performed.

A measurement method in a positive gate BT stress test (positive BT) is described. To measure electrical characteristics in the initial state (a state before stress application) of the target transistors for the positive gate BT stress test, characteristics of change in drain current ($I_d$) to the gate voltage ($V_g$), that is, $V_g$-$I_d$ characteristics were measured under the following conditions: the substrate temperature was 60° C. and the drain voltage ($V_d$) was 1 V or 10 V.

Next, the drain voltage ($V_d$) of the transistor was set to 0 V while the substrate temperature was held at 60° C. Then, the gate voltage ($V_g$) of +30 V was applied and held for one hour.

In a negative gate BT stress test (negative BT), the gate voltage ($V_g$) of −30 V was applied.

The positive gate BT stress test and the negative gate BT stress test were performed in a dark state (dark).

Figure 41:
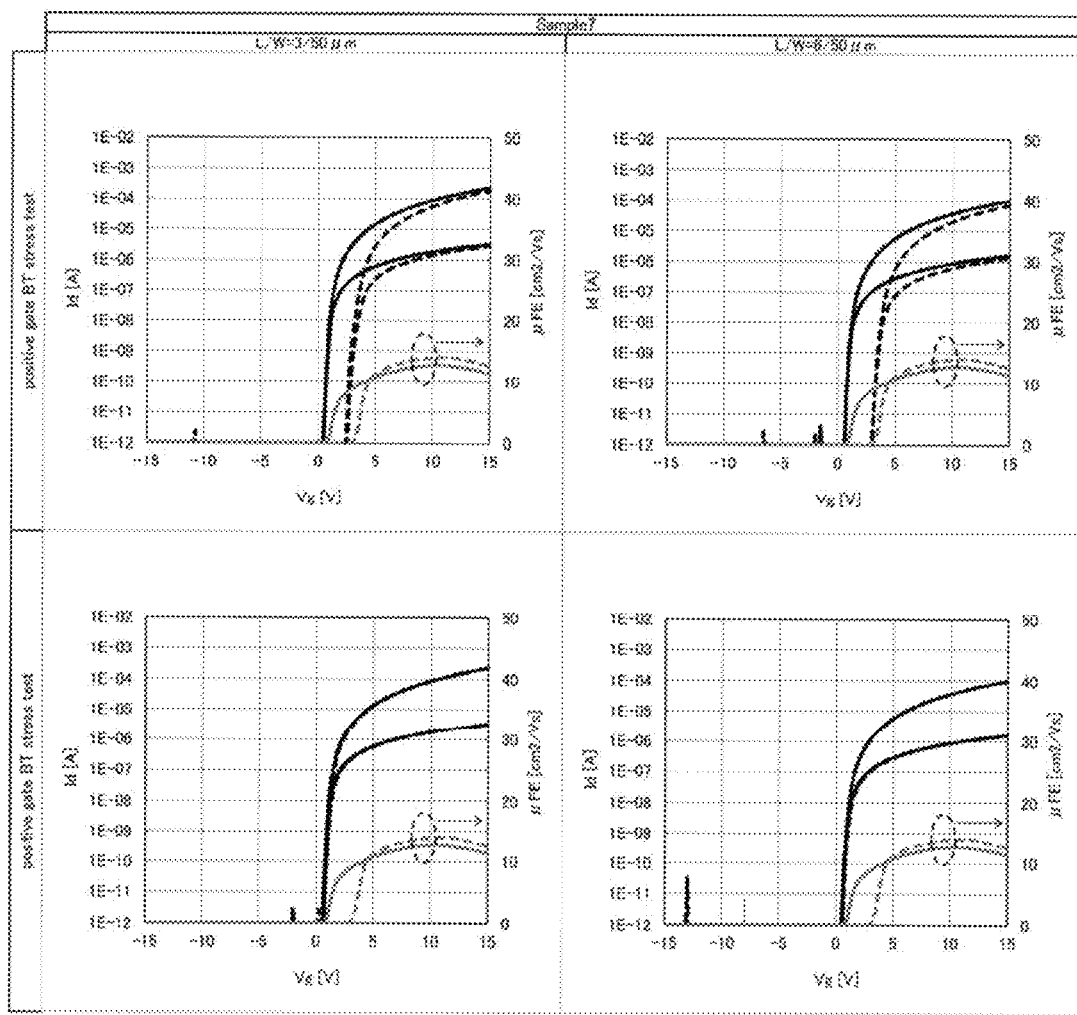
FIG. 41 shows electrical characteristics of transistors.
Figure 42:
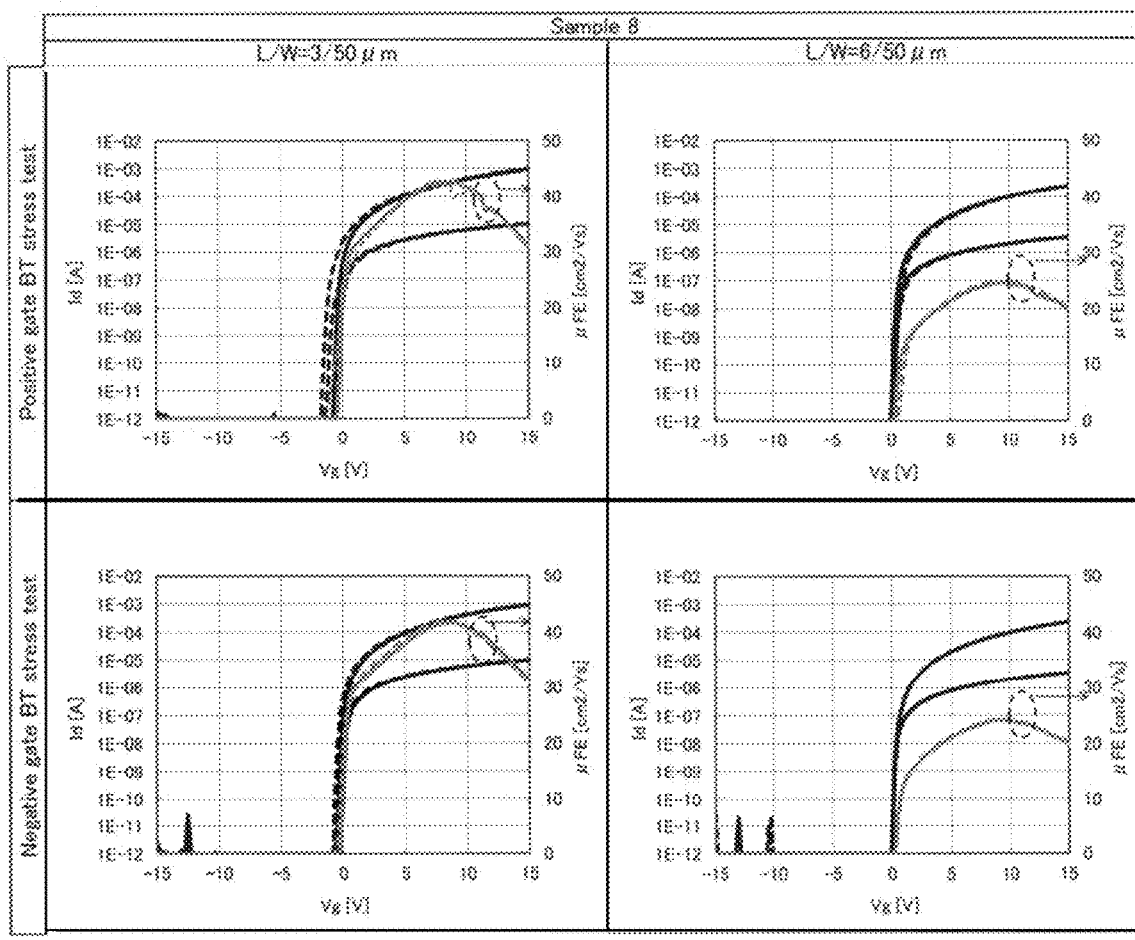
FIG. 42 shows electrical characteristics of transistors.

FIG. 41 and FIG. 42 show, respectively, the $V_g$-$I_d$ characteristics of the sample 7 and the sample 8 before and after the gate BT stress tests. The solid line represents the $V_g$-$I_d$ characteristics before the test and the dotted line represents the $V_g$-$I_d$ characteristics after the test. In addition, Table 1 and Table 2 show the amounts of change in threshold voltage ($\Delta V_{th}$) and shift value ($\Delta$Shift). Note that the threshold voltage ($V_{th}$) refers to a gate voltage (voltage between a source and a gate) when a channel is formed. In a curve where the horizontal axis represents the gate voltage ($V_g$) and the vertical axis represents the square root of drain current ($I_d$) and where data are plotted ($V_g$-$\sqrt{I_d}$ characteristics), the threshold voltage ($V_{th}$) was defined as a gate voltage ($V_g$) at a point of intersection of an extrapolated tangent line having the highest inclination with a straight line representing the square root of drain current ($I_d$) of 0 ($I_d$=0 A). In a curve showing $V_g$-$I_d$ characteristics, the shift value is defined as a gate voltage ($V_g$) at a point of intersection of an extrapolated tangent line having the highest inclination with a straight line representing a drain current ($I_d$) of $1\times10^{-12}$ A.

TABLE 1

Positive gate BT stress test

| | Sample 7 | | Sample 8 | |
| --- | --- | --- | --- | --- |
| | ΔVth [V] | ΔShift [V] | ΔVth [V] | ΔShift [V] |
| L = 3 μm | 1.95 | 1.95 | −0.38 | −1.07 |
| L = 6 μm | 2.34 | 2.48 | 0.24 | 0.16 |

TABLE 2

Negative gate BT stress test

| | Sample 7 | | Sample 8 | |
| --- | --- | --- | --- | --- |
| | ΔVth [V] | ΔShift [V] | ΔVth [V] | ΔShift [V] |
| L = 3 μm | 0.06 | 0.17 | −0.26 | −0.34 |
| L = 6 μm | 0.08 | 0.22 | 0.03 | 0.04 |

The above results show that when a transistor of one embodiment of the present invention is driven by the driving method in which gate voltage is applied in a state where the gate electrode and the back gate electrode are electrically connected to each other, the transistor has high reliability as well as improved field-effect mobility.

Example 4

In this example, examination results of the $V_g$-$I_d$ characteristics and the reliability of fabricated transistors are described.

<Fabrication of Samples>

In this example, a sample 9, which included a transistor suitable for a pixel of a display device of one embodiment of the present invention, and a sample 10, which included a transistor suitable for a driver circuit of the display device, were fabricated. Specifically, a sample corresponding to the transistor 10*mb* in the pixel illustrated in FIG. 43 was fabricated as the sample 9, which is one embodiment of the present invention. In addition, a sample corresponding to the transistor 10*ka* in the driver circuit illustrated in FIG. 43 was fabricated as the sample 10, which is one embodiment of the present invention.

First, a glass substrate was used as a substrate, and a gate electrode was formed over the substrate.

The gate electrode was formed in the following manner: a 100-nm-thick tungsten film was formed by a sputtering method, a mask was formed over the tungsten film by a photolithography process, and the tungsten film was partly etched using the mask.

Next, an insulating film serving as a gate insulating film was formed over the gate electrode.

As the gate insulating film, a stack including a 50-nm-thick silicon nitride film and a 200-nm-thick silicon oxynitride film was used. The gate insulating film was formed by a plasma CVD method.

Next, an oxide semiconductor film was formed to overlap with the gate electrode with the gate insulating film positioned therebetween.

Here, the oxide semiconductor film was formed over the gate insulating film by a sputtering method.

The sample 9 is a sample in which the oxide semiconductor film has a single-layer structure. In the sample 9, the oxide semiconductor film was formed with a thickness of 35 nm under the following conditions: a sputtering target containing In, Ga, and Zn at an atomic ratio of 1:1:1 was used; a mixed gas of argon and oxygen with a proportion of oxygen of 50% was supplied into a treatment chamber of a sputtering apparatus; the pressure in the treatment chamber was controlled to 0.6 Pa; and a direct-current power of 2.5 kW was supplied. Note that the oxide semiconductor film was formed at a substrate temperature of 170° C.

The sample 10 is a sample in which the oxide semiconductor film has a stacked-layer structure. In the sample 10, a 10-nm-thick first layer and a 10-nm-thick second layer were formed as the oxide semiconductor film. The first layer was formed under the following conditions: a sputtering target containing In, Ga, and Zn at an atomic ratio of 3:1:2 was used; a mixed gas of argon and oxygen with a proportion of oxygen of 50% was supplied into a treatment chamber of a sputtering apparatus; the pressure in the treatment chamber was controlled to 0.6 Pa; and a direct-current power of 2.5 kW was supplied. The second layer was formed under the following conditions: a sputtering target containing In, Ga, and Zn at an atomic ratio of 1:1:1 was used; a mixed gas of argon and oxygen with a proportion of oxygen of 50% was supplied into a treatment chamber of a sputtering apparatus; the pressure in the treatment chamber was controlled to 0.6 Pa; and a direct-current power of 5 kW was supplied. Note that the oxide semiconductor film was formed at a substrate temperature of 170° C.

Next, a pair of electrodes in contact with the oxide semiconductor film was formed.

First, a conductive film was formed over the gate insulating film and the oxide semiconductor film. As the conductive film, a 400-nm-thick aluminum film was formed over a 50-nm-thick tungsten film, and a 100-nm-thick titanium film was formed over the aluminum film. Then, a mask was formed over the conductive film by a photolithography process, and the conductive film was partly etched using the mask. Through the above steps, the pair of electrodes was formed.

Next, a protective insulating film was formed over the oxide semiconductor film and the pair of electrodes. Here, the protective insulating film has a two-layer structure of a 10-nm-thick first oxide insulating film and a 390-nm-thick second oxide insulating film.

The first oxide insulating film was formed by a plasma CVD method under the following conditions: silane at a flow rate of 20 sccm and dinitrogen monoxide at a flow rate of 3000 sccm were used as a source gas; the pressure in the treatment chamber was 200 Pa; the substrate temperature was 350° C.; and a high-frequency power of 100 W was supplied to parallel-plate electrodes.

The second oxide insulating film was formed by a plasma CVD method under the following conditions: silane at a flow rate of 160 sccm and dinitrogen monoxide at a flow rate of 4000 sccm were used as a source gas, the pressure in the treatment chamber was 200 Pa, the substrate temperature was 220° C., and a high-frequency power of 1500 W was supplied to parallel-plate electrodes. Under the above conditions, it is possible to form a silicon oxynitride film containing oxygen at a higher proportion than oxygen in the stoichiometric composition and from which part of oxygen is released by heating.

Next, heat treatment was performed to release water, nitrogen, hydrogen, and the like from the first oxide insulating film and the second oxide insulating film and to supply part of oxygen contained in the second oxide insulating film into the oxide semiconductor film. Here, the heat treatment was performed at 350° C. in a mixed atmosphere of nitrogen and oxygen for one hour.

Subsequently, in a region where the oxide semiconductor film and the pair of electrodes were not provided, an opening that reaches the gate electrode was formed in the gate insulating film and the protective insulating film. The opening was formed in the following manner: a mask was formed over the protective insulating film by a photolithography process, and the gate insulating film and the protective insulating film were partly etched using the mask.

After that, heat treatment was performed at 250° C. in a nitrogen atmosphere for one hour.

Through the above process, the samples 9 and 10 of this example were fabricated.

Note that as each of the samples 9 and 10, three kinds of transistors were fabricated in which channel widths W were 50 μm and channel lengths L were 2 μm, 3 μm, and 6 μm.

<$V_g$-$I_d$ Characteristics>

Next, initial $V_g$-$I_d$ characteristics of the transistors included in the samples 9 and 10 were measured. Here, changes in current flowing between a source and a drain (hereinafter referred to as drain current: $I_d$), that is, $V_g$-$I_d$ characteristics were measured under the following conditions: the substrate temperature was 25° C., the potential difference between the source and the drain (hereinafter referred to as drain voltage: $V_d$) was 1 V or 10 V, and the potential difference between the source and the gate electrodes (hereinafter referred to as gate voltage: $V_g$) was changed from −20 V to 15 V or from −15 V to 10 V.

Figure 47:
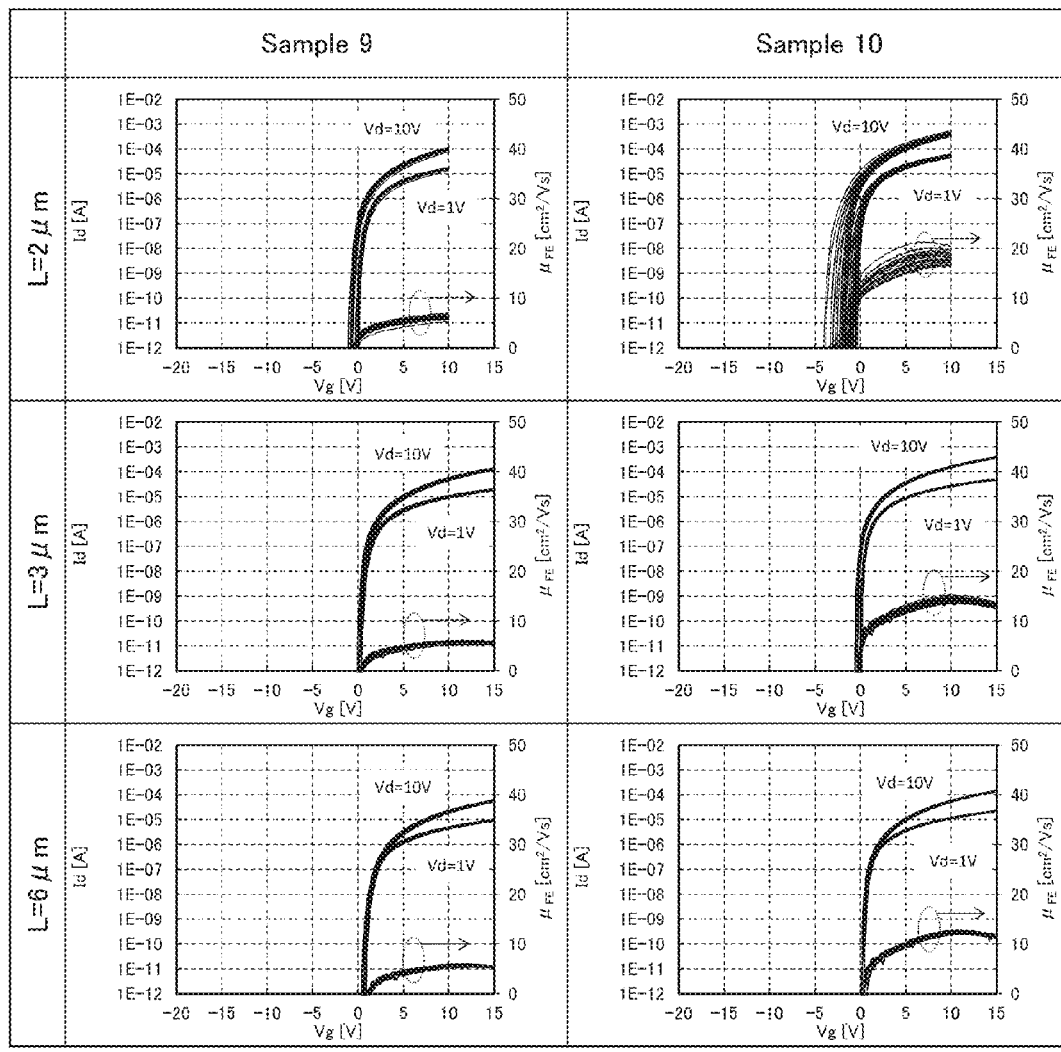
FIG. 47 shows electrical characteristics of transistors.

FIG. 47 shows the $V_g$-$I_d$ characteristics of the sample 9 and the sample 10.

In FIG. 47, the lateral axis, the first longitudinal axis, and the second longitudinal axis represent gate voltage $V_g$, drain current $I_d$, and field-effect mobility, respectively. Here, to show field-effect mobility in a saturation region, field-effect mobility calculated when drain voltage $V_d$ was 10 V is shown.

As shown in FIG. 47, the field-effect mobility of the transistors of the sample 10 is approximately three times that of the transistors of the sample 9.

The above results show that using an oxide semiconductor film with a high proportion of indium can improve field-effect mobility. Accordingly, when an oxide semiconductor film with a high proportion of indium is used for a transistor in the driver circuit that requires high field-effect mobility, a display device with improved definition can be provided.

EXPLANATION OF REFERENCE

10: transistor, 10k: transistor, 10ka: transistor, 10kb: transistor, 10k_1: transistor, 10k_2: transistor, 10k_3: transistor, 10k_4: transistor, 10m: transistor, 10mb: transistor, 10m_1: transistor, 10m_2: transistor, 10m_3: transistor, 10m_4: transistor, 10n: transistor, 10na: transistor, 10nb: transistor, 11: substrate, 12: base insulating film, 13: gate electrode, 13c: gate electrode, 13d: gate electrode, 15: gate insulating film, 19: electrode, 19c: electrode, 19d: electrode, 20: electrode, 20c: electrode, 20d: electrode, 21: protective film, 23: oxide insulating film, 25: oxide insulating film, 27: nitride insulating film, 80: oxide semiconductor film, 80a: oxide semiconductor film, 80b: oxide semiconductor film, 81: oxide semiconductor film, 81a: oxide semiconductor film, 82: oxide semiconductor film, 83: oxide semiconductor film, 83a: oxide semiconductor film, 84: oxide semiconductor film, 85: oxide semiconductor film, 86: pixel electrode, 86a: electrode, 87: conductive film, 88: organic insulating film, 89: capacitor, 90: counter substrate, 91: counter electrode, 92a: alignment film, 92b: alignment film, 93: liquid crystal layer, 94: liquid crystal element, 95: insulating film, 96: insulating film, 97: EL layer, 98: electrode, 99: organic EL element, 310: electron gun chamber, 312: optical system, 314: sample chamber, 316: optical system, 318: camera, 320: observation chamber, 322: film chamber, 324: electrons, 328: substance, 332: fluorescent plate, 900: substrate, 901: pixel portion, 902: scan line driver circuit, 903: scan line driver circuit, 904: signal line driver circuit, 910: capacitor wiring, 912: gate wiring, 913: gate wiring, 914: electrode, 916: transistor, 917: transistor, 918: liquid crystal element, 919: liquid crystal element, 920: pixel, 921: switching transistor, 922: driving transistor, 923: capacitor, 924: light-emitting element, 925: signal line, 926: scan line, 927: power supply line, 928: common electrode, 1001: main body, 1002: housing, 1003a: display portion, 1003b: display portion, 1004: keyboard button, 1021: main body, 1022: fixing portion, 1023: display portion, 1024: operation button, 1025: external memory slot, 1030: housing, 1031: housing, 1032: display device, 1033: speaker, 1034: microphone, 1035: operation keys, 1036: pointing device, 1037: camera lense, 1038: external connection terminal, 1040: solar cell, 1041: external memory slot, 1050: television set, 1051: housing, 1052: storage medium recording and reproducing portion, 1053: display portion, 1054: external connection terminal, 1055: stand, 1056: external memory, 5100: pellets, 5120: substrate, 5161: region, 8000: display module, 8001: upper cover, 8002: lower cover, 8003: FPC, 8004: touch panel, 8005: FPC, 8006: display device cell, 8007: backlight unit, 8008: light source, 8009: frame, 8010: printed board, 8011: battery.

This application is based on Japanese Patent Application serial no. 2013-249692 filed with the Japan Patent Office on Dec. 2, 2013, Japanese Patent Application serial no. 2013-249693 filed with the Japan Patent Office on Dec. 3, 2013, and Japanese Patent Application serial no. 2013-249694 filed with the Japan Patent Office on Dec. 3, 2013, the entire contents of which are hereby incorporated by reference.

The invention claimed is:

1. A display device comprising:
a pixel portion over a substrate; and
a driver circuit configured to drive the pixel portion over the substrate,
wherein the pixel portion comprises a first transistor comprising a first oxide semiconductor film,
wherein the driver circuit comprises a second transistor comprising a second oxide semiconductor film and a third oxide semiconductor film,
wherein the second transistor has a larger number of oxide semiconductor films than the first transistor,
wherein the first oxide semiconductor film and the second oxide semiconductor film have different compositions,
wherein a channel length of the first transistor is longer than a channel length of the second transistor,
wherein the third oxide semiconductor film is in contact with a side surface of the second oxide semiconductor film,
wherein the second oxide semiconductor film comprises indium and zinc, and
wherein a proportion of indium atoms is higher than a proportion of zinc atoms in the second oxide semiconductor film.

2. The display device according to claim 1, wherein the first oxide semiconductor film and the third oxide semiconductor film are formed in a same step.

3. The display device according to claim 1, wherein the first oxide semiconductor film and the third oxide semiconductor film comprise a same material.

4. The display device according to claim 1,
wherein the channel length of the first transistor is greater than or equal to 2.5 µm and less than or equal to 20 µm, and
wherein the channel length of the second transistor is greater than or equal to 1.45 µm and less than or equal to 2.2 µm.

5. The display device according to claim 1, wherein the channel length of the second transistor is greater than or equal to 1 µm and less than or equal to 2.1 µm.

6. The display device according to claim 1,
wherein the second transistor comprises a gate electrode layer, the second oxide semiconductor film over the gate electrode layer, an insulating layer over the second oxide semiconductor film, and a conductive layer over the insulating layer,
wherein the insulating layer covers the second oxide semiconductor film and is in contact with a gate insulating layer, and
wherein in a channel width direction of the second oxide semiconductor film of the second transistor, the conductive layer overlaps with a channel formation region of the second oxide semiconductor film and is electrically connected to the gate electrode layer.

7. An electronic device comprising the display device according to claim 1.

8. The display device according to claim 1, wherein the first oxide semiconductor film and the second oxide semiconductor film are on an insulating surface.

9. The display device according to claim 1, wherein the first oxide semiconductor film and the third oxide semiconductor film have same compositions.

10. The display device according to claim 1,
wherein the first oxide semiconductor film and the third oxide semiconductor film each comprises indium and zinc, and
wherein a proportion of indium atoms is lower than or equal to a proportion of zinc atoms in each of the first oxide semiconductor film and the third oxide semiconductor film.

11. A display device comprising:
a pixel portion over a substrate; and
a driver circuit configured to drive the pixel portion over the substrate,
wherein the pixel portion comprises a first transistor comprising a first oxide semiconductor film, wherein the driver circuit comprises a second transistor comprising a second oxide semiconductor film,
wherein the first oxide semiconductor film and the second oxide semiconductor film have different compositions,
wherein the second transistor has a larger number of oxide semiconductor films than the first transistor,
wherein a channel length of the first transistor is longer than a channel length of the second transistor,
wherein the channel length of the first transistor is greater than or equal to 2.5 μm and less than or equal to 20 μm,
wherein the second oxide semiconductor film comprises indium and zinc, and
wherein a proportion of indium atoms is higher than a proportion of zinc atoms in the second oxide semiconductor film.

12. The display device according to claim 11,
wherein the second transistor further comprises a third oxide semiconductor film over the second oxide semiconductor film, and
wherein the first oxide semiconductor film and the third oxide semiconductor film comprise a same material.

13. The display device according to claim 11, wherein the channel length of the second transistor is greater than or equal to 1.45 μm and less than or equal to 2.2 μm.

14. The display device according to claim 11, wherein the channel length of the second transistor is greater than or equal to 1 μm and less than or equal to 2.1 μm.

15. The display device according to claim 11,
wherein the second transistor comprises a gate electrode layer, the second oxide semiconductor film over the gate electrode layer, an insulating layer over the second oxide semiconductor film, and a conductive layer over the insulating layer,
wherein the insulating layer covers the second oxide semiconductor film and is in contact with a gate insulating layer, and
wherein in a channel width direction of the second oxide semiconductor film of the second transistor, the conductive layer overlaps with a channel formation region of the second oxide semiconductor film and is electrically connected to the gate electrode layer.

16. An electronic device comprising the display device according to claim 11.

17. The display device according to claim 11, wherein the first oxide semiconductor film and the second oxide semiconductor film are on an insulating surface.

18. A display device comprising:
a pixel portion over a substrate; and
a driver circuit configured to drive the pixel portion over the substrate,
wherein the pixel portion comprises a first transistor comprising a first oxide semiconductor film,
wherein the driver circuit comprises a second transistor comprising a second oxide semiconductor film, a third oxide semiconductor film over the second oxide semiconductor film, and a fourth oxide semiconductor film over the third oxide semiconductor film,
wherein the second transistor has a larger number of oxide semiconductor films than the first transistor,
wherein a channel length of the first transistor is longer than a channel length of the second transistor,
wherein the fourth oxide semiconductor film covers side surfaces of the second oxide semiconductor film and the third oxide semiconductor film,
wherein the third oxide semiconductor film comprises indium and zinc, and
wherein a proportion of indium atoms is higher than a proportion of zinc atoms in the third oxide semiconductor film.

19. The display device according to claim 18, wherein the first oxide semiconductor film and the fourth oxide semiconductor film are formed in a same step.

20. The display device according to claim 18, wherein the first oxide semiconductor film and the fourth oxide semiconductor film comprise a same material.

21. An electronic device comprising the display device according to claim 18.

22. The display device according to claim 18, wherein the first oxide semiconductor film and the second oxide semiconductor film are on an insulating surface.

23. The display device according to claim 18, wherein the first oxide semiconductor film and the second oxide semiconductor film have different compositions.

24. A semiconductor device comprising:
a pixel circuit comprising a first transistor over a substrate; and
a driver circuit comprising a second transistor over the substrate, the driver circuit configured to drive the pixel circuit,
wherein the first transistor comprises a first oxide semiconductor film,
wherein the second transistor comprises:
a gate electrode;
a second oxide semiconductor film over the gate electrode;
a third oxide semiconductor film over the second oxide semiconductor film;
a fourth oxide semiconductor film over the third oxide semiconductor film;
a pair of electrodes over the fourth oxide semiconductor film; and
a conductive film over the fourth oxide semiconductor film, the conductive film being electrically connected to the gate electrode,
wherein the second transistor has a larger number of oxide semiconductor films than the first transistor,
wherein the fourth oxide semiconductor film covers side surfaces of the second oxide semiconductor film and the third oxide semiconductor film,
wherein the third oxide semiconductor film comprises indium and zinc, and
wherein a proportion of indium atoms is higher than a proportion of zinc atoms in the third oxide semiconductor film.

25. The semiconductor device according to claim 24, wherein the first oxide semiconductor film and the fourth oxide semiconductor film comprise a same material.

26. The semiconductor device according to claim 24,
wherein a channel length of the first transistor is greater than or equal to 2.5 μm and less than or equal to 20 μm, and
wherein a channel length of the second transistor is greater than or equal to 1.45 μm and less than or equal to 2.2 μm.

27. The semiconductor device according to claim 24, wherein a channel length of the first transistor is longer than a channel length of the second transistor.

28. An electronic device comprising the semiconductor device according to claim 24.

29. The semiconductor device according to claim 24, wherein the first oxide semiconductor film and the second oxide semiconductor film are on an insulating surface.

30. The semiconductor device according to claim 24, wherein the first oxide semiconductor film and the second oxide semiconductor film have different compositions.

\* \* \* \* \*